(12) United States Patent
Dunga et al.

(10) Patent No.: US 10,541,031 B2
(45) Date of Patent: Jan. 21, 2020

(54) SINGLE PULSE SLC PROGRAMMING SCHEME

(71) Applicant: SanDisk Technologies LLC, Addison, TX (US)

(72) Inventors: Mohan Vamsi Dunga, Santa Clara, CA (US); Piyush Dak, San Jose, CA (US); Pitamber Shukla, Milpitas, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/009,892

(22) Filed: Jun. 15, 2018

(65) Prior Publication Data

US 2019/0385680 A1    Dec. 19, 2019

(51) Int. Cl.
| | |
|---|---|
| *G11C 16/10* | (2006.01) |
| *G11C 16/30* | (2006.01) |
| *G11C 16/08* | (2006.01) |
| *G11C 16/24* | (2006.01) |
| *H01L 27/11556* | (2017.01) |
| *G11C 16/04* | (2006.01) |
| *H01L 27/11582* | (2017.01) |
| *G11C 16/34* | (2006.01) |

(52) U.S. Cl.
CPC .......... *G11C 16/10* (2013.01); *G11C 16/0408* (2013.01); *G11C 16/0466* (2013.01); *G11C 16/0483* (2013.01); *G11C 16/08* (2013.01); *G11C 16/24* (2013.01); *G11C 16/30* (2013.01); *G11C 16/3459* (2013.01); *H01L 27/11556* (2013.01); *H01L 27/11582* (2013.01); *G11C 2216/14* (2013.01)

(58) Field of Classification Search
CPC ..... G11C 16/08; G11C 16/0483; G11C 16/10; G11C 16/12
See application file for complete search history.

(56) References Cited

U.S. PATENT DOCUMENTS

| | | | |
|---|---|---|---|
| 4,716,549 A | 12/1987 | Nakano et al. | |
| 7,405,975 B2 | 7/2008 | Hosono | |
| 7,573,775 B2 | 8/2009 | Fallah et al. | |
| 7,782,681 B2 | 8/2010 | Kim et al. | |
| 8,363,471 B2 * | 1/2013 | Ryu | G11C 16/24 365/185.12 |
| 8,427,878 B2 * | 4/2013 | Shim | G11C 16/0483 365/185.23 |
| 8,559,235 B2 * | 10/2013 | Yoon | G11C 16/0483 365/185.29 |
| 8,724,395 B2 | 5/2014 | Park et al. | |
| 8,811,087 B2 * | 8/2014 | Yun | G11C 11/5642 365/185.18 |

(Continued)

*Primary Examiner* — Vanthu T Nguyen
(74) *Attorney, Agent, or Firm* — Foley & Lardner LLP

(57) ABSTRACT

A program circuit may two-dimensionally program data into cells by applying different selected bit line or channel voltages to different bit lines or channels located in different bit line zones of a block during a program operation. The block may be further separated or divided into word line zones. The program circuit may adjust the different bit line or channel voltages as it programs in different word line zones of the block. In accordance with the two-dimensional programming, the program circuit may perform single-pulse program-only SLC program operations.

22 Claims, 21 Drawing Sheets

(56) References Cited

U.S. PATENT DOCUMENTS

| | | | | |
|---|---|---|---|---|
| 8,923,060 | B2* | 12/2014 | Shim | G11C 16/30 365/185.17 |
| 9,047,962 | B2* | 6/2015 | Ishii | G11C 16/0483 |
| 9,236,139 | B1 | 1/2016 | Lai et al. | |
| 9,286,987 | B1 | 3/2016 | Dong et al. | |
| 9,336,892 | B1 | 5/2016 | Chen et al. | |
| 9,679,659 | B2* | 6/2017 | Shim | G11C 16/16 |
| 9,691,473 | B2 | 6/2017 | Yang et al. | |
| 9,805,807 | B2* | 10/2017 | Lee | G11C 16/16 |
| 2006/0221694 | A1 | 10/2006 | Cernea et al. | |
| 2008/0247239 | A1 | 10/2008 | Nguyen et al. | |
| 2009/0059660 | A1 | 3/2009 | Lee et al. | |
| 2010/0074014 | A1 | 3/2010 | Dunga et al. | |
| 2013/0208545 | A1 | 8/2013 | Lee | |
| 2014/0056069 | A1 | 2/2014 | Park et al. | |
| 2014/0169093 | A1 | 6/2014 | Parat et al. | |
| 2014/0233327 | A1 | 8/2014 | Chen et al. | |
| 2014/0269070 | A1 | 9/2014 | Hsiung et al. | |
| 2015/0092488 | A1 | 4/2015 | Wakchaure et al. | |
| 2015/0179267 | A1 | 6/2015 | Srinivasan et al. | |
| 2015/0279472 | A1 | 10/2015 | Jones | |
| 2015/0294717 | A1 | 10/2015 | Vimercati et al. | |
| 2016/0086675 | A1 | 3/2016 | Ray et al. | |
| 2016/0093384 | A1 | 3/2016 | Lee | |

* cited by examiner

Program Operations with Single Program-Only Cycles

Program Operation 1

Single Program-Only Cycle

Program Operation 2

Single Program-Only Cycle

Program Operation N

Single Program-Only Cycle

SINGLE PULSE SLC PROGRAMMING SCHEME

BACKGROUND

Memory systems include program circuits configured to perform program operations to program data into memory cells. During a program operation, all of the memory cells may not store the correct data at the same time, and so a program circuit may perform several rounds or cycles of programming in order for the memory cells to be programmed correctly. In doing so, the program circuit may also perform verify operations to check to see which memory cells are correctly storing the data. The multiple programming cycles and the checks or verifies consume time, lengthening the overall programming processes. Ways to eliminate these extra processes in order to shorten the program operations may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Figure 1A:
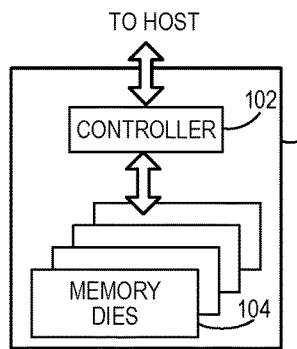
FIG. 1A is a block diagram of an example memory system.

The following embodiments describe apparatuses, devices, systems, circuits, and methods for two-dimensionally programming data into memory cells by applying different selected bit line or channel voltages to different bit lines or channels located in different bit line zones of a block. The block may be further separated or divided into word line zones. The program circuit may adjust the different bit line or channel voltages as it programs in different word line zones of the block. In accordance with the two-dimensional programming, the program circuit may perform single-pulse program-only SLC program operations. In one embodiment, a circuit includes a memory array, a word line voltage supply circuit, a word line zone decoder circuit, and a bit line voltage supply circuit. The memory array includes a plurality of word lines and bit lines, where each bit line is coupled to a channel. The word line voltage supply circuit is configured to supply a single program pulse to a selected word line to program a single page of data into a plurality of memory cells of a block. The word line zone decoder circuit is configured to identify a word line zone of the block in which the selected word line is disposed, and identify a set of channel voltages that correspond to the identified word line zone and to channels that intersect the identified word line zone. The bit line voltage supply circuit is configured to bias channels with the channel voltages according to a plurality of bit line zones, where the bit line zones extend from one end of the selected word line to the other end of the selected word line.

In some embodiments, the set of channel voltages includes a set of decreasing channel voltages, and the bit line voltage supply circuit is configured to bias the selected channels with the decreasing channel voltages according to positions of the bit line zones away from a row decoder circuit.

In some embodiments, the bit line voltage supply circuit is further configured to generate an unselected bit line voltage at different levels for different word line zones.

In some embodiments, the word line voltage supply circuit is configured to supply program pulses at different program pulse levels to selected word lines of different word line zones.

In some embodiments, the word line voltage supply circuit is configured to set a program pulse level in direct proportion to a highest channel level of the set.

In some embodiments, the word line voltage supply circuit is configured to supply a second program pulse at a higher program pulse level than the first program pulse level to a second selected word line to program a second single page of data into a second plurality of memory cells of a block, where the second selected word line is positioned in a higher word line zone than the first word line zone.

In some embodiments, the word line voltage supply circuit is configured to set a level of a selected drain select gate (SGD) voltage in direct proportion to a highest channel level of the set.

In some embodiments, numbers of bit lines in the plurality of bit line zones are increasingly larger in proportion to positions of the bit line zones away from a row decoder circuit.

In some embodiments, the word line zone decoder circuit is configured to identify a plurality of sets of channel voltages corresponding to a plurality of word line zones according to a two-dimensional table or matrix.

In some embodiments, the set of channel voltages includes a high channel voltage at a positive voltage level and a low channel voltage at a ground reference voltage level.

In some embodiments, the bit line voltage supply circuit is configured to bias channels closest to a row decoder circuit with the high channel voltage, and to bias channels farthest from the row decoder circuit with the low channel voltage.

In another embodiment, a circuit includes a row decoder and a program controller. The row decoder is configured to supply program pulses to word lines during program operations. The program controller is configured to: identify a word line address of a selected word line for programing a plurality of single-level memory cells with a single program voltage pulse; determine a word line zone identifier from among a plurality of word line zone identifiers associated with the word line address, and output a control signal to set drain-side voltages each to one of a plurality of selected drain-side levels based on the word line zone identifier and a position of the bit lines relative to the row decoder.

In some embodiments, the selected drain-side levels includes a set of decreasing drain-side voltages, and the program controller is configured to set the drain-side voltages to the decreasing drain-side levels according to positions of the bit lines away from a row decoder circuit.

In some embodiments, the row decoder is configured to supply the program pulses at different program pulse levels to selected word lines of different word line zones.

In some embodiments, the program controller is configured to set a program pulse level in direct proportion to a highest drain-side level of the set.

In some embodiments, the row decoder is configured to supply the program pulses at increasing levels in direct proportion to increasing height of a plurality of word line zones identified by the word line zone identifiers.

In some embodiments, the bit lines are divided into bit line zones, and numbers of the bit lines in the plurality of bit line zones are increasingly larger in proportion to positions of the bit line zones away from a row decoder circuit.

In some embodiments, the set of drain-side voltages includes a high drain-side voltage at a positive voltage level and a low drain side voltage at a ground reference voltage level.

In another embodiment, a system includes: a block including a plurality of word lines, a plurality of memory cells three-dimensionally arranged in the block, a row decoder, and a column decoder. The row decoder is configured to: supply a first program pulse to a first word line to program a first group of single-level memory cells during a first program operation; and supply a second program pulse to a second word line to program a second group of single-level memory cells during a second program operation, where the second word line is positioned in a higher word line zone than the first word line. The column decoder is configured to: during supply of the first program voltage pulse, supply a first set of voltages to a first set of selected channels of the block; and during supply of the second program voltage pulse, supply a second set of voltages to a second set of selected channels of the block.

In some embodiments, a program controller is configured to skip verifying the first group of single-level cells after supply of the first program pulse.

In another embodiment, a method includes: identifying, with a program controller, a first selected word line coupled to a first group of single-level memory cells for a program operation; identifying, with the program controller, a word line zone in which the first selected word line is positioned; and supplying, with a bit line voltage supply circuit, a first plurality of channel voltages at a first set of decreasing levels to selected channels based on the word line zone and a plurality of bit line zones during the program operation.

In another embodiment, a circuit includes: a memory array comprising a plurality of word lines and bit lines, each bit line coupled to a channel; a means for supplying a single program pulse to a selected word line to program a single page of data into a plurality of memory cells of a block; a means for identifying a set of channel voltages that correspond to a word line zone of a block and to channels that intersect the word line zone; and a means for biasing channels with the channel voltage according to a plurality of bit line zones, where the bit line zones extend from one end of the selected word line to the other end of the selected word line.

Other embodiments are possible, and each of the embodiments can be used alone or together in combination. Accordingly, various embodiments will now be described with reference to the attached drawings.

FIG. 1A is a block diagram illustrating a memory system 100. The memory system 100 may include a controller 102 and memory that may include or be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the non-memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, the controller 102 is a device that manages data stored in the memory die(s) and communicates with a host, such as a computer or electronic device. The controller 102 can have various functionality in addition to the specific functionality described herein. For example, the controller 102 can format the memory dies 104 to ensure the it is operating properly, map out bad flash memory cells, and allocate spare cells to be substituted for future failed cells. Some part of the spare cells can be used to hold firmware to operate the controller 102 and implement other features. In operation, when a host needs to read data from or write data to the memory die(s) 104, the host will communicate with the controller 102. If the host provides a logical address to which data is to be read/written, the controller 102 can convert the logical address received from the host to a physical address in the memory die(s) 104. (Alternatively, the host can provide the physical address). The controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable interface, such as flash interface, including those configured for Toggle Mode 200, 400, 800, 1000 or higher. For some example embodiments, the memory system 100 may be a card based system, such as a secure digital (SD) or a micro secure digital (micro-SD) card. In alternate example embodiments, the memory system 100 may be part of an embedded memory system.

In the example illustrated in FIG. 1A, the memory system 100 is shown as including a single channel between the controller 102 and the non-volatile memory die(s) 104. However, the subject matter described herein is not limited to memory systems having a single memory channel. For example, in some memory systems, such as those embodying NAND architectures, 2, 4, 8 or more channels may exist between the controller 102 and the memory die(s) 104, depending on controller capabilities. In any of the embodiments described herein, more than a single channel may exist between the controller and the memory die(s)s 104, even if a single channel is shown in the drawings.

Figure 1B:
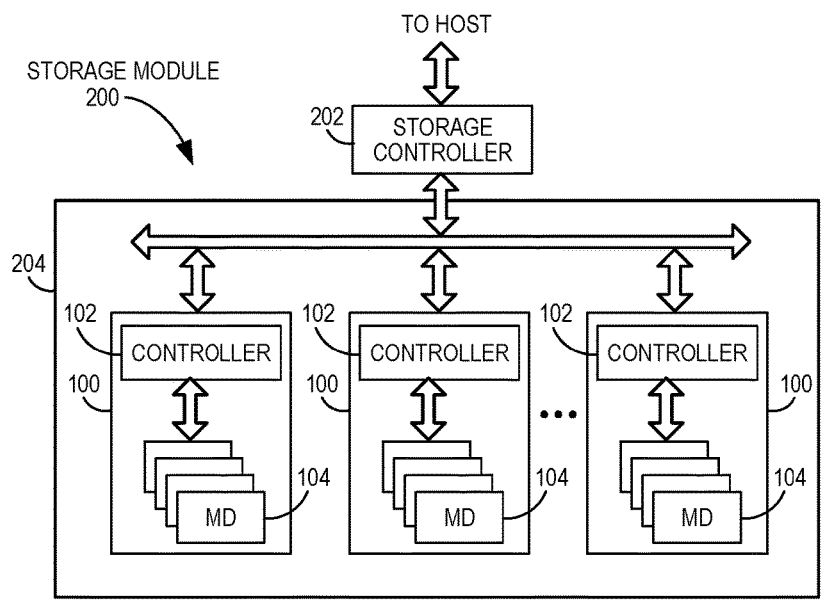
FIG. 1B is a block diagram of an example storage module that includes a plurality of memory systems.

FIG. 1B illustrates a storage module 200 that includes a plurality of non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage module 200, in one embodiment, may be a solid state drive (SSD), such as found in portable computing devices, such as laptop computers and tablet computers, and mobile phones.

Figure 1C:
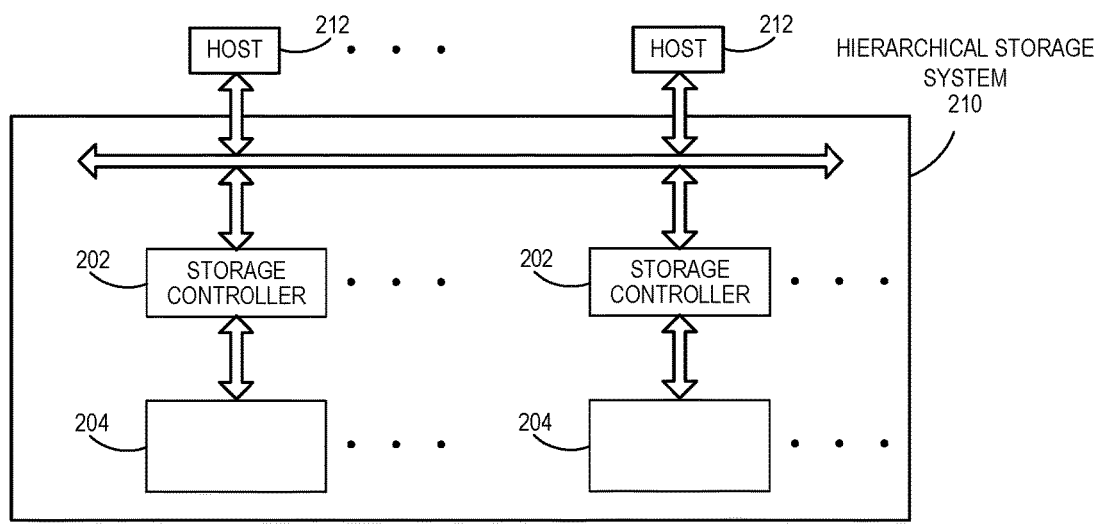
FIG. 1C is a block diagram of an example hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
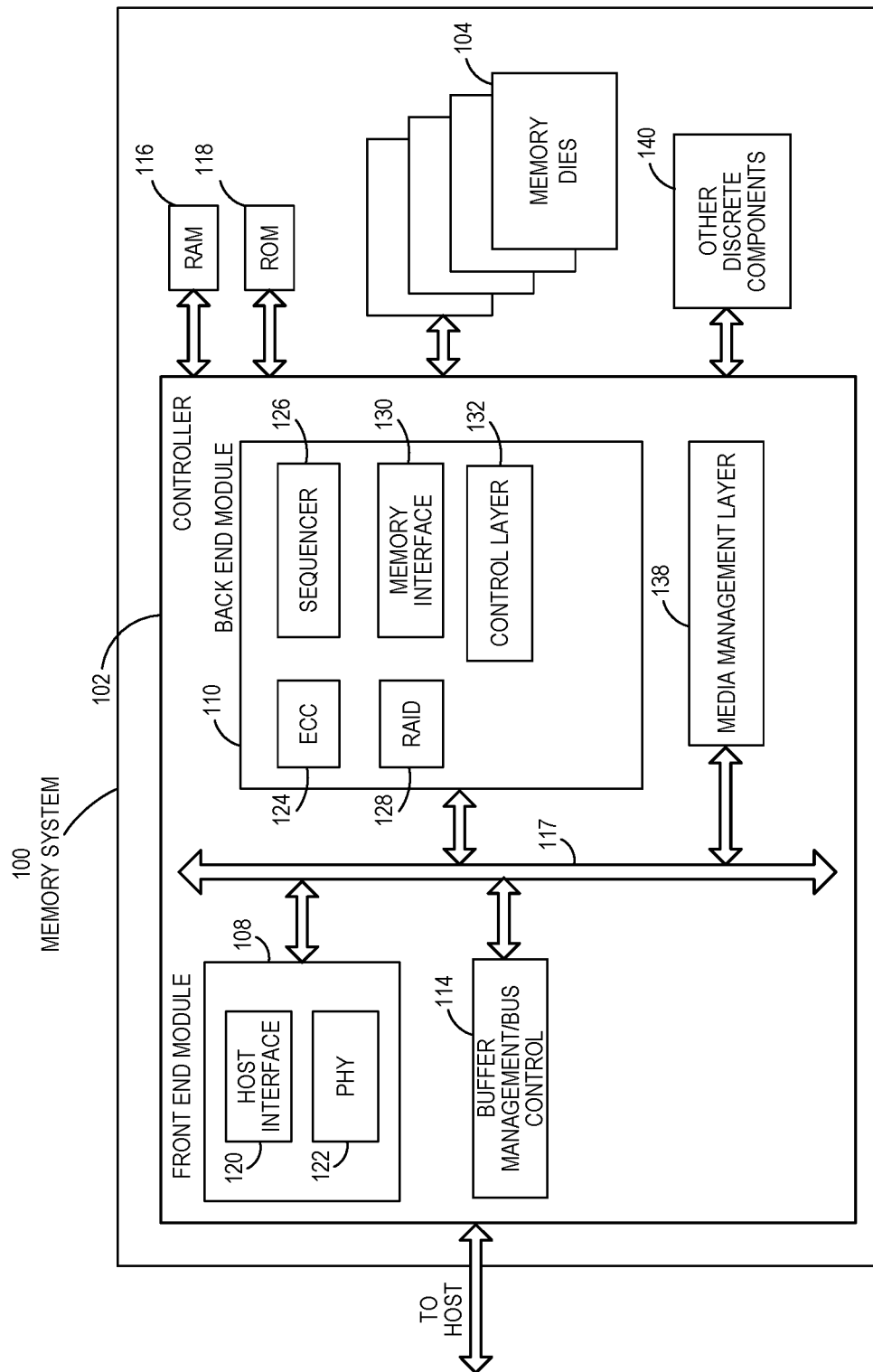
FIG. 2A is a block diagram of an example configuration of components of a controller of the memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the non-volatile memory die(s) 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface and/or a Toggle Mode 200, 400, 800, or higher interface. A control layer 132 may control the overall operation of back end module 110.

Additional modules of the non-volatile memory system 100 illustrated in FIG. 2A may include a media management layer 138 that performs certain memory management functions such as wear leveling of memory cells of the memory dies 104, address management, and facilitates folding operations. Other memory management functions may be possible. The non-volatile memory system 100 may also include other discrete components 140, such as external electrical interfaces, external RAM, resistors, capacitors, or other components that may interface with the controller 102. In alternative embodiments, one or more of the RAID module 128, media management layer 138 and buffer management/ bus controller 114 are optional components that may not be necessary in the controller 102.

Figure 2B:
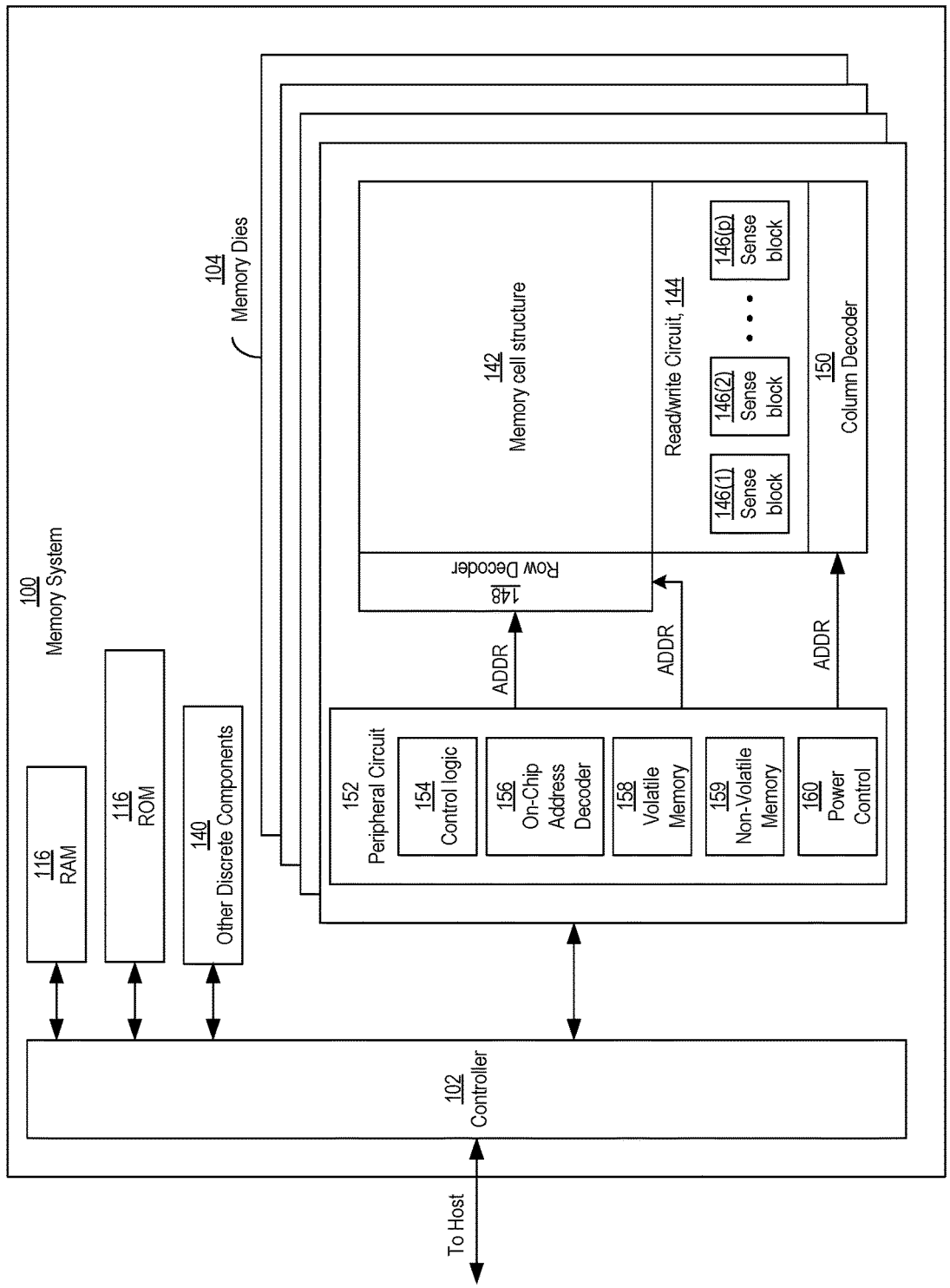
FIG. 2B is a block diagram of an example configuration of components of a memory die of the memory system of FIG. 1A.

FIG. 2B is a block diagram of an example configuration of components of a memory die 104 in more detail. The memory die 104 may include a memory cell structure 142 that includes a plurality of memory cells, otherwise or interchangeably referred to as memory elements. A memory cell is an element or component that stores a unit of data having an n-bit data value, where n is one or more. Any suitable type of memory can be used for the memory cells of the memory cell structure 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group. Alternatively, memory cells may be configured so that each element is individually accessible, e.g., a NOR memory array. NAND and NOR memory configurations are exemplary, and memory cells may be otherwise configured.

A plurality of memory cells that form the memory cell structure 142 of a memory die may be located within and/or over a substrate. The substrate may be a wafer over or in which the layer of the memory cells are formed or it may be a carrier substrate which is attached to the memory cells after they are formed. As a non-limiting example, the substrate may include a semiconductor and/or be made of a semiconductor material, such as silicon.

In addition, a plurality of memory cells that form the entire memory cell structure 142 or at least a portion of the memory cell structure 142, may be arranged in two dimensions or in three dimensions. A plurality of memory cells arranged in two dimensions is referred to as a two-dimensional (2-D) memory cell structure. A plurality of memory cells arranged in three dimensions is referred to as a three-dimensional (3-D) memory cell structure.

In a two-dimensional memory cell structure, the memory cells are arranged in a single plane or a single memory device level. Typically, in a two-dimensional memory cell structure, the memory cells are arranged in a plane (e.g., in an x-y direction plane) that extends substantially parallel to a major surface of a substrate that supports the memory cells.

In a three-dimensional memory cell structure, the memory cells are arranged so that memory cells occupy multiple planes or multiple memory device levels (e.g., multiple x-y direction planes), thereby forming a structure in three dimensions (i.e., in the x, y and z directions, where the z direction is substantially perpendicular to and the x and y directions are substantially parallel to the major surface of the substrate). When configured as a three-dimensional memory cell structure, the memory cells extend up or away from the major surface of the substrate.

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the z direction) with each column having multiple memory cells in each column. The columns may be arranged in a two dimensional configuration, e.g., in an x-y plane, resulting in a three-dimensional arrangement of memory cells, with the memory cells on multiple vertically stacked memory planes. Other configurations of memory cells in three dimensions can also constitute a three dimensional memory array.

In at least some example configurations, a two-dimensional or a three-dimensional memory cell structure may be in the form of or configured as an ordered array (or just array). One type of an array is an orthogonal array, which is a matrix-like structure that includes rows and columns. The memory cells are arranged in the rows and columns. At the intersection of a row and a column is a memory cell. However, in other configurations, the memory cells may be arrayed in non-regular or non-orthogonal configurations.

Figure 3A:
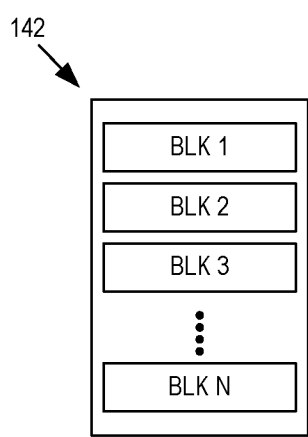
FIG. 3A is a block diagram of a memory cell structure organized into blocks.

Referring to FIG. 3A, the memory cell structure 142 located on a single memory die 104 may be organized into an N-number of blocks, extending from a first block BLK 1 to an Nth block BLK N. A block is a minimum unit of erase of a memory die 104. Memory cells that are part of the same block are erased at the same time and/or as part of a same erase operation.

Figure 3B:
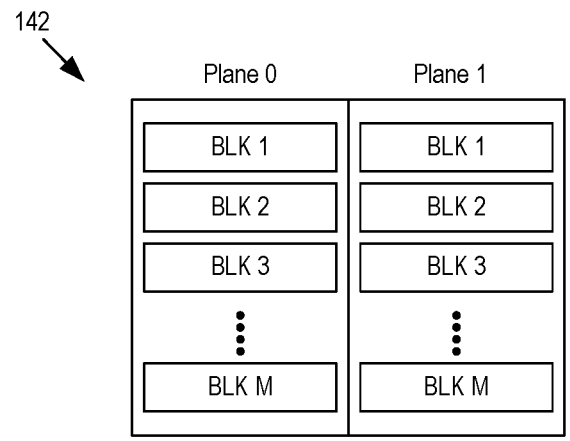
FIG. 3B is a block diagram of a memory cell structure organized into blocks in different memory planes.

Referring to FIG. 3B, for some example configurations, the N-number of blocks located on a single memory die 104 are organized into a plurality of memory planes (or just planes). FIG. 3B shows an example configuration where the blocks are organized into two memory planes, including a first memory plane Plane 0 and a second memory plane Plane 1. Configurations that include more than two memory planes may be possible. In FIG. 3B, each memory plane is shown as including an M-number of blocks, extending from a first block BLK 1 to an Mth block BLK M. In at least some example configurations, blocks that are part of the same plane may be oriented in and/or form a column or a one-dimensional array of blocks, although other configurations of blocks in a single plane may be possible.

The memory cells of a block may be arranged two-dimensionally in a two-dimensional (2-D) memory array or three-dimensionally in a three-dimensional (3-D) memory array. A two-dimensional block is a block that has memory cells arranged two-dimensionally. A three-dimensional block is a block that has memory cells arranged three-dimensionally.

Figure 4A:
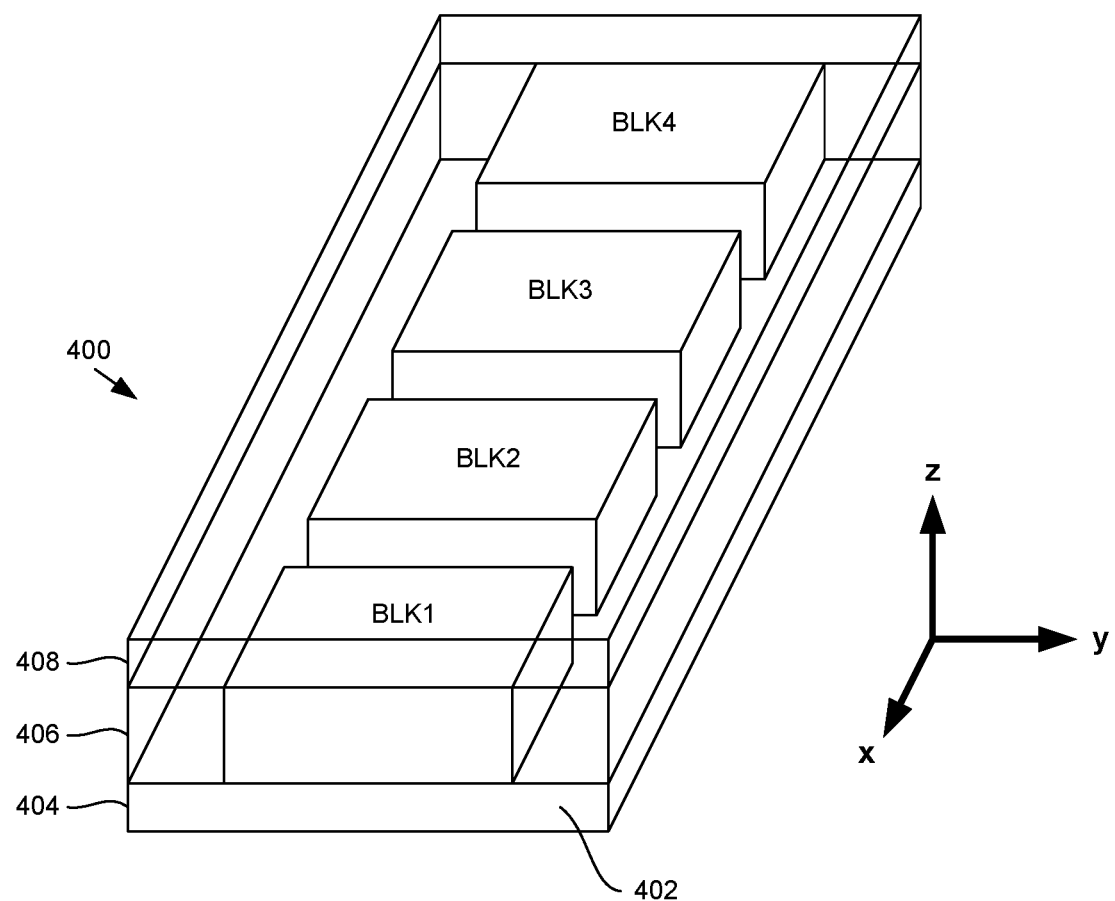
FIG. 4A is a perspective view of at least a portion of the memory die of FIG. 2B that includes a plurality of three-dimensional blocks.

FIG. 4A shows a perspective view of at least a portion of a memory die 104 that includes a set or a plurality of three-dimensional blocks 400, which may represent at least a portion of the memory cell structure 142 of FIG. 2B. For simplicity, the plurality of blocks 400 is shown as including four blocks, BLK1, BLK2, BLK3, and BLK4. In actual implementation, a given memory cell structure 142 of a memory die 104 may include several more blocks than four, such as on the order of hundreds, thousands, or tens of thousands of blocks. In a particular example configuration, one plane of blocks includes 2,000 blocks.

The blocks 400 are located or disposed on a substrate 402 of the memory die 104. The substrate 402 may be part of a lower level or region 404 of the memory die 104 that carries or includes circuitry under the blocks 400, along with one or more lower metal layers patterned to form conductive paths that carry or supply signals or voltages output from the circuitry, such as those used to perform memory operations (read, program, sense, erase, e.g.).

The blocks 400 are disposed in an intermediate level or region 406 (also referred to as a block level or region, or an array level or region) of the memory die 104 in between the lower region 404 and an upper level or region 408 of the memory die 104. The upper region 408 may include one or more upper metal layers patterned in the form of conductive paths that carry or supply signals or voltages output from the circuitry.

The substrate 402 is generally a planar structure having opposing planar surfaces. Herein, the components on a memory die 104 can be physically described with reference to a three-dimensional Cartesian coordinate system having an x-axis, a y-axis, and a z-axis. The z-axis is the axis that extends perpendicular to the planar surfaces of the substrate 402. In general, the components on a memory die 104 are disposed on and/or extend from one of the planar surfaces in a z-direction that is parallel with the z-axis. The terms "above" and "below" as well as other terms such as "top" and "bottom" and "upper" and "lower" are used herein to describe relative positioning of components of the memory die 104 along or with reference to the z-axis. For example, the blocks 400 are "above" the substrate 402, and the substrate 402 is part of the lower region 404 that is "below" the blocks 400. In addition, the upper region 408 is a region of the memory die 104 "above" both the blocks 400 and the substrate 402. Components of the memory die 104 disposed in the upper region 408 are farther away in the z-direction from the substrate 402 than components of the blocks 400. In general, for two components on a given memory die 104, where the first component is "above" the second component, the first component is positioned or disposed farther in the z-direction from the substrate 402 than the second component. In addition, where the first component is "below" the second component, the first component is positioned or disposed closer in the z-direction to the substrate 402 than the second component.

The terms "top" and "bottom" are also used to refer to the relative positioning of components of the memory die 104 in the z-direction and/or along the z-axis. In general, "bottom" components are positioned or disposed closer in the z-direction to the substrate 402 than "top" components, and "top" components are positioned or disposed farther in the z-direction from the substrate 402 than "bottom" components. In this context, a memory die 104 may include one or more top metal layers disposed in the upper region 408 and one or more bottom metal layers disposed in the lower region 404. In general, the bottom metal layers are positioned or disposed closer in the z-direction to the substrate 402 than the top metal layers, and the top metal layers are positioned or disposed farther in the z-direction from the substrate 402 than the bottom metal layers.

Although the terms "upper" and "lower," "above" and "below," and "top" and "bottom" are used to describe the relative position of components on a memory die 104, they should not be construed as limiting the relative positioning of the components since a memory die 104, or the memory system 100 as a whole, can be oriented in any of various positions.

With respect to the components of a block, a block includes a plurality of bias elements and a plurality of control lines. A bias element is a component or unit of a block that receives, is biased with, and/or that responds to a bias. A bias, as used in conjunction with a bias element of a block, is a voltage, a current, a plurality of voltages, a plurality of currents, or a combination of at least one voltage and at least one current that is applied to and/or received by the bias element to cause a response from the bias element or configure the bias element in a particular state. A bias is applied or supplied to the bias element, or the bias element is biased with the bias, at one or more levels to induce a response or configure the bias element in a particular state in order for a memory operation to be carried out.

The plurality of bias elements of a block may all be of a single type or may each be one of a plurality of different types. Bias elements of different types may perform different functions in the block and/or may be biased with different biases at different levels during the memory operations.

One type of bias element is a memory cell. Memory cells that are part of the same block are referred to as a block of memory cells. Other types of bias elements may be possible, depending on the memory technology. In NAND technology, other types of bias elements may include dummy cells, drain select gate transistors (referred to as SGD transistors), and source select gate transistors (referred to as SGS transistors). At least with NAND technology, dummy cells are memory cells that do not store data from a host, and are disposed coplanar with dummy word line layers that shield memory cells and word line layers from certain edge effects. SGD transistors and SGS transistors may be configured to be enabled (turn on) and disabled or inhibited (turn off), or otherwise configured in conductive and non-conductive states, at certain time and/or in response to certain biases to allow memory operations to be performed—e.g., to allow data to be programmed into, read from, or erased from the memory cells. Bias element types other than or in addition to memory cells, dummy cells, SGD transistors, and/or SGS transistors may be possible.

In addition, a control line of a block is a conductive structure, element, or component of a block that supplies, applies, or outputs at least a part of a bias (such as a single voltage or a single current) to one or more bias elements of a block and/or that biases the one or more bias elements with at least part of the bias. In at least some example configurations, a control line functions as a contact line, in that it is the conductive line that physically extends to and contacts the one or more bias elements it biases, such as by contacting and/or forming at least a part of the electrodes or terminals of the bias element that it biases.

The control lines of a block may be organized, arranged, characterized, divided, or configured into a plurality of different types of control lines. The control lines may be organized into types by the way that they bias the bias elements. For example, control lines of the same type may bias the bias elements in the same way, such as by biasing the same type of bias elements and/or the same types of terminals of the bias elements.

For NAND technology, the control lines of a block may be organized into three main types, including control gate lines, bit lines, and source lines. A control gate line (at least for NAND technology) is a control line that applies a control gate voltage to one or more control gate terminals (or just control gate) of one or more bias elements, and/or that biases one or more control gate terminals of one or more bias elements with a control gate voltage.

A bit line (at least for NAND technology) is a control line that applies a bit line voltage to one or more terminals of one or more bias elements, and/or that biases one or more terminals of one or more bias elements with a bit line voltage. In particular example configurations, the bit lines bias the drain terminals (or just drains) of the bias elements. For such example configurations, the bit line voltage may alternatively be referred to as a drain voltage, where a bit line is a control line that applies a drain voltage to one or more drain terminals of one or more bias elements. In addition, for at least some example configurations, a bit line biases terminals of bias elements by applying its bit line voltage to one or more channels and/or associated channel element groups. In this context, the bit line voltage may alternatively be referred to as a channel voltage, where a bit line is a control line that applies a channel voltage to one or more channels and/or associated channel element groups. Otherwise stated, a channel voltage is a voltage that a control line applies to a channel. In particular example configurations, particularly those where the bit lines bias the drain terminals of bias elements, the bit lines bias drain ends or drain sides of one or more channels and/or associated channel element groups. In this context, a bit line voltage may alternatively be referred to as a drain-side channel voltage (or just drain-side voltage). Otherwise stated, a drain-side channel voltage (or just drain-side voltage) is a voltage that a control line applies to a drain end of a channel.

A source line (at least for NAND technology) is a control line that applies a source line voltage to one or more terminals of one or more bias elements, and/or that biases one or more terminals of one or more bias elements with a source line voltage. In particular example configurations, the source line biases the source terminals (or just sources) of the bias elements. For such example configurations, the source line voltage may alternatively be referred to as a source voltage, where a source line is a control line that applies a source voltage to one or more source terminals of one or more bias elements. In addition, for at least some example configurations, a source line biases terminals of bias elements by applying its source line voltage to one or more channels and/or associated channel element groups. In this context, the source line voltage may alternatively be referred to as a channel voltage, where a source line is a control line that applies a channel voltage to one or more channels and/or associated channel element groups. In particular example configurations, particular those where the sources lines bias the source terminals of bias elements, the source line biases source ends or source sides of one or more channels and/or associated channel element groups. In this context, a source line voltage may alternatively be referred to as a source-side channel voltage or (or just source-side voltage). Otherwise stated, a source-side channel voltage (or just source-side voltage) is a voltage that a control line applies to a source end of a channel.

In at least some example configurations, control gate lines of a block may be further organized, arranged, characterized, divided, or configured into a plurality of different control gate types (or sub-types). In particular, the control gate lines may be further arranged into the types of bias elements that they bias, and include word lines, dummy word lines, drain select gate lines (referred to as SGD lines), and source select gate lines (referred to as SGS lines).

A word line is a control gate line that applies a word line voltage to one or more control gates of one or more memory cells, and/or that biases one or more control gates of one or more memory cells with a word line voltage. A dummy word line is a control gate line that applies a dummy word line voltage to one or more control gates of one or more dummy cells, and/or that biases one or more control gates of one or more dummy cells with a dummy word line voltage. A drain select gate line (referred to as an SGD line) is a control gate line that applies a drain select gate voltage (referred to as a SGD line voltage) to one or more control gates of one or more SGD transistors, and/or that biases one or more control gates of one or more SGD transistors with an SGD line voltage. A source select gate line (referred to as a SGS line) is a control gate line that applies a source select gate voltage (referred to as a SGS line voltage) to one or more control gates of one or more SGS transistors, and/or that biases one or more control gates of one or more SGS transistors with an SGS line voltage.

For some example configurations of a three-dimensional block, at least one type of control line is implemented or formed as a plurality of layers. For example, in at least some 3-D NAND configurations, the control gate lines of a block are implemented or formed as layers. In general, a layer, otherwise referred to as a sheet or a plate, is a generally planar structure extending in the x-y directions perpendicular to the z-direction. A layer has opposing planar surfaces facing in opposite directions. One of the planar surfaces is a top surface that faces in the z-direction away from the substrate 402, and the other planar surface is a bottom surface that faces in the z-direction toward the substrate 402.

Herein, the terms "line" and "layer," at least as they are used to refer to control lines—except SGD lines as described in further detail below—are used interchangeably or as alternatives to each other. For example, the terms "control gate line" and "control gate layer" are used interchangeably; the terms "word line" and "word line layer" are used interchangeably; the terms "dummy word line" and "dummy word line layer" are used interchangeably; and the terms "source select gate line" (or SGS line) and "source select gate layer" (or SGS layer) are used interchangeably.

In addition, for at least for some example configurations of 3-D NAND technology, a three-dimensional block includes a stack. In general, a stack is a plurality or a collection of layers disposed on top of one another. For 3-D NAND, a stack of a block includes a plurality of control gate layers and a plurality of dielectric layers. A dielectric layer, at least when implemented with control gate layers of a stack, is a layer that electrically isolates one control gate layer from another control gate layer. In the stack, the control gate layers and the dielectric layers are arranged in an alternating manner, in that as the stack extends in the z-direction away from the substrate, the layers consecutively alternate between control gate layers and dielectric layers. In this context, a stack of a three-dimensional block is a collection of alternatingly disposed control gate layers and dielectric layers.

A stack of a three-dimensional block includes outer surfaces and edges as defined by the side surfaces and edges of the layers, as well as a top surface of a top-most layer of the stack and a bottom surface of a bottom-most layer of the stack. The outer surfaces and edges of the stack, in turn, define an outer boundary of the stack. The bias elements of the three-dimensional block are three-dimensionally arranged within the outer boundary. In this context, the bias elements of the three-dimensional block are referred to as being disposed in or within the stack.

In addition, at least for some example configurations, the bias elements of a three-dimensional block are disposed coplanar (in the x-y direction) with control gate layers. In particular, the bias elements are coplanar with the control gate layers by which they are configured to be biased. Accordingly, memory cells configured to be biased by a particular word line layer are disposed coplanar with the particular word line layer; SGD transistors configured to be biased by a particular SGD layer are disposed coplanar with the particular SGD layer; SGS transistors configured to be biased by a particular SGS layer are disposed coplanar with the particular SGS layer; and dummy cells configured to by biased by a particular dummy word line layer are disposed coplanar with the particular dummy word line layer.

A bias element that is coplanar with and/or configured to be biased by a given control gate layer may be referred to as being disposed in, located in, and/or coupled to the given control gate layer. For example, a memory cell coplanar with and/or configured to be biased by a given word line may be referred to as being disposed in, located in, and/or coupled to the given word line layer.

In addition, at least for some example configurations of 3-D NAND technology, a three-dimensional block includes a plurality of channels. A channel is an elongate structure that extends in the z-direction through a stack of a block, around or about which bias elements of the block are formed or disposed. A bias element that is disposed or formed around or about a channel may at least partially, and in some configurations completely, encompass or surround the channel.

In addition, at least for some example configurations of 3-D NAND technology, bias elements of a block are biased by way of channels. Otherwise stated, a channel is structure of a block by which bias elements are biased. In particular, drain terminals and source terminals of bias elements are biased by way of channels. A bias element that has its source and drain terminals biased by a given channel is coupled to that given channel.

Each channel includes a respective drain end (or drain side) and a respective source end (or source side). A channel extends through a stack in the z-direction toward the substrate from its drain end to its source end. Bit lines of a block are electrically connected or coupled the drain ends of the channels, and the source line of a block is electrically connected or coupled to the source ends of the channels. In the example configurations of a block described herein, a bit line applies a bit line voltage (or drain voltage or drain-side voltage or drain-side channel voltage) to the one or more drain ends of one or more channels to which it is coupled. The source line applies a source line voltage (or source voltage or source-side voltage or source-side channel voltage) to the source ends of the channels to which it is coupled.

Additionally, as used herein, a channel element group is a plurality or a collection of bias elements that are formed or disposed around or about the same channel. A given channel and a given channel element group that includes the bias elements disposed or formed around or about the given channel are referred to as being coupled to and/or associated with each other. In addition, bias elements that are part of the same channel element group are referred as being coupled to each other.

For at least some example configurations, the bias elements of a channel element group include a plurality of memory cells, at least one SGD transistor, and at least one SGS transistor. In particular example configurations, a channel element group may further include one or more dummy cells.

The channel element groups extend in the z-direction about their associated channels. Similar to the channels, the channel element groups each include respective drain ends (or drain sides) and source ends (or source sides). A channel extends in the z-direction toward the substrate from its drain end to its source end.

In particular example configurations, including those described herein, drain ends of channel element groups are electrically coupled to drain ends of their associated channels. Accordingly, the bit lines are electrically connected or coupled to drain ends of channels and associated channel elements groups. In this context, a bit line or channel voltage that a bit line is configured to apply is a drain voltage, a drain-side channel voltage, or a drain-side voltage that the bit line applies to drain ends of channels and associated channel element groups to which the bit line is coupled. Otherwise stated, a drain-side channel voltage (or drain-side voltage) is a voltage that a bit line generates and applies to a drain end (or drain side) of a channel and/or a drain end (or drain side) of a channel element group to which it is electrically connected or coupled. During at least some example memory operations, a bit line may bias one or more drain terminals of one or more bias elements by applying a bit line voltage (or a drain voltage, a drain-side channel voltage, or a drain-side voltage) to one or more drain ends of one or more channels and/or to one or more drain ends of one or more channel element groups to which it the bit line is electrically connected or coupled. Otherwise stated, during at least some example memory operations, a bit line biases one or more drain terminals of one or more bias elements with a bit line voltage (or a drain voltage, a drain-side channel voltage, or a drain-side voltage) by way of the drain ends of one or more channels and/or the drain ends of one or more channel element groups to which the bit line is coupled.

Similarly, in particular example configurations, including those described herein, source ends of channel element groups are electrically coupled to source ends of their associated channels. Accordingly, the source line is electrically connected or coupled to source ends of channels and associated channel elements groups. In this context, a source line or channel voltage that a source line is configured to apply is a source voltage, a source-side channel voltage, or a source-side voltage that the source line applies to source ends of channels and associated channel element groups to which the source line is coupled. Otherwise stated, a source-side channel voltage (or source-side voltage) is a voltage that a source line generates and that it applies to a source end (or source side) of a channel and/or a source end (or source side) of a channel element group to which the source line is electrically connected or coupled. During at least some example memory operations, a source line may bias one or more source terminals of one or more bias elements by applying a source line voltage (or a source voltage, a source-side channel voltage, or a source-side voltage) to one or more source ends of one or more channels and/or to one or more source ends of one or more channel element groups to which it the source line is electrically connected or coupled. Otherwise stated, during at least some example memory operations, a source line biases one or more source terminals of one or more bias elements with a source line voltage (or a source voltage, a source-side channel voltage, or a source-side voltage) by way of the source ends of one or more channels and/or the source ends of one or more channel element groups to which the source line is coupled.

In addition, bias elements of a channel element group extend in the z-direction around or about the same channel. Each bias element of the channel element group is disposed coplanar with one of the plurality of control gate layers of the block. In this regard, each control gate layer of the block is configured to bias a control gate of a respective one of the plurality of bias elements of the channel element group.

In addition, for at least some example configurations, the channel element groups of a block may have the same number of bias elements, the same combination of bias element types, and the same number of bias elements of each bias element type. Also, a bias element order in which the bias elements of their respective bias element types extend in the z-direction away from the substrate is the same among the channel element groups of a block. At least for some example configurations of 3-D NAND technology, the bias element order of the bias elements of a channel element group, starting closest to the substrate and moving away from the substrate in the z-direction, includes one or more SGS transistors followed by one or more source-side dummy cells, followed by a plurality of memory cells, followed by one or more drain-side dummy cells, and followed by one or more SGD transistors. Other bias element orders may be possible.

A control gate layer order of the control gate layers and their respective types may match or correspond to the bias element order of a block. Accordingly, at least for some example configurations of 3-D NAND technology, a control gate layer order of a plurality of control gate layers of a block, starting closest to the substrate and moving away from the substrate in the z-direction, includes one or more SGS layers, followed by one or more source-side dummy word line layers, followed by a plurality of word line layers, followed by one or more drain-side dummy word line layers, and followed by one or more SGD layers.

Figure 4B:
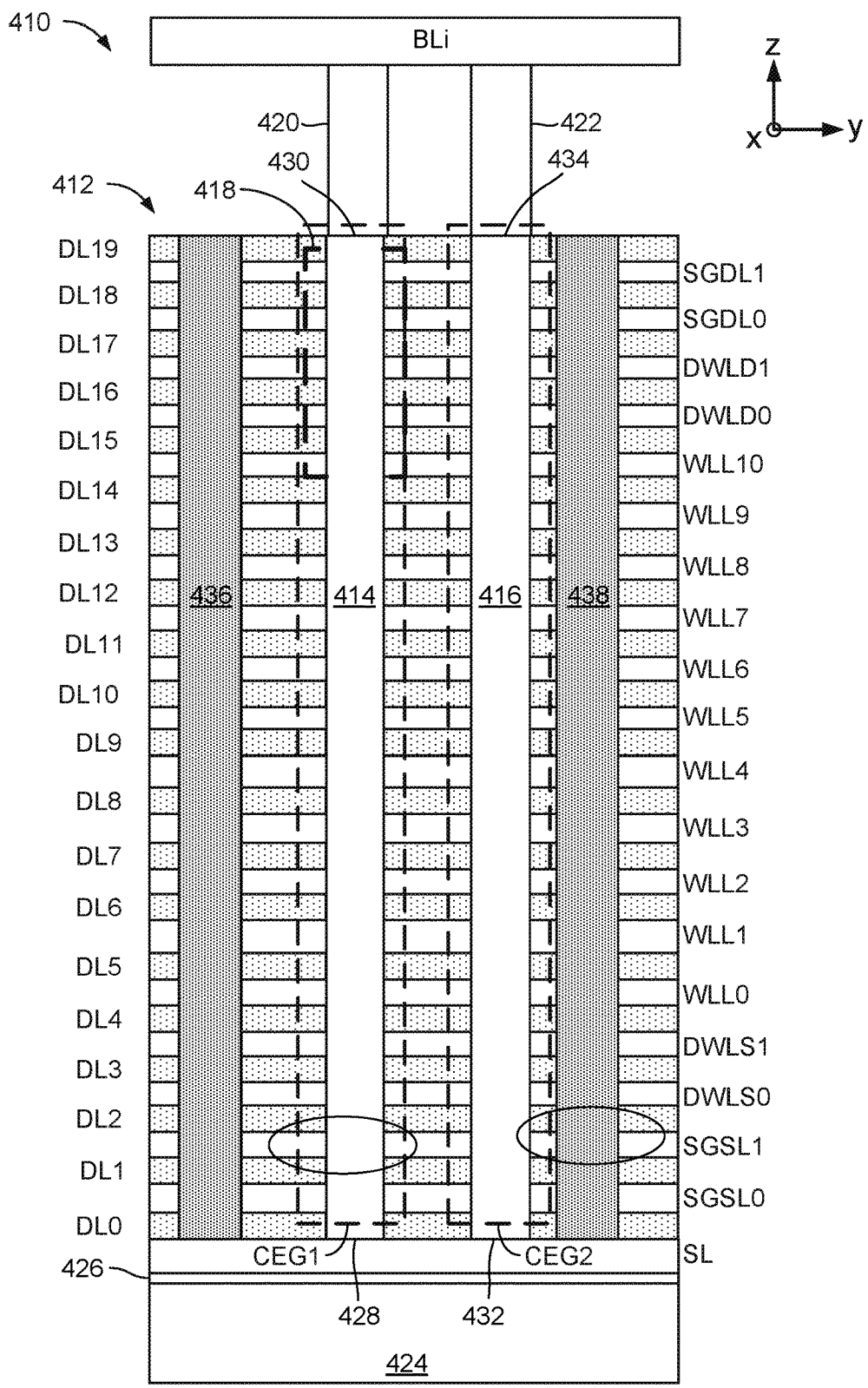
FIG. 4B is a cross-sectional view of a portion of one of the blocks of FIG. 4A.

In further detail, FIG. 4B shows a cross-sectional view of a portion of a block 410, which may be representative of one of the blocks 400 of FIG. 4A. The block 410 includes a stack 412 of alternating control gate layers and dielectric layers (DL). In addition, the portion shown in FIG. 4B includes two channels (or memory holes) extending through the layers, including a first channel 414 and a second channel 416. Bias elements forming two memory channel element groups around the two channels 414, 416 are identified by dotted boxes in FIG. 4B. In particular, bias elements forming a first channel element group CEG1 around the first channel 414 are identified by a dotted box labeled CEG1, and bias elements forming a second channel element group CEG2 around the second memory hole 416 are identified by a dotted box labeled CEG2. Further details of bias elements and example materials to form the elements and the channels are described in further detail below with respect to FIG. 4C with reference to a particular region 418 of the first channel element group CEG1 and associated first channel 414.

For purposes of illustration, in FIG. 4B, the first and second channel element groups CEG1, CEG2 formed around the first and second channels 414, 416 are both electrically connected to an ith bit line BLi. In actual implementation, a block may include hundreds or thousands of bit lines. An arrangement of channels and associated channel element groups of a block may determine which channels and channel element groups are electrically connected to which bit lines. Among the plurality of channels and channel element groups of a block, certain combinations of channels and associated channel element groups are electrically connected to the same bit line as each other, while certain other combinations of channels and associated channel element groups are electrically connected to different bit lines from each other.

In addition, a given channel element group may be electrically connected to a given bit line by way of its associated channel and a conductive via electrically connecting the associated channel with the bit line. For example, in FIG. 4B, the first channel element group CEG1 is electrically connected to the ith bit line BLi by way of the first channel 414 and a conductive via 420 that electrically connects the first channel 414 with the ith bit line BLi. The second channel element group CEG2 is electrically connected to the ith bit line BLi by way of the second channel 416 and a conductive via 422 that electrically connects the second channel 416 with the ith bit line BLi. Other ways of electrically connecting bit lines with channel element groups may be possible.

The block 410 may further include or be disposed on a substrate 424. An insulating film 426 may be formed on the substrate 424, and a source line SL may be formed or disposed on a bottom-most layer of the stack 412.

In addition, in the example configuration shown in FIG. 4B, each channel 414, 416 includes a source end connected to the source line SL, and a drain end connected to its associated conductive via. In FIG. 4B, the first channel 414 includes a source end 428 connected to the source line SL, and a drain end 430 connected to the conductive via 420. Similarly, the second channel 416 includes a source end 432 connected to the source line SL, and a drain end 434 connected to the conductive via 422.

In addition, at least some example configurations, the block 410 may further include vertical interconnects (e.g., metal-filled slits) extending through the stack 412 that connect the source line SL to a conductive line above the stack 412, such as a conductive line in one of the metal layers in the upper region 408 (FIG. 4A). For purposes of illustration, FIG. 4B shows two interconnects 436, 438 extending through the stack 412.

In addition, in the example configuration in FIG. 4B, for purposes of illustration, each of the channel element groups include two SGS transistors, two source-side dummy cells, eleven memory cells, two drain-side dummy cells, and two SGD transistors. Accordingly, the control gate layers of the stack 412 include: two SGS layers, including a first SGS layer SGSL0 and a second SGS layer SGSL1; two source-side dummy word line layers, including a first source-side dummy word line layer DWLS0 and a second source-side dummy word line layer DWLS1; eleven word line layers extending from a first word line layer WLL0 to an eleventh word line layer WLL10; two drain-side dummy word line layers, including a first drain-side dummy word line layer DWLD0 and a second drain-side dummy word line layer DWLD1; and two SGD layers, including a first SGD layer SGSL0 and a second SGD layer SGDL1. The stack further includes twenty dielectric layers, extending from a first dielectric layer DL0 to a twentieth dielectric layer DL19, alternately disposed between the control gate layers.

The numbers of bias elements and their respective bias element types used for the channel element groups and the number of corresponding control gate layers in the example configuration of the block 410 in FIG. 4B are non-limiting and merely exemplary for purposes of illustration. Other numbers of bias elements for any of the bias element types, or other configurations that do not include bias elements of certain bias elements types or that include one or more bias elements of bias element types other than those shown in FIG. 4B, may be possible.

Figure 4C:
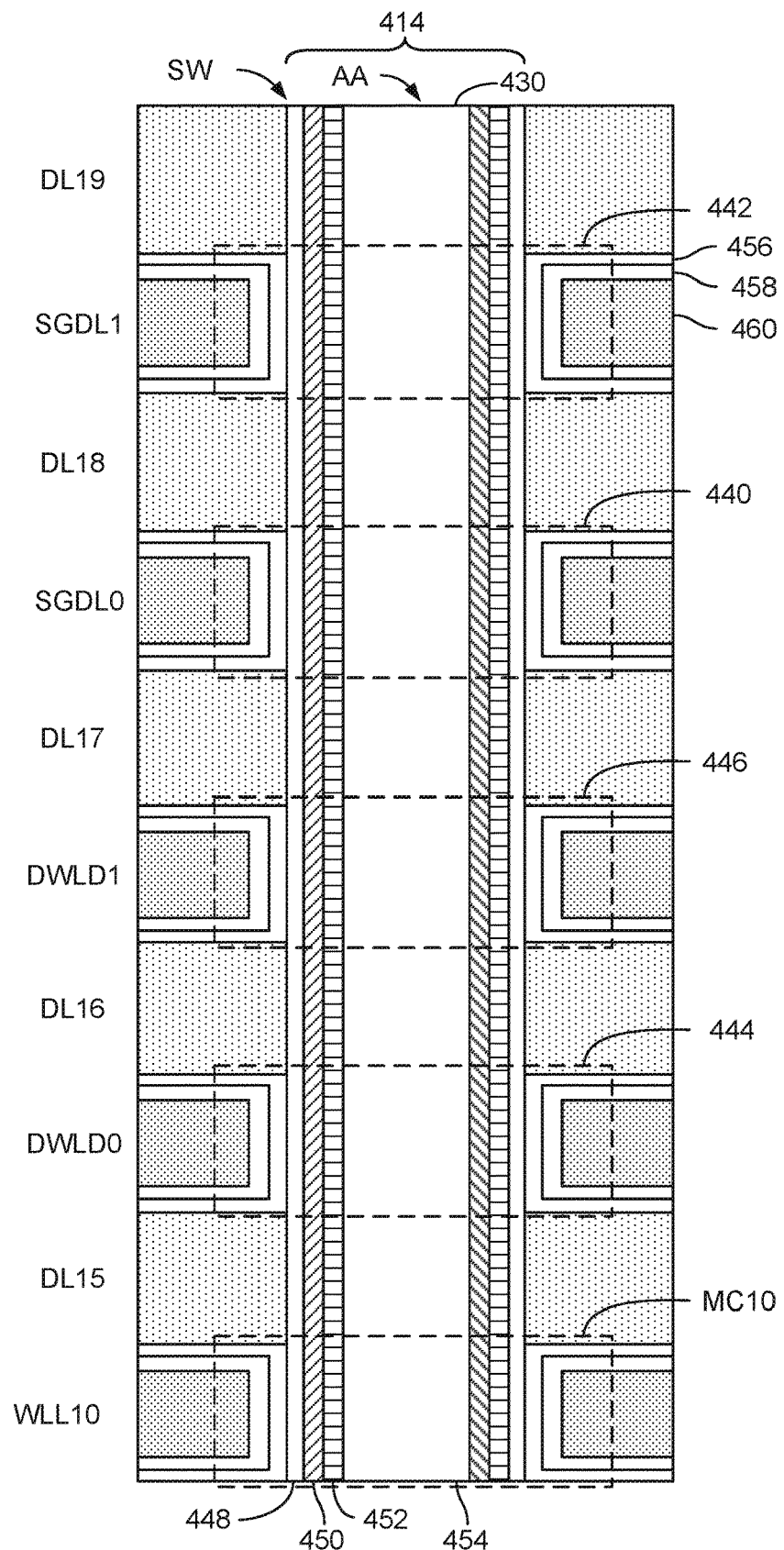
FIG. 4C is a close-up view of a region of the cross-section of FIG. 4B.

FIG. 4C is a close-up view of the region 418 of the block 410 of FIG. 4B. The materials forming the bias elements are formed at different levels of the stack 412 at the intersection of respective control gate layers and respective channels. In the example configuration of the block 410, as depicted in the close-up view of FIG. 4C, a first SGD transistor 440 and a second SGD transistor 442 are disposed below the drain end 430 of the first channel 414, and above first and second drain-side dummy cells 444, 446 and an eleventh memory cell MC10.

Physically or structurally, a channel includes a memory hole extending in the z-direction defined by a sidewall (SW). A channel further includes one or more layers of materials disposed in the memory hole and/or on the side wall, such as by using atomic layer deposition as an example. In some example configurations, as described with respect to the first channel 414, the layers of materials of a channel (which may be referred to as a column or a pillar of materials) may include a charge-trapping layer or film 448 such as silicon nitride, a tunneling layer 450, a polysilicon body or channel 452, and a dielectric core 454. In addition, in some example configurations, such as the one shown in FIG. 4C, the materials making up each of the bias elements may include a blocking oxide/block high-k material 456, a barrier metal 458, and a conductive metal 460 (e.g. Tungsten) that forms the control gates of the transistors. The materials forming the bias elements may be disposed in the same level or in the same plane as the respective control gate layers. Other configurations may use materials deposited along the sidewall (SW) and/or for the bias elements other than those shown and described with reference to FIG. 4C.

Figure 4D:
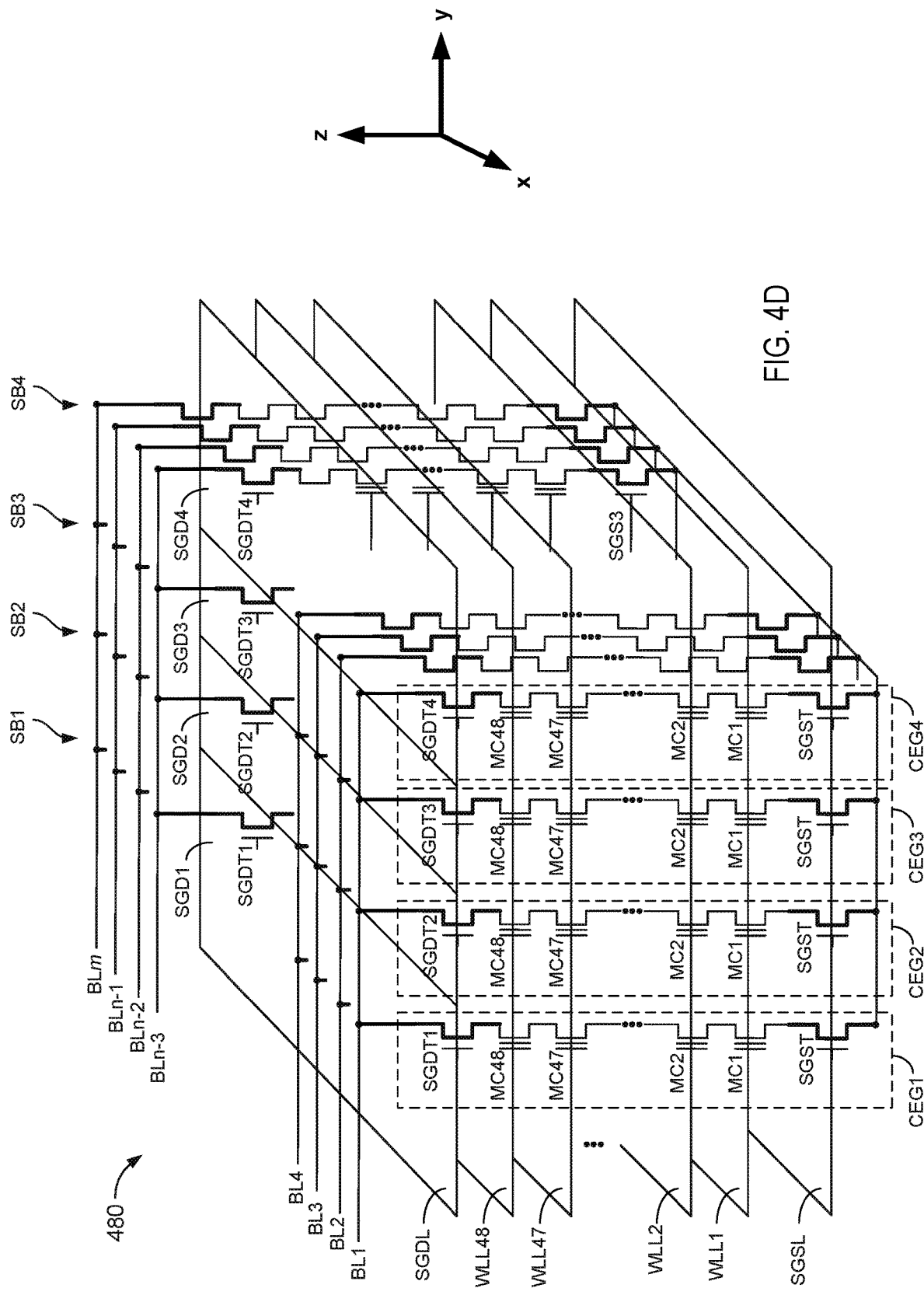
FIG. 4D is a circuit schematic diagram of a block of memory cells three-dimensionally arranged into a plurality of NAND strings.

FIG. 4D shows a circuit schematic diagram of an example configuration of a three-dimensional block 480, which may be representative of at least a portion of one of the blocks 400 of FIG. 4A and/or have the physical construction or structure as depicted in FIGS. 4B, 4C. In FIG. 4D, each bias element is represented or depicted as a transistor. In addition, memory cells are labeled MC, SGD transistors are labeled SGDT, and SGS transistors are labeled SGST. In the example block 480, each channel element group (e.g., CEG1) includes 50 cells, including 48 memory cells, extending from a first memory cell MC1 to a 48th memory cell MC48, one SGD transistor SGDT, and one SGS transistor SGST. Other channel element group configurations are possible, including those that include one or more source-side dummy cells, one or more drain-side dummy cells, more than one SGD transistor, and/or more than one SGS transistor, as previously described.

In accordance with the channel element group configuration in FIG. 4B, the block 480 includes 50 control gate layers, including 48 word line layers extending from a first word line layer WLL1 to a 48th word line layer WLL48, a SGD layer SGDL, and a SGS layer SGSL. As previously described, the ith memory cells MCi in each channel element group are disposed in and configured to have their respective control gates biased by the ith word line layer WLLi of the control gate layers. As examples, first memory cells MC1 of the channel element groups CEG are disposed in and configured to have their control gates biased by the first word line layer WLL1, the second memory cells MC2 are disposed in and configured to have their control gates biased by the second word line layer WLL2, and the 48th memory cells MC48 of the channel element groups CEG are disposed in and configured to have their control gates biased by the 48th word line layer WLL48. In addition, the SGD transistors of the channel element groups are disposed in and configured to have their respective control gates biased by the SGD layer SGDL, and the SGS transistors of the channel element groups are disposed in and configured to have their respective control gates biased by the SGS layer SGSL.

As depicted in FIG. 4D, the channel element groups CEG and their associated channels are two-dimensionally arranged in the x and y directions in the block 480, and electrically connected to an m-number of bit lines. In particular example configurations, the channel element groups CEG and their associated channels are two-dimensionally arranged in accordance with a channel arrangement that depends on a P-number of channel element groups and their associated channels that are connected to a single bit line. Otherwise stated, each bit line BL is configured to electrically connect to, apply a respective bit line voltage to, and/or bias with a respective bit line (channel) voltage, a unique set of a P-number of channel element groups and their associated channels.

In the example configuration of FIG. 4D, each bit line BL is configured to electrically connected to four channel element groups (i.e., P=4). Accordingly, FIG. 4D shows the first bit line BL1 electrically connected to each of a first channel element group CEG1, a second channel element group CEG2, a third channel element group CEG3, and a fourth channel element group CEG4. Each of the other two through mth bit lines BL2 to BLm are also electrically connected to a respective set of four channel element groups and their respective channels. Numbers for P other than four may be possible for various other configurations.

In some example configurations, an SGD layer may be separated or divided into a plurality of different drain select gate (SGD) sub-layers that are electrically isolated or disconnected from each other. For example, an SGD layer may be etched to remove portions of the metal forming the SGD layer in order to form a plurality of electrically isolated or disconnected SGD sub-layers.

Different SGD sub-layers of the same SGD layer may be independently and/or individually biased and/or supplied with a different one of a plurality of SGD line voltages. In turn, for a given plurality of SGD transistors disposed in the same SGD layer, each SGD sub-layer of the same SGD layer may be configured to bias the control gates of those SGD transistors disposed in its SGD sub-layer, but not the SGD transistors disposed in the other SGD sub-layers. In this way, the plurality of SGD sub-layers may be configured to independently or individually bias the different SGD transistors within their respective SGD sub-layers with a respective one of a plurality of SGD line voltages.

In addition, for example configurations that include multiple SGD layers, each SGD layer may include multiple SGD sub-layers. The number of SGD sub-layers in each SGD layer may be the same. In addition, certain combinations of SGD-sub-layers in different SGD layers may be electrically coupled together and/or supplied with the same SGD line voltage such that SGD transistors of the same channel element group have their control gates biased with the same SGD line voltage. SGD sub-layers that bias SGD transistors with the same SGD line voltage form part of the same SGD line.

As used herein, an SGD line is a conductive structure of a block that biases control gates of SGD transistors with a common or the same SGD line voltage. Accordingly, as used specifically herein for SGD layers and SGD lines, the terms "line" and "layer" are not used interchangeably. Instead, an SGD line is a single SGD sub-layer, or a collection of SGD sub-layers each part of a different SGD layer. In particular, for 3-D block configurations that include a single SGD layer, each SGD sub-layer of the SGD layer forms an entire SGD line. For 3-D block configurations that include multiple SGD layers, each SGD sub-layer forms a part of an SGD line with one or more other SGD sub-layers from one or more other SGD layers.

In addition, different SGD lines are configured to independently or separately bias different sets or groups of SGD transistors of a block with different SGD line voltages. An SGD line is configured to bias the control gates of those SGD transistors to which it is coupled or electrically connected, and not bias the control gates of those SGD transistors from which it is uncoupled or electrically disconnected. Accordingly, the SGD transistors SGDT of a block are arranged or formed into a plurality of SGDT groups. SGD transistors that are part of the same SGDT group are coupled to the same SGD line and configured to be biased by the same SGD line voltage. SGD transistors that are part of different SGDT groups are coupled to different SGD lines and configured to be biased by different SGD line voltages.

In addition, for at least some example configurations of a 3-D block, the number of SGD lines is equal to the P-number of channel element groups and associated channels that are connected to the same bit line. For example, with reference to FIG. 4D, the block 480 includes four SGD lines corresponding to the four channel element groups connected to a single bit line, including a first SGD line SGD1, a second SGD line SGD2, a third SGD line SGD3, and a fourth SGD line SGD4. Otherwise stated, the SGD layer SGDL includes four SGD lines SGD1, SGD2, SGD3, and SGD4.

In addition, the channel element groups may be arranged so that for a given set of channel element groups connected to the same bit line, each channel element group of the set has its SGD transistor SGDT coupled to a different one of the SGD lines. For example, in the block 480 of FIG. 4D, the set of four channel element groups CEG1, CEG2, CEG3, CEG4 connected to the first bit line BL1 have their respective SGD transistors connected to a different one the SGD lines SGD1, SGD2, SGD3, SGD4. In particular, the first channel element group CEG1 includes an SGD transistor SGDT1 coupled to and configured to have its control gate biased by the first SGD line SGD1, the second channel element group CEG2 includes an SGD transistor SGDT2 coupled to and configured to have its control gate biased by the second SGD line SGD2, the third channel element group CEG3 includes an SGD transistor SGDT3 coupled to and configured to have its control gate biased by the third SGD line SGD3, and the fourth channel element group CEG4 includes an SGD transistor SGDT4 coupled to and configured to have its control gate biased by the fourth SGD line SGD4.

A 3-D block may be arranged, organized, or divided into sub-blocks across the m-number of word lines based on the different SGD lines. As used herein, a sub-block is a portion of a block that has channel element groups with SGD transistors configured to be biased by the same SGD line and/or with the same SGD line voltage. A sub-block may span, such as in the x-direction, across the m-number of word lines of a block. In addition, channel element groups with SGD transistors configured to be biased by different SGD lines and/or with different SGD line voltages are part of different sub-blocks.

The number of sub-blocks of a block may be equal to the number of SGD lines. For example, the example block 480 of FIG. 4D includes four sub-blocks (SB) equal to the number of SGD lines, including a first sub-block SB1, a second sub-block SB2, a third sub-block SB3, and a fourth sub-block SB4. The first sub-block SB1 includes those channel element groups with SGD transistors SGD1 coupled to the first SGD line SGD1 and configured to be biased with a first SGD line voltage, the second sub-block SB2 includes those channel element groups with SGD cells SGD2 coupled to the second SGD line and configured to be biased with a second SGD line voltage, the third sub-block SB3 includes those channel element groups with SGD cells SGD3 coupled to the third SGD line and configured to be biased with a third SGD line voltage, and the fourth sub-block SB4 includes those channel element groups with SGD cells SGD4 coupled to the fourth SGD line and configured to be biased with a fourth SGD line voltage.

In addition, a block of memory cells (i.e., memory cells that are part of the same block), may be arranged, organized, separated, and/or labeled on a sub-block level, or on both a sub-block level and a word line level. A plurality of memory cells MC that are part of the same sub-block is referred to as a sub-block of memory cells. Otherwise stated, a sub-block of memory cells are memory cells of channel element groups having SGD cells coupled to the same SGD line and/or configured to be biased with the same SGD line voltage.

In addition, a plurality of memory cells that are part of the same sub-block, and that are also disposed in the same word line layer and/or that are configured to have their control gates biased by the same word line and/or with the same word line voltage are referred to as a word line cell group or a string of memory cells. Otherwise stated, a word line cell group (or string) of memory cells is a plurality or a collection of memory cells coupled to the same word line layer, and that are part of channel element groups configured to be biased with the same SGD line voltage.

A single word line layer may include a plurality of word line cell groups, such that the memory cells disposed in a single word line layer are organized, arranged, or disposed into a plurality of word line cell groups (or strings). Memory cells coupled to the same word line layer but that are part of channel element groups having SGD transistors coupled to different SGD lines are part of different word line cell groups. In particular example configurations, the number of word line cell groups coupled to a single word line layer is equal to the number of SGD lines of a block. In addition, the number of memory cells of a single word line cell group may be equal to the m-number of bit lines BL1 to BLm, such that each memory cell of a word line cell group is electrically connected to a different one of the m-number of bit lines BL1 to BLm.

In addition, the memory cells of a block, or of the memory cell structure 142 generally, are configured to store data as bits or binary digits, with each bit having either a logic 0 or a logic 1 binary value. A single memory cell may be configured to store either a single bit or a plurality of bits. A bit or bits that a single memory cell stores is referred to as a data value. Otherwise stated, a data value is an n-bit binary value that a single memory cell stores, where n is the number of bits of the binary value, and where the number n is one or more. The number of possible data values that a single memory cell can store depends on the n-number of bits it is configured to store. In particular, the number of possible data values a single memory cell can store is $2^n$.

Memory cells may be referred to as single-level cells or multi-level cells depending on the number of bits they are configured to store. A single-level cell, referred to as a SLC cell (or just SLC), is a memory cell configured to store a single or one bit of data. A multi-level cell, referred to as a MLC cell (or just MLC), is a memory cell configured to store multiple (i.e., two or more) bits of data. Example numbers of bits that an MLC cell can store include 2, 3, or 4, although MLC cells that store more than 4 bits may be possible.

In general, certain collections of memory cells are configured to store the same number of bits. For example, memory cells that are part of the same word line cell group, part of the same block, or part of the same memory cell structure 142, are configured to store the same number of bits. In this context, a given collection of memory cells (e.g., memory cells of the same word line cell group, the same block, the same memory cell structure, etc.) stores data on a bits-per-cell basis. Each memory cell of the given collection stores the same number of bits-per-cell.

In addition, a memory cell structure 142, including blocks and word line cell groups of the memory cell structure 142, may store data as pages. Herein, a page is a single unit of data that a single word line cell group of memory cells stores. The number of pages that a single word line cell group stores depends on the number of bits-per-cell that the memory cells of the single word line cell group are configured to store. As examples, a word line cell group of SLC cells is configured to store a single or one page of data; a word line cell group of MLC cells configured to store two-bits-per-cell is configured to store two pages of data; and a word line cell group of MLC cells configured to store three-bits-per-cell is configured to store three pages of data.

In addition, a memory cell structure 142 may store data according to one or more storage schemes. As used herein, a storage scheme is a general plan including a predefined set of actions and a predefined set of parameters that a memory system implements to store data. A given storage scheme for a particular collection of memory cells may identify or define the number of bits-per-cell that the memory cells of the particular collection are configured to store. The components of the memory system, including the circuit components on a given memory die, are configured to perform memory operations on the particular collection in accordance with the given storage scheme in order to program data into and/or read data from the particular collection of memory cells.

Memory cells of different memory technologies may store data in accordance with different storages schemes. In addition, memory cells of the same memory technology may store data in accordance with different storage schemes. For example, memory cells of the same memory technology but located in different memory systems, or in the same memory system but in different memory dies, or in different blocks or planes of the same memory die, or even different word line layers or different word line cell groups of the same block, may store data in accordance with different storage schemes, at least with respect to the number of bits-per-cell the different memory cells are configured to store.

At least for NAND memory technology, the NAND memory cells may be configured to store data in accordance with one of multiple different storage schemes, with each storage scheme associated or identifying a different number of bits-per-cell. In at least some example configurations, some NAND memory cells may store data according to one storage scheme while other NAND memory cells store data according to a different storage scheme. Accordingly, two different collections of NAND memory cells located in different memory systems, or in the same memory system but in different dies, planes, blocks, word line layers, or word line cell groups, may store different numbers of bits-per-cell according to different storage schemes. To illustrate, one collection of NAND memory cells may be configured as SLC cells and another collection of NAND memory cells may be configured as MLC cells.

In addition, the same memory cell (or the same collection of memory cells) may be configured to store different numbers of bits-per-cell according to different storage schemes at different times. To illustrate, in one example, a memory cell may be configured as an SLC cell at one point in time, and then reconfigured as an MLC cell at a later point in time. As another example, a memory cell may be configured as an MLC cell at one point in time, and then reconfigured as an SLC cell at a later point in time. As another example, a memory cell may be configured as an MLC cell storing a first number of bits-per-cell at one point in time, and then reconfigured as an MLC cell storing a second number of bits-per-cell at a later point in time, where the first and second numbers are different from each other, with the first number being either less than or greater than the second number.

In addition, a memory cell stores data by having an associated storage parameter (alternatively or otherwise referred to as a characteristic, property, or feature) set to a level, value, magnitude, or state. The associated parameter is adjustable or variable, and can be controlled by biasing the control lines coupled to the memory cells at certain levels, at certain times, during certain memory operations, and according to certain storage schemes. Within one storage scheme defining a set of data values, a memory cell can store data at a certain one of the data values by having its storage parameter set to a level, value, magnitude, or state, or within a predetermined range of levels, values, magnitudes, or states. The level, value, magnitude, or state that the memory cell is at or set to corresponds to the data value of the set that the memory cell is storing. In addition, the memory cell can be configured to store a different value, or to change the data value of the data it is storing from one data value to another data value, by changing or adjusting the storage parameter to a different level, value, magnitude, or state.

The storage parameter that a memory cell has to store data depends on the memory technology, and can vary across different memory technologies. For NAND technology, the storage parameter is threshold voltage. At least with respect to NAND memory cells, a threshold voltage of a memory cell is a voltage applied to a control gate of the memory cell at which the memory cell becomes conductive. The level (otherwise referred to as the value or magnitude) of the threshold voltage depends on or is proportional to the amount of electrical charge that the memory cell is storing or trapping. The more charge that a memory cell is storing, the higher its threshold voltage, and the less charge that a memory cell is storing, the lower its threshold voltage. Accordingly, the data value that the memory cell is storing is set by setting the threshold voltage of the memory cell to a certain level, and the data value is adjusted or changed by changing the threshold voltage to a different level or within a different range of levels.

In addition, for NAND technology, the memory cells store data by being configured in memory states. As used herein, a memory state is an identifier that identifies a data value of data that a memory cell is storing, can store, or is intended to store. A storage scheme identifies or defines an associated plurality or set of memory states at which a memory cell can be configured. Each memory state identifies, corresponds to, and/or is associated with one of the plurality of data values identified or defined by the storage scheme. Accordingly, a memory cell configured in a given memory state is storing a data value that corresponds to the given memory state. A memory cell can store a different data value by being configured into a different memory state.

For a given storage scheme, the memory states include an erased state and one or more program states. An erased state is a memory state in which a memory cell is configured when erased. For at least some example configurations, the erased state is the memory state that all of a collection of memory cells are in at the start of a program operation to program at least some of the memory cells of the collection. A program state is a memory state that a memory cell is in upon being subjected to a program operation. At a given point in time, a memory cell may be in the erased state or one of the program states.

In addition, for a given storage scheme, each memory state has, corresponds to, or is associated with an associated range of threshold voltage levels, with each range being bounded by an upper threshold voltage level and a lower threshold voltage level. Otherwise stated, a given storage scheme may define a plurality of non-overlapping threshold voltage ranges, with each range being associated with or corresponding to a respective one of the plurality of memory states defined or identified by the given storage scheme. In turn, each range has, corresponds to, or is associated with a respective one of the data values. In this way, a storage scheme establishes a one-to-one correspondence between the threshold voltage ranges, the memory states, and the data values. Memory cells are programmed and read according to the one-to-one correspondence. That is, a memory cell configured with a threshold voltage level within a given threshold voltage range is configured in the memory state associated with the given threshold voltage range, and in turn is storing data having a data value that is associated with the given threshold voltage range and the corresponding memory state.

For particular embodiments, the erased state is associated with the lowest threshold voltage range. The program states are associated with consecutively or sequentially higher threshold voltage ranges from the range associated with the erased state.

In addition, the storage schemes may label or name the memory states in any of various ways, including alphabetically, numerically, or alphanumerically, as non-limiting examples. In particular example configurations, the erased state is called the erased state, and the program states are named with letters, numbers, or a combination thereof by associating higher letters in the alphabet or higher numbers with higher threshold voltage ranges. As illustrations, a memory state C is associated with a higher threshold voltage range than a memory state A, and a memory state 8 is associated with a higher threshold voltage range than a memory state 1. Various ways of labeling or naming memory states are possible.

In addition, memory states may be referred to as being higher memory states and lower memory states relative to each other. A first memory state is a higher memory state than a second memory state where the first memory state is associated with a higher threshold voltage range than the threshold voltage range with which the second memory state is associated. In addition, a first memory state is a lower memory state than a second memory state where the first memory state is associated with a lower threshold voltage range than the threshold voltage range with which the second memory state is associated.

In addition, the way in which the data values correspond to the memory states and/or the threshold voltage ranges may vary, and in particular embodiments, how the data values correspond to or are assigned to the memory states and/or threshold voltage ranges may depend on a particular code scheme, such as the Gray code scheme, for example.

In implementation, a collection of memory cells programmed into the same memory state may have an associated collection of threshold voltage as a result of the programming. The threshold voltages may be represented as a threshold voltage probability distribution, or just threshold distribution of the number of memory cell in the collection as a function of threshold voltage.

A given storage scheme may have a model, reference, ideal, or target threshold voltage distribution, which may be in the form of a continuous probability distribution, such as a Gaussian distribution, for example, for each of the memory states and associated threshold voltage ranges defined by the given storage scheme. A model threshold voltage distribution may represent a model of an ideal threshold voltage distribution for a collection of memory cells programmed into the same memory state to have. The lower and upper tails of the model threshold voltage distributions may align or correspond to the upper and lower threshold voltage levels of the ranges with which each of the model threshold voltage distributions is associated.

Figure 5A:
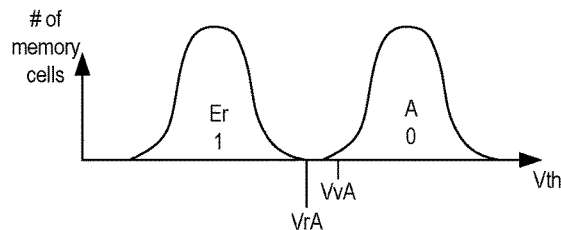
FIG. 5A is a plot of threshold voltage distribution curves for memory cells storing one bit of data per cell.
Figure 5B:
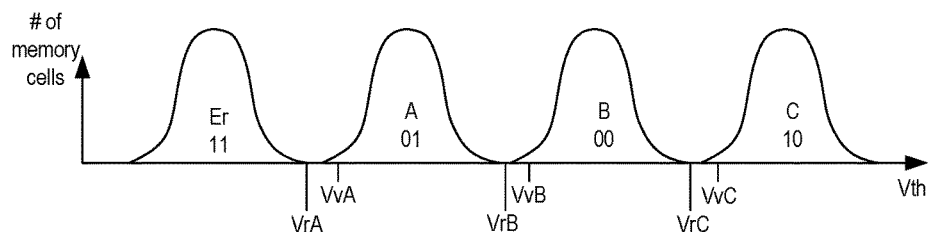
FIG. 5B is a plot of threshold voltage distribution curves for memory cells storing two bits of data per cell.
Figure 5C:
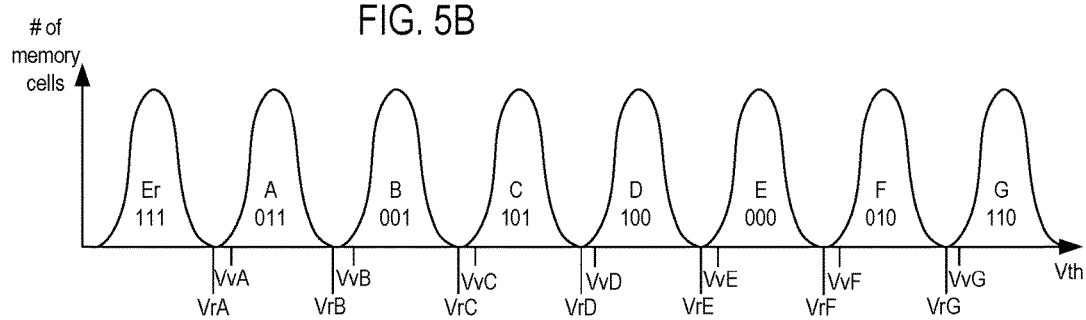
FIG. 5C is a plot of threshold voltage distribution curves for memory cells storing three bits of data per cell.
Figure 5D:
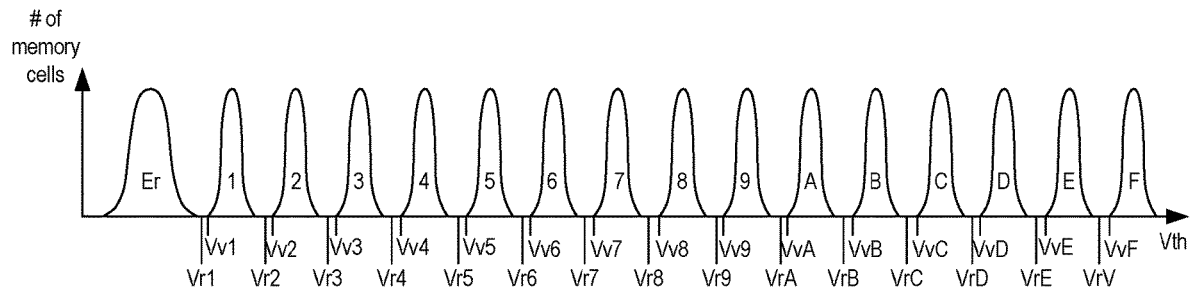
FIG. 5D is a plot of threshold voltage distribution curves for memory cells storing four bits of data per cell.

FIGS. 5A-5D are plots of threshold voltage distribution curves for different storage schemes for storing different numbers of bits into memory cells. The threshold voltage distribution curves are plotted for numbers of memory cells as a function of threshold voltage Vth. In addition, FIGS. 5A-5D show the memory state, the data value, and the threshold voltage range with which each threshold voltage distribution curve is associated. FIG. 5A shows threshold voltage distribution curves for an SLC storage scheme for storing one bit of data per memory cell. FIGS. 5B-5D show threshold voltage distribution curve for MLC storage schemes. In particular, FIG. 5B shows threshold voltage distribution curves for an MLC storage scheme for storing two bits of data per memory cell; FIG. 5C shows threshold voltage distribution curves for an MLC storage scheme for storing three bits of data per memory cell; and FIG. 5D shows voltage distribution curves for an MLC storage scheme for storing four bits of data per memory cell. Similar threshold voltage distribution curves may be defined or generated for other storage schemes used for storing numbers of bits other than (such as more than) two, three, or four bits-per-cell.

With reference to FIG. 5A, for memory cells configured to store one bit of data, each of the memory cells may be configured in an erase state Er or a program state A. With reference to FIG. 5B, for memory cells configured to store two bits of data, each of the memory cells may be configured in an erase state Er or one of three program states A, B, C. With reference to FIG. 5C, for memory cells configured to store three bits, each of the memory cells may be configured in an erase state Er or one of seven program states A, B, C, D, E, F, G. With reference to FIG. 5D, for memory cells configured to store four bits, each of the memory cell may be configured in an erase state Er or one of fifteen program states 1, 2, 3, 4, 5, 6, 7, 8, 9, A, B, C, D, E, F. As shown in FIGS. 5A-5D, each voltage distribution curve is associated with the erase state or one of the program states. Also, herein, the terms "memory state" and "program state" are used interchangeably. For example, the terms "memory state A" and "program state A" are used interchangeably to refer to the same memory state.

In addition, in FIGS. 5A-5D, the associated memory state and data value is included within or under each of the threshold voltage distribution curves. For example, FIG. 5A shows the left threshold voltage distribution curve as being associated with the erased state Er and a logic 1 value, and the right threshold voltage distribution curve as being associated with memory state A and a logic 0 value. For the example MLC storage schemes depicted in FIGS. 5B-5D, the data values sequentially change with increasing memory states and threshold voltage ranges according to a Gray code scheme. For example, with reference to FIG. 5B, memory cells configured in the erase state Er store data value "11"; memory cells configured in memory state A store data value "01"; memory cells configured in memory state B store data value "00"; and memory cells configured in memory state B store data value "10." Similar relationships or correspondences between data values, memory states, and threshold voltage ranges can be made for memory cells programmed to store three bits (FIG. 5C), four bits (FIG. 5D), or more than four numbers of bits-per-cell.

In addition, as illustrated in FIGS. 5A-5D, each program state is associated with a respective verify voltage pulse level (or just verify pulse level) Vv and a read voltage pulse level (or just read pulse level) Vr. For example, with respect to the storage schemes of FIGS. 5A-5D, a verify pulse level VvA and a read pulse level VrA are associated with memory state A, verify pulse level VvB and read pulse level VrB are associated with memory state B, and verify pulse level VvC and read pulse level VrC are associated with memory state C. Similar verify and read pulse levels Vv, Vr are associated with other memory states, such as memory states D-G and memory states 1-9, as depicted in FIGS. 5C and 5D.

As shown in FIGS. 5A-5D, the verify and read pulse levels Vv, Vr specify or are positioned relative to lower bounds or tails of the threshold voltage distribution curves. As described in further detail below, the verify pulse levels Vv may be used to set levels of selected word line voltages during program operations in order to verify program statuses of the memory cells, and the read pulse levels Vr may be used to set levels of selected word line voltages during read operations in order to read data from the memory cells.

Referring back to FIG. 2B, the memory die 104 may further include a read/write circuit 144 that includes a plurality or a p-number of sense blocks (also referred to as sense modules or sense systems) 146. As described in further detail below, the sense blocks 146 are configured to participate in reading data from or programming data into word line cell groups of memory cells in parallel.

The memory die 104 may also include a row address decoder (or just row decoder) 148 and a column address decoder (or just column decoder) 150. The row decoder 148, which may also be referred to as a word line decoder, an x decoder, or an x-wire decoder, may decode a row address (also referred to as a word line address or an x address), and select a particular word line in the memory cell structure 142 corresponding to and/or identified by the decoded row address when reading data from or programming/writing data into to the memory cell structure 142. The column decoder 150, which may also be referred to as a bit line decoder, a y decoder, or a y-wire decoder, may decode a column address (also referred to as a bit line address or a y address), and select a particular bit line or group of bit lines in the memory cell structure 142 corresponding to and/or identified by the column address, when reading data from or programming data to the memory cell structure 142.

In addition, the non-volatile memory die 104 may include a peripheral circuit 152. The peripheral circuit 152 may include a control logic circuit (also referred to as a control logic, an on-chip controller, or an on-die controller) 154, which, at least in some example embodiments, may be implemented as a state machine, that is configured to control on-chip memory operations as well as send status information to the controller 102. The peripheral circuit 152 may also include an on-chip address decoder 156 that provides an address interface between addressing used by the controller 102 and/or a host and the addressing used by the row and column decoders 148, 150. In addition, the peripheral circuit 152 may include volatile memory 158. An example configuration of the volatile memory 158 may include latches, although other configurations are possible.

In addition, the peripheral circuit 152 may include a power control circuit 160 that is configured to generate and supply control line voltages (including voltage pulses) to control lines of the memory cell structure 142. The control line voltages include control gate line voltages supplied to control gate layers, bit line voltages supplied to bit lines, and supply line voltages supplied to supply lines. The control gate line voltages include word line voltages supplied to the word lines, drain select gate line voltages (SGD line voltages) supplied to the SGD lines, and source select gate line voltages (SGS line voltages) supplied to the SGS lines. The power control circuit 160 also be configured to generate and/or supply voltages other than the control lines voltages, including other voltages that may be supplied to the memory cell structure 142, the read/write circuits 144, the sense blocks 146, and/or other circuit components on the memory die 104.

The power control circuit 160 may include any of various circuit topologies or circuit configurations to generate and/or supply the voltages at appropriate levels to perform memory operations, (including read, program/write, sense, and erase operations), such as driver circuits, current sources, charge pumps, reference voltage generators, regulators, and pulse generation circuits, or any of various combinations thereof. Other types of circuits to generate the voltages may be possible. In addition, the power control circuit 160 may communicate with and/or be controlled by the control logic circuit 154, the read/write circuits 144, and/or the sense blocks 146 in order to supply the voltages at appropriate levels and at appropriate times to carry out the memory operations.

Figure 6:
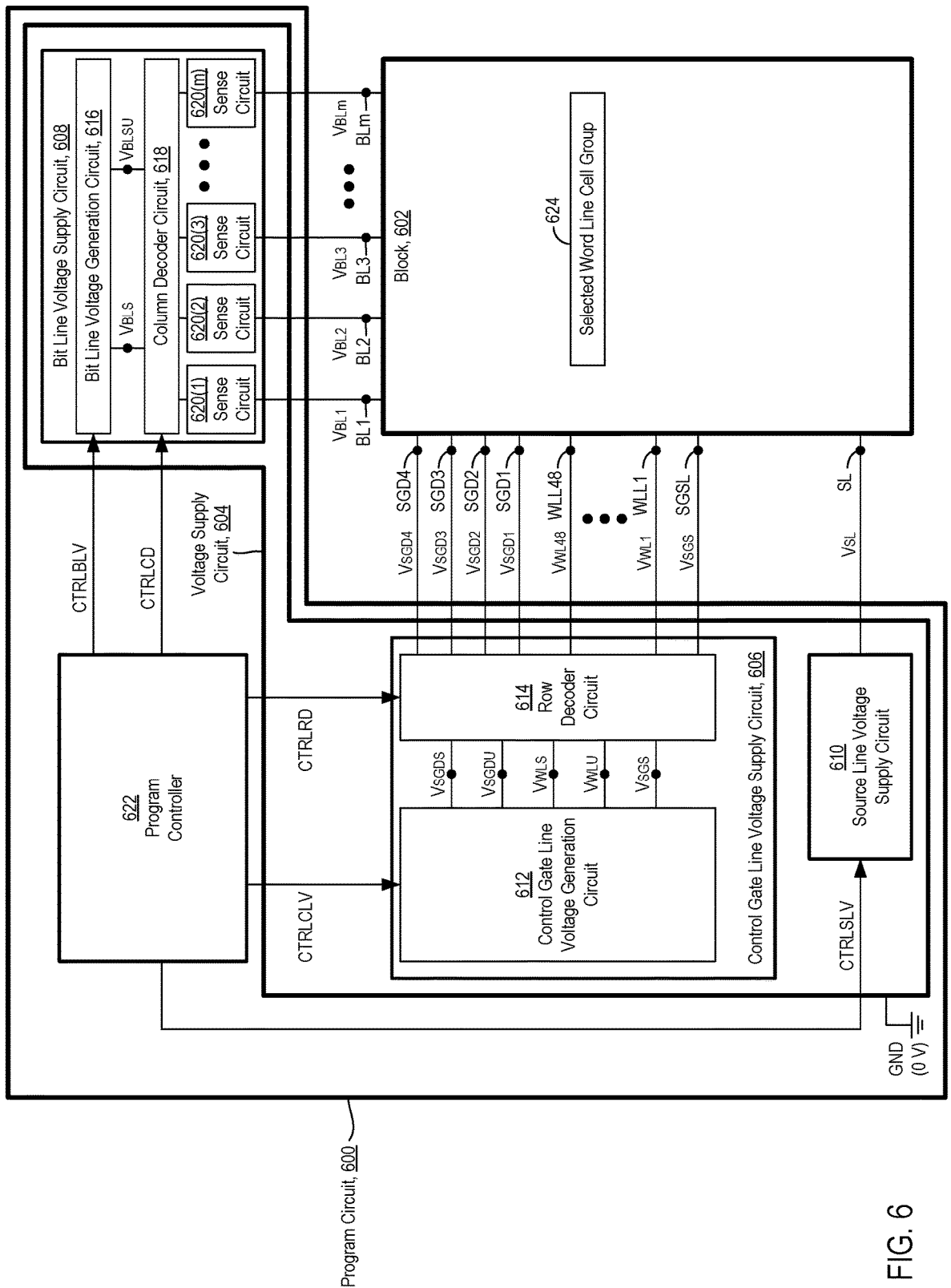
FIG. 6 is a block diagram of an example program circuit of the memory die of FIG. 2B configured to program data into blocks.

FIG. 6 is a block diagram of an example program circuit 600 configured to perform program operations to program (write) data into a block 602. As used herein, a program circuit is a circuit, or a collection of circuits or circuit components, that programs or writes data into memory cells. In addition, for at least some example embodiments, a program circuit can verify the program status of memory cells that it programs. In particular example embodiments, a program circuit is located on the same memory die as the memory cells that it programs and/or verifies. Also, as used herein, a program operation (otherwise referred to as a write operation) is a sequence of steps that a program circuit performs to change an electrical and/or magnetic characteristic of memory cells such that the changed electrical and/or magnetic characteristic of one or more memory cells represents one or more data values.

The block 602 may be a block of the memory cell structure 142 of FIG. 2B, one of the blocks BLK in FIG. 3A, 3B, or 4A, have the physical construction or structure of the block 410 in FIGS. 4B, 4C, and/or have the circuit configuration of the block 480 in FIG. 4D. The block 602 includes a plurality of control lines, including a plurality of control gate line layers (or just control gate lines), a plurality of bit lines BL, and a source line SL. Corresponding to the block 480 of FIG. 4D, the block 602 includes an m-number of bit lines BL1 to BLm, and the control gate layers include four SGD lines SGD1, SGD2, SGD3, SGD4; forty-eight word line layers (or just word lines) WLL1 to WLL48; and an SGS line/layer SGSL.

The bit lines BL are configured to generate bit line voltages or channel voltages $V_{BL}$ (also or alternatively referred to as drain voltages, drain-side channel voltages, or drain-side voltages) and apply the bit line voltages (or channel voltages) $V_{BL}$ to channels and associated channel element groups of the block 602. In particular example configurations, the bit line or channel voltages VBL are drain-side channel (or just drain-side) voltages that the bit lines BL apply to the drain ends of the channels. Each bit line BL is configured to generate a respective bit line (or channel) voltage and apply the respective bit line voltage to an associated set of channels and associated channel element groups. As examples, a first bit line BL1 is configured to generate a first bit line voltage $V_{BL1}$ and apply the first bit line voltage $V_{BL1}$ to a first set of channels and associated channel element groups; a second bit line BL2 is configured to generate a second bit line voltage $V_{BL2}$ and apply the second bit line voltage $V_{BL2}$ to a second set of channels and associated channel element groups; a third bit line BL3 is configured to generate a third bit line voltage VBL3 and apply the third bit line voltage VBL3 to a third set of channels and associated channel element groups; and an mth bit line BLm is configured to generate an mth bit line voltage $V_{BLm}$ and apply the mth bit line voltage $V_{BLm}$ to an mth set of channels and associated channel element groups. The other bit lines BL4 to BL(m−1) not shown in FIG. 6 are similarly configured to generate respective bit line voltages and apply their respective bit line voltages to associated sets of channels and channel element groups.

In addition, the control gate lines are configured to generate control gate voltages and apply the control gate voltages to control gates of the bias elements to which the control gate lines are respectively coupled. As examples, a first SGD line SGD1 is configured to generate a first SGD line voltage $V_{SGD1}$ and apply the first SGD line voltage $V_{SGD1}$ to control gates of SGD transistors coupled to the first SGD line SGD1; a second SGD line SGD2 is configured to generate a second SGD line voltage $V_{SGD1}$ and apply the second SGD line voltage $V_{SGD1}$ to control gates of SGD transistors coupled to the second SGD line SGD2; a third SGD line SGD3 is configured to generate a third SGD line voltage $V_{SGD1}$ and apply the third SGD line voltage $V_{SGD1}$ to control gates of SGD transistors coupled to the third SGD line SGD3; and a fourth SGD line SGD4 is configured to generate a fourth SGD line voltage $V_{SGD4}$ and apply the fourth SGD line voltage $V_{SGD4}$ to control gates of SGD transistors coupled to the fourth SGD line SGD4. In addition, a first word line WLL1 is configured to generate a first word line voltage $V_{WL1}$ and apply the first word line voltage $V_{WL1}$ to control gates of memory cells coupled to the first word line WLL1; and a forty-eighth word line WLL48 is configured to generate a forty-eighth word line voltage $V_{WL48}$ and apply the forty-eighth word line voltage $V_{WL48}$ to control gates of memory cells coupled to the forty-eighth word line WLL48. The other word lines WLL2 to WLL47 not shown in FIG. 6 are similarly configured to generate respective word line voltages and apply their respective word line voltages to memory cells to which the word lines are coupled. In addition, the SGS line SGSL is configured to generate an SGS line voltage $V_{SGS}$ and apply the SGS line voltage $V_{SGS}$ to SGS transistors coupled to the SGS line SGSL. Also, as shown in FIG. 6, the source line SL is configured to generate a source line voltage $V_{SL}$ and apply the source line voltage $V_{SL}$ to source ends of channels and associated channel element groups to which the source line SL is coupled.

The program circuit 600 performs program operations to program data into selected memory cells. As used herein, a selected memory cell of a program operation is a memory cell that is programmed during the program operation. In addition or alternatively, a selected memory cell of a program operation is a memory cell that changes its memory state from an initial memory state to a target memory state during the program operation. An initial memory state of a selected memory cell is the memory state of the memory cell at the start of the program operation. A target memory state is the memory state that the memory cell is to be in at the end of the program operation in order for data to be correctly stored in the memory cell. For at least some program operations, the initial memory state for a selected memory cell is the erase state. For such program operations, a selected memory cell is a memory cell that changes its memory state from the erase state to a program state. In addition or alternatively, a selected memory cell of a program operation is a memory cell that changes a level, value, or state of a storage parameter in order to change its memory state from an initial memory state to a target memory state.

At least for NAND technology, a selected memory cell of a program operation is a memory cell that changes a level of its threshold voltage from an initial threshold voltage level to a target threshold voltage level in order to change its memory state from an initial memory state to a target memory state during the program operation. An initial threshold voltage level of a selected memory cell is the threshold voltage level of the target memory cell at the start of a program operation, and is a threshold voltage level that is within a range of threshold voltage levels that corresponds to the initial memory state of the selected memory cell. A target threshold voltage level of a selected memory cell is a threshold voltage level that is within a range of threshold voltage levels that corresponds to the target memory state of the selected memory cell. In addition, at least for NAND technology, a selected memory cell of a program operation is a memory cell that changes its threshold voltage level from an initial threshold voltage level to a target threshold voltage level in response to at least one program voltage pulse (or just program pulse) during the program operation. Program pulses generated during a program operation are described in further detail below.

In addition, memory cells that are not the subject of a program operation are referred to as unselected memory cells. Otherwise stated, an unselected memory cell of a program operation is a memory cell that is not programmed during a program operation. An unselected memory cell may be a memory cell that stays or remains in its initial memory state throughout the duration of the program operation.

In particular example embodiments, the program circuit 600 confines a program operation to a particular region or portion of the memory cell structure 142. For such embodiments, the selected memory cells include a first portion or first group of the particular region, and the unselected memory cells include a second portion or second group of the particular region.

At least for NAND technology, the program circuit 600 confines a program operation to a block. The selected memory cells of a program operation are part of a first set or group of the memory cells of the block, and the unselected memory cells are part of a second set or group of the memory cells of the block, namely those memory cells that are not the selected memory cells. In particular example embodiments, the selected memory cells of a program operation are disposed in the same word line (or word line layer) and/or are configured to be biased by the same word line (or word line layer). In further particular embodiments, the selected memory cells of a program operation include only those memory cells that are part of the same or a single word line cell group.

The program circuit 600 may perform a program operation over one or more program cycles. A program cycle, otherwise referred to as a program loop or a program iteration, is at least a portion of a program operation during which a program circuit performs a discrete set of program actions to move the memory states of selected memory cells into their respective target memory states. As described in further detail below, the discrete set of program actions may include applying a discrete set of biases, such voltages, to control lines of the block 602 in order to change the levels, magnitudes, values, or states of the storage parameters of at least some of the selected memory cells. One of the discrete set of program actions includes applying a program pulse to a selected word line.

In the event that the program circuit 600 is unable to program all of the selected memory cells in a single program cycle with a single discrete set of program actions, the program circuit 600 may perform a plurality of program cycles, such as sequentially or consecutively, until the selected memory cells are programmed in their respective target memory states. Where the program circuit 600 performs a plurality of program cycles to program the selected memory cells into their respective target memory states, the program circuit 600 may perform a plurality of sets of discrete program actions, each in a different one of the plurality of program cycles.

At any given moment in time during a program operation, a selected memory cell can have an associated program status, which can be one of three different program statuses, including a sufficiently programmed status, an insufficiently programmed status, and an over-programmed status. A selected memory cell that has a sufficiently programmed status is a sufficiently programmed memory cell, which is a memory cell that is in or has reached its target memory state. A selected memory cell that has an insufficiently programmed status is an insufficiently programmed memory cell, which is a memory cell that has not yet reached its target memory state. A selected memory cell that has an over-programmed status is an over-programmed memory cell, which is a memory cell that is not in its target memory state, and that cannot be moved into its target memory state through further performance of one or more discrete sets of program actions. A selected memory cell can be over-programmed in situations where it is in its target memory state at the start of a program stage, but is program-enabled instead of program-inhibited, and thus responds to the discrete set of program actions during the program stage. In other situations, a selected memory cell can be over-programmed where the selected memory cell is insufficiently programmed at the start of a program stage, but the discrete set of program actions performed during the program stage changes the storage parameter of the selected memory cell too much such that performance of additional discrete sets of program actions cannot move the storage parameter of the selected memory cell to a level corresponding to the target memory state.

After the program circuit 600 performs a program cycle, the program circuit 600 determines whether all of the selected memory cells are sufficiently programmed. If all of the selected memory cells are sufficiently programmed, then the program circuit 600 ends the program operation. Alternatively, if at least one of the selected memory cells is insufficiently programmed, then the program circuit 600 performs a next program cycle. The program circuit 600 may iterate through the program cycles until the program circuit 600 determines that all of the selected memory cells are sufficiently programmed, or the program circuit 600 identifies that a timeout event has occurred, which causes the program circuit 600 to end the program operation. In one example configuration, the timeout event is a number of program cycles reaching a predetermined maximum number of program cycles. Other timeout events may be possible.

In addition, the program circuit 600 is configured to perform the discrete set of program actions in or during program stages of the program cycles. As used herein, a program stage is at least a portion of a program cycle during which a program circuit performs a discrete set of program actions to move at least some selected memory cells into their target memory states.

During a program stage, the program circuit 600 may configure each of the selected memory cells in one of two program bias states, including a program-enable state and a program-inhibit state. The program-enable and program-inhibit states are referred to as bias states in that different biases, such as in the form of voltages having different levels, are applied to bit lines and SGD transistors in order to configure each of the selected memory cells in the program-enable state or the program-inhibit state.

The program-enable state is a program bias state that enables or allows a selected memory cell to respond to a discrete set of program actions by changing a storage parameter associated with the memory states into which the selected memory cell can be programmed. When a selected memory cell is configured in the program-enable state, the program-enabled selected memory cell (which can just be referred to as a program-enabled memory cell), is enabled or allowed to change a level or value of its storage parameter in response to the discrete set of actions.

When the program-enabled memory cell changes its storage parameter in response to a discrete set of program actions during a program stage, the change in the storage parameter may or may not change a present memory state that the memory cell is in at the start of the program stage. That is, in response to a discrete set of program actions, the program-enabled memory cell may stay in the same memory state or change to a new memory state.

As previously described, for NAND technology, the storage parameter of a memory cell is its threshold voltage. When a selected memory cell is configured in the program-enable state, the program-enabled memory cell may respond to a discrete set of program actions by increasing the level of its threshold voltage. The increase in the threshold voltage may keep the selected memory cell in its current memory state or may move the selected memory cell into a new memory state.

The program-inhibit state is a program bias state that inhibits or prevents a selected memory cell from responding to a discrete set of program actions. When a selected memory is configured in the program-inhibit state, the program-inhibited selected memory cell (which can just be referred to as a program-inhibited memory cell), is prevented or inhibited from, or unable to, change a level of its storage parameter when the program circuit 600 performs a discrete set of program actions. Otherwise stated, when the program circuit 600 performs a discrete set of program actions during a program stage, the program-inhibited memory cell keeps a current value or level of its storage parameter unchanged, and in turn, stays in the same memory state. In addition or alternatively to being referred to as a program-inhibited memory cell, a selected memory cell configured in the program-inhibit state may be referred to as a locked-out memory cell in that it is locked out from being programmed during a program stage.

At the start of a program stage, the program circuit 600 may configure each of the selected memory cells in the program-enable state or the program-inhibit state. At the start of a program stage, if a selected memory cell is sufficiently programmed—i.e., it is in or has reached its target memory state—then the program circuit 600 configures the selected memory cell in the program-inhibit state so that the selected memory cell does not change its memory state during the program stage. On the other hand, if a selected memory cell is insufficiently programmed—i.e., it is not yet at or has not yet reached its target memory state—then the program circuit 600 configures the selected memory cell in the program-enable state so that the program-enabled memory cell changes a level of its storage parameter to either move into or at least move closer to its target memory state.

A program cycle may be one of various types. One type of program cycle is a program-only cycle. A program-only cycle is a program cycle performed to only program selected memory cells. A program-only cycle excludes a verification step that would confirm that a memory cell is sufficiently programmed to a target memory state. In addition, a program-only cycle only includes program stages. After the program circuit 600 performs a program stage, the program circuit 600 either ends the program operation, or starts performing a next or another program stage of a next or another program cycle without making any express checks or verifications of program statuses of selected memory cells. For program-only cycles, the program circuit 600 makes implicit determinations or presumptions of whether a selected memory cell is sufficiently or insufficiently programmed. For example, the program circuit 600 may perform a predetermined number of one or more program stages and/or a predetermined number of one or more program-only cycles, and presume that the selected memory cells are sufficiently programmed after performing the predetermined number of program stages or program-only cycles.

Figure 7A:
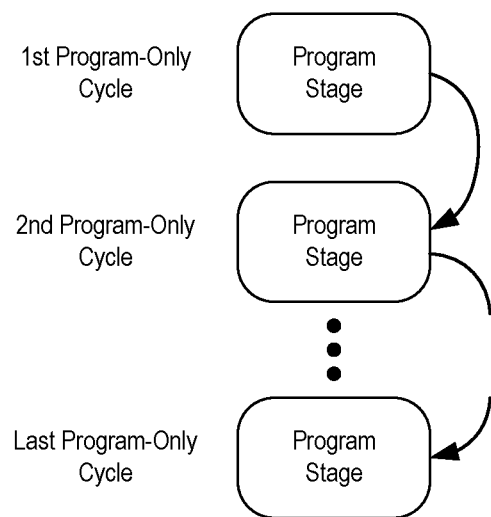
FIG. 7A is a schematic diagram of a program operation performed with program-only cycles.

FIG. 7A shows a schematic diagram of a program operation performed with program-only cycles. After performing a first program stage of a first program-only cycle, the program circuit 600 may proceed directly to performing a next program stage in a second program-only cycle. The program circuit 600 may continue to perform program stages in consecutive program-only cycles in this manner until the program circuit 600 performs a last program stage in a last program-only cycle, after which the program circuit 600 may end the program operation.

Another type of program cycle is a program-verify cycle. A program-verify cycle is a program cycle performed to both program selected memory cells and check or verify program statuses of the selected memory cells being programmed. When the program circuit 600 performs program-verify cycles, the program circuit 600 makes express determinations of the program statuses of the selected memory cells in the form of verify operations. A verify operation is a memory operation performed to check or verify program statuses of selected memory cells. When performed in conjunction with or as part of a program operation, the verify operation may be considered a sub-operation of the program operation.

In particular implementations, the program circuit 600 performs a single verify operation in one program-verify cycle. During a program-verify cycle, after performing a program stage, the program circuit 600 performs a verify operation to check or verify whether the selected memory cells are sufficiently programmed before moving on to a next program-verify cycle.

Herein, the phrase "verify a memory cell" is used refer to an action or collection of actions that determine a program status of the memory cell, and in particular, whether the memory cell is sufficiently programmed or insufficiently programmed. Also, as used herein, the term "last program stage" when referenced in relation to a particular verify operation, is used to refer to the program stage performed in the same program-verify cycle as the particular verify operation, or the program stage that is performed immediately prior to the particular verify operation. In addition, the term "following verify operation" is used to refer to the verify operation of a given program-verify cycle that is performed immediately after the last program stage of the program-verify cycle.

For some example configurations, for a given program-verify cycle, the program circuit 600 verifies all of the selected memory cells during the verify operation of the given program-verify cycle. For other example configurations, for a given program-verify cycle, the program circuit 600 verifies, during the following verify operation, only those selected memory cells that were program-enabled during the last program stage. Since selected memory cells that were program-inhibited during the last program stage are considered to be sufficiently programmed, the program circuit 600 may not need to verify their program statuses, and thus not subject them to the following verify operation. A verify operation consumes power, and so not subjecting certain selected memory cells already determined to be sufficiently programmed may save power.

During a verify operation, the program circuit 600 may configure the selected memory cells in one of two verify bias states, including a verify-enable state and a verify-inhibit state. A verify-enable state is a bias state that enables or allows a selected memory cell to be verified—i.e., enables or allows a program status of the selected memory cell to be determined. When the program circuit 600 configures a selected memory cell in the verify-enable state, the verify-enabled selected memory cell (which can just be referred to as a verify-enabled memory cell) is able or allowed to be verified. A verify-inhibit state is a bias state that prevents or inhibits a selected memory cell from being verified—i.e., prevents or inhibits a program status of the selected memory cell from being determined. When the program circuit 600 configures a selected memory cell in the verify-inhibit state, the verify-inhibited selected memory cell (which can just be referred to as a verify-inhibited memory cell) is prevented or inhibited from being verified. Like the program-enable and program-inhibit states, the verify-enable and verify-inhibit states are referred to as bias states in that the program circuit 600 applies different biases, such as in the form of voltages having different levels, to bit lines and SGD lines in order to configure each of the selected memory cells in the verify-enable state or the verify-inhibit state. In addition or alternatively to being referred to as a verify-inhibited memory cell, a selected memory cell configured in the verify-inhibit state may be referred to as a locked-out memory cell in that it is locked out from being verified during a verify operation.

When performing a verify operation within or as part of a program-verify cycle, the program circuit 600 may separate or divide the verify operation into discrete verify stages. A verify stage is at least a portion of a verify operation during which the program circuit 600 performs a discrete set of verify actions to verify selected memory cells that have the same target memory state. As described in further detail below, the discrete set of verify actions may include applying a discrete set of biases, such as voltages, to the control lines of the block in order to verify the selected memory cells having the same target memory state. The discrete set of verify actions may also include performing sense operations to sense program statuses of the selected memory cells having the same target memory state. For a given program-verify cycle, the program circuit 600 verifies selected memory cells that have the same target memory state in the same verify stage, and verifies selected memory cells that have different target memory states in different verify stages.

By dividing or separating a verify operation into different verify stages, the program circuit 600 associates each verify stage with a different one of the plurality of memory states that the selected memory cells can have. The memory state associated with a given verify stage is referred to as the associated memory state of the given verify stage.

For a given verify stage with an associated memory state, the program circuit 600 verifies those selected memory cells that have target memory states that match or that are the same as the associated memory state of the given verify stage. In addition, the program circuit 600 may not verify those selected memory cells that have target memory states that do not match or that are different from the associated memory state of the given verify stage, and instead verifies those selected memory cells during one or more other verify stages of the verify operation.

A selected memory cell that has a target memory state that matches or is the same as an associated memory state of a given verify stage is referred to as a matched memory cell of the given verify stage. In addition, a selected memory cell that has a target memory state that does not match or that is different from the associated memory state of the given verify stage is referred to as unmatched memory cell of the given verify stage. Among the selected memory cells of a program operation, each of the selected memory cells is a matched memory cell for one of the verify stages, and is an unmatched memory cell for the other verify stages. So that the program circuit 600 verifies only matched memory cells during a given verify stage, the program circuit 600 configures matched memory cells in the verify-enable state while configuring unmatched memory cells in the verify-inhibit state during the given verify stage.

To perform a verify operation, the program circuit 600 performs or executes the verify stages sequentially in a predetermined verify order. The verify order may be an order of memory states, such as memory state A, memory state B, memory state C, and so on. Where a given memory state is positioned in the verify order determines when the program circuit 600 performs a given verify stage associated with the given memory state relative to when the program circuit 600 performs the other verify stages. For example, if memory state A is the first memory state in the verify order, the verify stage associated with memory state A is the first verify stage that the program circuit 600 performs in the verify operation.

For a verify operation that includes a plurality of verify stages, the program circuit 600 sequentially performs or executes the verify operation by sequentially transitioning from one verify stage to another verify stage according to the verify order. When the program circuit 600 ends a current verify stage, the program circuit 600 identifies a next verify stage in the verify order as the current verify stage, and begins performing the new current verify stage. The program circuit 600 sequentially performs the verify stages in this manner until a last verify stage in the verify order is performed.

As the program circuit 600 transitions from a current verify stage associated with a first memory state to a next verify stage associated with a second memory state according to the verify order, those selected memory cells that were matched memory cells in the current verify stage transition to unmatched memory cells in the next verify stage. Accordingly, the program circuit 600 changes those memory cells from being configured in the verify-enable state to the verify-inhibit state. In addition, those selected memory cells that were unmatched memory cells in the current verify stage but now have target memory states that match the second memory state of the next verify stage transition to matched memory cells. Accordingly, the program circuit 600 changes those memory cells from being configured in the verify-inhibit state to the verify-enable state. Also, those selected memory cells that were unmatched memory cells in the current verify stage and still have target memory states that do not match the second memory state in the next verify stage stay as unmatched memory cells. Accordingly, the program circuit 600 keeps those memory cells configured in the verify-inhibit state.

In addition, for some example configurations, the transitioning between matched and unmatched memory cells during a verify operation pertains to only those selected memory cells that were program-enabled during the last program stage. For those selected memory cells that were program-inhibited during the last program stage, the program circuit 600 may keep them configured in the verify-inhibit state throughout the duration of the verify operation, regardless of whether their respective target memory states match an associated memory state of a given verify stage. For other example configurations, the transitioning between matched and unmatched memory cells during a verify operation pertains also to selected memory cells that were not program-enabled—i.e., that were program-inhibited—during the last program stage. That is, for these other example configurations, even if a selected memory cell is configured in the program-inhibit state during the last program stage, the program circuit 600 configures the selected memory cell in the verify-enable state for a given verify stage if the selected memory cell is a matched memory cell for the given verify stage.

In addition, for at least some example configurations, the program circuit 600 may not perform all of the verify stages for every program-verify cycle. Which verify stages are performed can change from cycle to cycle. One way that the verify stages can change is by completing programming for a given target memory state. If those selected memory cells having the same target memory state are all sufficiently programmed, the program circuit 600 configures them all in the verify-inhibit state for the remainder of the verify operations, and skips the verify stage associated with that target memory state for the remainder of the verify operations. Another way that the verify stages can change is by reaching predetermined threshold numbers of program-verify cycles. In some example configurations, it may be impossible or at least statistically unlikely that the program circuit 600 can sufficiently program a selected memory cell before the program circuit 600 performs a predetermined number of discrete program actions. To save time, the program circuit 600 may skip or omit a verify stage associated with the certain target memory cell from earlier verify operations of the program operation. For example, an initial predetermined number of program-verify cycles may have verify orders that exclude one or more certain verify stages. Then, after the program circuit 600 performs a predetermined or threshold number of program-verify cycles, the program circuit 600 may add the one or more certain verify stages to verify orders of subsequent program-verify cycles.

Figure 7B:
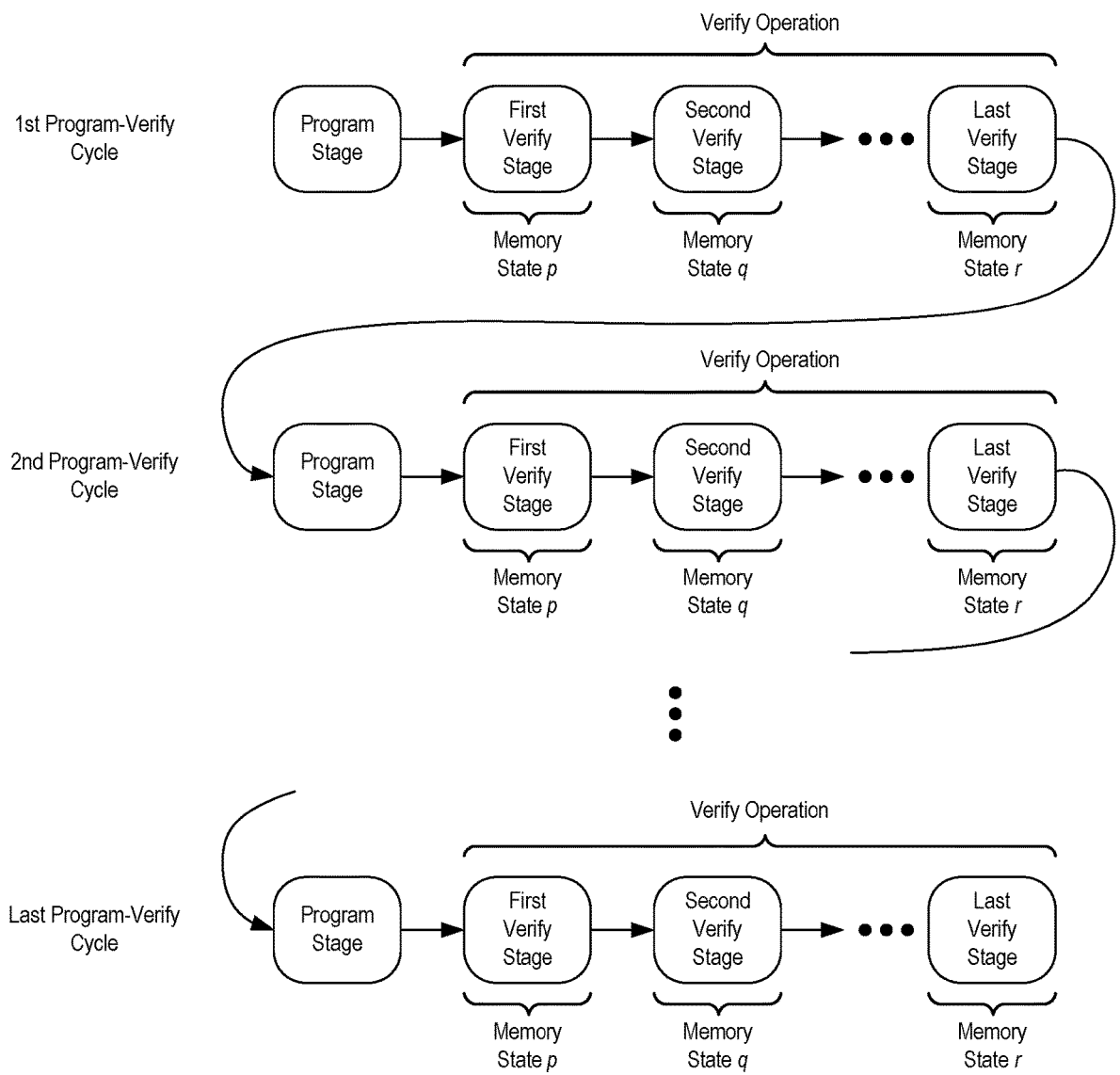
FIG. 7B is a schematic diagram of a program operation performed with program-verify cycles.

FIG. 7B shows a schematic diagram of a program operation performed with program-verify cycles. The program circuit 600 may begin the program operation by performing a first program stage or a first program-verify cycle. After performing the first program stage, the program circuit 600 may transition to the verify operation of the first program-verify cycle by performing a first or initial verify stage of the verify operation. After performing the first verify stage, the program circuit 600 may proceed to the second verify stage. The program circuit 600 may proceed in this manner by consecutively performing verify stages in accordance with a verify order associated with the first program-verify cycle until it performs a last verify stage of the verify operation of the first program-verify cycle.

During or after performance of the verify operation of the first program-verify cycle, the program circuit 600 may determine which of the selected memory cells are sufficiently programmed as a result of performing the first program stage in the first program-verify cycle. If all of the selected memory cells are not sufficiently programmed, then the program circuit 600 may proceed or transition to the second or next program-verify cycle. The program circuit 600 may start the second or next program-very cycle by performing a program stage of the program-verify cycle. After performing the program stage, the program circuit 600 may perform the verify operation of the second program-verify cycle by consecutively performing the verify stages in accordance with the verify order of the second program-verify cycle. After performing the last verify stage, if there are still memory cells that are insufficiently programmed, the program circuit 600 may proceed to a third program-verify stage. The program circuit 600 may proceed in this manner by consecutively performing program-verify cycles until the selected memory cells are sufficiently programmed following a last program-verify cycle.

As shown in FIG. 7B, the first, second, and last verify stages of each of the program-verify cycles are associated with memory states p, q, and r, respectively. Memory stages p, q, and r represent any of various memory states into which selected memory cells can be programmed. The memory states p, q, and r can be the same or different from each other for the different program-verify cycles depending on the verify orders of those program-verify cycles. In particular example configurations, the memory states p, q, and r may correspond to increasing or ascending threshold voltage ranges, with memory state q corresponding to a higher threshold voltage range than memory stage p, and memory state r corresponding to a higher threshold voltage range than memory states p and q.

During a given program-verify cycle, when performing the first memory stage associated with memory state p, the program circuit 600 may configure those selected memory cells having memory state p as their target memory states as verify-enabled memory cells and configure the other selected memory cells as program-inhibited or locked out memory cells. The program circuit 600 may then verify the selected memory cells with target memory state p during the first verify stage. When transitioning to the second program stage associated with memory state q, the program circuit 600 may configure those selected memory cells having memory state p as their target memory state in the verify-inhibit state, and configure those selected memory cells having memory state q as their target memory state in the verify-enable state. The program circuit 600 may keep those selected memory cells having memory state r as their target memory state in the verify-inhibit state. The program circuit 600 may perform similar actions when transitioning to the last verify stage associated with memory state r.

Referring back to FIG. 6, the program circuit 600 may perform discrete sets of program actions during program stages and discrete sets of verify actions during verify stages, as previously described. At least for NAND technology, a set of program actions that the program circuit 600 performs during a given program stage includes biasing the control gates and channels of a block with a set of program voltages. Each program voltage may be at one of a plurality of program levels associated with the given program stage. In addition, a set of verify actions that the program circuit 600 performs during a given verify stage includes biasing the control gates and channels of a block with a set of verify voltages. Each verify voltage may be at one of a plurality of verify levels associated with the given verify stage. Also, as described in further detail below, a discrete set of verify actions performed during a given verify stage also includes performing sense operations to sense program statuses of selected memory cells having a target memory state that matches the memory state associated with the given verify stage.

With respect to a program stage, the set of program voltages with which the program circuit 600 biases the control gates and channels includes a program selected memory cell gate voltage, a program unselected memory cell gate voltage, a program selected SGD gate voltage, a program unselected SGD gate voltage, a program SGS gate voltage, a program selected drain-side voltage, a program unselected drain-side voltage, and a program source-side voltage. The program circuit 600 biases control gates of selected memory cells with a program selected memory cell gate voltage during a program stage to move selected memory cells into or toward their target memory states, such as by increasing their respective threshold voltages. The program circuit 600 biases, with the program unselected memory cell gate voltage, control gates of unselected memory cells during a program stage. The program circuit 600 biases, with the program selected SGD gate voltage, control gates of SGD transistors coupled to selected memory cells during a program stage. The program circuit 600 biases, with the program unselected SGD gate voltage, control gates of SGD transistors coupled to unselected memory cells during a program stage. The program circuit 600 biases, with the program SGS gate voltage, control gates of SGS transistors during a program stage. The program circuit 600 biases, with the program selected drain-side voltages, drain ends of channels coupled to program-enabled memory cells during a program stage. The program circuit 600 biases, with the program unselected drain-side voltage, drain ends of channels coupled to program-inhibited memory cells during a program stage. The program circuit 600 biases, with the program source-side voltage, the source ends of channels during a program stage.

With respect to a verify stage, the set of verify voltages with which the program circuit 600 biases the control gates and channels includes a verify selected memory cell gate voltage, a verify unselected memory cell gate voltage, a verify selected SGD gate voltage, a verify unselected SGD gate voltage, a verify SGS gate voltage, a verify selected drain-side voltage, a verify unselected drain-side voltage, and a verify source-side voltage. The program circuit 600 biases control gates of selected memory cells with the verify selected memory cell gate voltage during a verify stage. The program circuit 600 biases, with the verify unselected memory cell gate voltage, control gates of unselected memory cells during a verify stage. The program circuit 600 biases, with the verify selected SGD gate voltage, control gates of SGD transistors coupled to selected memory cells during a verify stage. The program circuit 600 biases, with the verify unselected SGD gate voltage, control gates of SGD transistors coupled to unselected memory cells during a verify stage. The program circuit 600 biases, with the verify SGS gate voltage, control gates of SGS transistors during a verify stage. The program circuit 600 biases, with the verify selected drain-side voltage, drain ends of channels coupled to verify-enabled memory cells during a verify stage. The program circuit 600 biases, with the verify unselected drain-side voltage, drain ends of channels coupled to verify-inhibited memory cells during a verify stage. The program circuit 600 biases, with the verify source-side voltage, the source ends of channels during a verify stage.

The program circuit 600 is configured to bias the control gates and channels with the program and verify voltages during the program and verify stages by way of the control lines of the block 602, including the control gate lines SGD, WLL, SGSL, the bit lines BL, and the source line SL. In particular example configurations, including those described herein, the program circuit 600 is configured to bias the control gates of the memory cells, the SGD transistors, and the SGS transistors with the program and verify gate voltages by way of the word lines WLL, the SGD lines, and the SGS line, respectively. The program circuit 600 is configured to bias the drain ends of the channels with the program and verify drain-side voltages by way of the bit lines BL. The program circuit 600 is configured to bias the source ends of the channels with the program and verify source-side voltages by way of the source line SL.

In this context, the program and verify voltages are also or alternatively referenced or labeled with respect to the control lines biasing the control gates and channels. In particular, for the example configurations described herein, the program and verify selected memory cell gate voltages are referred to as program and verify selected word line voltages, the program and verify unselected memory cell gate voltage are referred to as program and verify unselected word line voltages, the program and verify selected drain-side voltages are referred to as program and verify selected bit line voltages, the program and verify unselected drain-side voltages are referred to as program and verify unselected bit line voltages, the program and verify unselected source-side voltages are referred to as program and verify source line voltages, the program and verify SGS gate voltages are referred to as program and verify SGS line voltages, the program and verify selected SGD gate voltages are referred to as program and verify selected SGD line voltages, and the program and verify unselected SGD gate voltages are referred to as program and verify unselected SGD line voltages.

In order to bias the control lines of the block, and in turn the control gates and the channels with the program and verify voltages, the program circuit 600 may include a voltage supply circuit 604 that supplies the program and verify voltages to the control lines. Through supply of the program and verify voltages to the control lines, the voltage supply circuit 604 applies the program and verify voltages to the control lines, biases the control lines with the program and verify voltages, and/or generates the program or verify voltage on the control lines. From the perspective of the control lines, a control line receives, is supplied with, or is biased with a program or verify voltage from the voltage supply circuit 604, biases respective control gates or channels with the program or verify voltage it receives, applies the program or verify voltage it receives to respective control gates or channels, generates a program or verify voltage in response to receipt of the program or verify voltage it receives from the voltage supply circuit 604, generates the program or verify voltage at a level of the program or verify voltage it receives, applies the program or verify voltage it generates to a respective control gate or channel, or biases a respective control gate or channel with the program or verify voltage it generates in response to the program or verify voltage it receives. These terms and phrases to describe how the program circuit 600 biases the control gates and channels of the block 602 with the program and verify voltages through supply of the program and verify voltages to the control lines of the block 602 are generally used interchangeably herein, unless expressly described otherwise.

As indicated in FIG. 6, the voltage supply circuit 602 may be configured to generate the program and verify voltages, and/or cause the control lines to generate their respective voltages at levels relative to a ground reference GND having a ground reference voltage level of 0 V. However, some voltages during some of the program or verify stages may be generated at levels referenced to a different reference point other than the ground reference GND, such as the source line SL for example. Herein, voltage levels may be presumed to be indicated with reference to the ground reference voltage level of 0 V, unless expressly described otherwise.

In the example configuration in FIG. 6, the voltage supply circuit 604 includes three voltage supply circuits that supply the program and verify voltages to the control lines, including a control gate line voltage supply circuit 606, a bit line voltage supply circuit 608, and a source line voltage supply circuit 610. The control gate line voltage supply circuit 606 is configured to supply or apply the program and verify gate voltages to the control gate lines of the block 602. In particular, the control gate line voltage supply circuit 606 is configured to supply the program and verify selected and unselected word line voltages to the word lines WLL, the program and verify selected and unselected SGD line voltages to the SGD lines, and the program and verify SGS line voltages to the SGS line. The bit line voltage supply circuit 608 is configured to supply or apply the program and verify selected and unselected bit line voltages to the bit lines BL of the block 602. The source line voltage supply circuit 610 is configured to supply or apply the program and verify source line voltages to the source line SL of the block 602. Other ways of configuring the voltage supply circuit 604 may be possible.

In addition, in the example configuration in FIG. 6, the control gate line voltage supply circuit 606 and the bit line voltage supply circuit 608 each include two circuit components, a voltage generation circuit and a decoder circuit. In general, a voltage generation circuit generates voltages supplied to control lines, and a decoder circuit selectively routes the generated voltages to the control lines.

In further detail, the control gate line voltage supply circuit 606 includes a control gate line voltage generation circuit 612 and a row decoder circuit 614. The control gate voltage generation circuit 612 may represent at least a portion of the power control circuit 160 of FIG. 2B. The row decoder circuit 614 may represent at least a portion of the row decoder 148 of FIG. 2B.

The control gate voltage generation circuit 612 is configured to generate a plurality or a set of control gate line voltages, including a selected word line voltage $V_{WLS}$, an unselected word line voltage $V_{WLU}$, a selected SGD line voltage $V_{SGDS}$, an unselected SGD line voltage $V_{SGDU}$, and a SGS line voltage $V_{SGS}$. For simplicity, the control gate line voltages generated by the control gate line voltage generation circuit 612 are not separated into distinct program control gate line voltages and verify control gate line voltages. Instead, the control gate line voltage generation circuit 612 is shown in FIG. 6 as generating a single set of control gate line voltages. In practical implementation, the control gate line voltage generation circuit 612 may simultaneously generate the control gate line voltages for program and verify stages in various ways. In one example implementation, as depicted in FIG. 6, the control gate line voltage generation circuit 612 may generate a single set of control gate line voltages. The control gate line voltages may be program gate line voltages during program stages and verify gate line voltages during verify stages. The control gate line voltage generation circuit 612 may be configured to set the control gate line voltages to program levels for program stages and set the control gate line voltages to verify levels for verify stages. In addition, the control gate line voltage generation circuit 612 may be configured to adjust the levels of the control gate line voltages between program levels and verify levels as the program circuit 600 transitions from a program stage to a verify stage or from a last verify stage in one program-verify cycle to a program stage of a next program-verify cycle. In other example implementations, the control gate line voltage generation circuit 612 is configured to generate separate sets of program and verify control gate line voltages. For such implementations, the control gate line voltage generation circuit 612 may include a selection circuit, such as in the form of switches or multiplexers, that selects which set of control gate line voltages, either the program control gate line voltages or the verify control gate line voltages, to provide to the row decoder circuit 614.

Regardless of the implementation, the control gate line voltage generation circuit's 612 generation of a program or verify control gate line voltage and generation of a control gate line voltage at a program level or a verify level are used interchangeably herein to refer to the same voltage. That is, during a program stage, the control gate line voltage generation circuit 612 generates program control gate line voltages or control gate line voltages at program levels. During a verify stage, the control gate line voltage generation circuit 612 generates verify control gate line voltages or control gate line voltages at verify levels.

In general, as used herein, phrases or terms such as "generating a program or verify voltage" and "generating a voltage at a program or verify level"—as well as other similar phrases or terms such as "supplying a program voltage" and "supplying a voltage at a program or verify level"; "applying a program or verify voltage" and "applying a voltage at a program or verify level"; or "biasing a control line with program or verify voltage" and "biasing a control line with a voltage at a program or verify level"—are generally used interchangeably, unless expressly described otherwise.

In addition, the control gate line voltage generation circuit 612 may be configured to generate the control gate line voltages at different program levels for different program stages, and/or at different verify levels for different verify stages. For example, for at least some program operations, the control gate line generation circuit 612 may be configured to generate the selected word line voltage $V_{WLS}$ in the form of program gate voltage pulses (or just program voltage pulses or program pulses) at different program pulse levels in or during different program stages. As another example, for at least some program operations, the control gate line generation circuit 612 may be configured to generate the selected word line voltage $V_{WLS}$ in the form of verify gate voltage pulses (or just verify voltage pulses or verify pulses) at different verify pulse levels in or during different verify stages. For example, the control gate line generation circuit 612 may output the verify pulse at one level when verifying selected memory cells associated with a first target memory state in a first verify stage, and the verify pulse at a different level when verifying selected memory cells associated with a second target memory state in a second verify stage. As the program circuit 600 transitions from one verify stage to another, the control gate line voltage generation circuit 612 may change or transition the level of the selected word line voltage $V_{WLS}$ from one verify pulse level to another verify pulse level, with each verify pulse level associated with the respective verify stage being performed, in order to generate consecutive verify pulses for the consecutive verify operations.

The row decoder circuit 614 is a circuit that selectively routes or supplies the control gate line voltages to the control gate lines. The row decoder circuit 614 may include a set of input terminals that receives the control gate line voltages from the control gate line voltage generation circuit 612. In addition, the row decoder circuit 614 may include a set of output terminals coupled to the control gate lines. The row decoder 614 may selectively route or supply the control gate line voltages it receives at its input terminals from the control gate voltage generation circuit 612 to its output terminals for supply or application to the control gate lines.

The row decoder circuit 614 is configured to selectively route or supply the control gate line voltages in that the row decoder 614 may route the control gate line voltages to different control gate lines at different times within the same program operation or during different program operations, depending on the memory cells of the block 602 that are selected, unselected, program-enabled, program-inhibited, verify-enabled, and verify inhibited for different program operations or for different program or verify stages within the same program operation. As an example, the row decoder circuit 614 may supply the selected word line voltage $V_{WLS}$, such as in the form of one or more program pulses, to a first word line during a first program operation, and may supply the selected word line voltage $V_{WLS}$, such as in the form of one or more program pulses, to a second, different word line WLL during a second program operation.

The row decoder circuit 614 may have any of various circuit configurations to selectively route or supply the control gate line voltages to the control gate lines. For at least some example configurations, the row decoder circuit 614 may include a plurality of switches (e.g., transistors) that turn on and off to selectively connect the input terminals to the output terminals. The on and off states of the switches may form conductive paths between the input and output terminals of the row decoder 614 that selectively supply or route the control gate line voltages. The switches may have any of various configurations, such as single-tier or multi-tier (or tree) configurations. For a given program operation or a given program or verify stage of the program operation, a given overall state of the control gate switches configured in on and off states may determine how the row decoder circuit 614 routes the control gate line voltages to the various control gate lines of the block 602.

In addition, the bit line voltage supply circuit 606 includes a bit line voltage generation circuit 616 and a column decoder circuit 618. The bit line voltage generation circuit 616 may represent at least a portion of the power control circuit 160 of FIG. 2B. The column decoder circuit 618 may represent at least a portion of the column decoder 148 of FIG. 2B.

The bit line voltage generation circuit 616 is configured to generate a plurality or a set of bit line voltages, including a selected bit line voltage $V_{BLS}$ and an unselected bit line voltage $V_{BLU}$. For simplicity, the bit line voltages generated by the bit line voltage generation circuit 616 are not separated into distinct program voltages and verify voltages. Instead, the bit line voltage generation circuit 616 is shown in FIG. 6 as generating a single set of bit line voltages. In practical implementation, the bit line voltage generation circuit 616 may generate the bit line voltages for program and verify stages in various ways. In one example implementation, as depicted in FIG. 6, the bit line voltage generation circuit 616 may generate a single set of bit line voltages. The bit line voltages may be program voltages during program stages and verify voltages during verify stages. The bit line voltage generation circuit 616 may be configured to set the bit line voltages to program levels for program stages and set the bit line voltages to verify levels for verify stages. In addition, the control gate voltage generation circuit 616 may be configured to adjust the levels of the bit line voltages between program levels and verify levels as the program circuit 600 transitions from a program stage to a verify stage or from a last verify stage in one program-verify cycle to a program stage of a next program-verify cycle. In other example implementations, the bit line voltage generation circuit 616 is configured to generate separate sets of program and verify bit line voltages. For such implementations, the bit line voltage generation circuit 616 may include a selection circuit, such as in the form of switches or multiplexers, that selects which set of bit line voltages, either the program voltages or the verify voltages, to provide to the column decoder circuit 618.

Regardless of the implementation, the bit line voltage generation circuit 616 generating a program or verify bit line voltage and the bit line voltage generation circuit 616 generating a bit line voltage at a program level or a verify level are used interchangeably and refer to generation of the same voltage. That is, during a program stage, the bit line voltage generation circuit 616 generates program bit line voltages or bit line voltages at program levels. During a verify stage, the bit line voltage generation circuit 616 generates verify bit line voltages or bit line voltages at verify levels.

The column decoder circuit 618 is a circuit that selectively routes or supplies the bit line voltages to the bit lines. The column decoder circuit 618 may include a set of input terminals that receives the bit line voltages from the bit line voltage generation circuit 616. In addition, the column decoder circuit 618 may include a set of output terminals coupled to the bit lines. The column decoder 618 may selectively route or supply the selected and unselected bit line voltages it receives at its input terminals from the bit line voltage generation circuit 616 to its output terminals for supply or application to the bit lines.

The column decoder circuit 618 is configured to selectively route or supply the bit line voltages in that the column decoder 618 may route the bit line voltages to different bit lines at different times within the same program operation or during different program operations, depending on the memory cells of the block 602 that are selected, unselected, program-enabled, program-inhibited, verify-enabled, and verify-inhibited for different program operations or for different program or verify stages within the same program operation. As an example, during a program stage of a program-verify cycle, the column decoder circuit 618 may supply the selected bit line voltage $V_{BLS}$ at an associated program level to a first set of the bit lines BL, and supply the unselected bit line voltage $V_{BLU}$ at an associated program level to a second set of the bit lines BL. During a first verify stage of the program-verify cycle, the column decoder circuit 618 may supply the selected bit line voltage $V_{BLS}$ at an associated verify level to a third set of the bit lines BL, and supply the unselected bit line voltage $V_{BLU}$ at an associated verify level to a fourth set of the bit lines BL. Then, during a second verify stage of the program-verify cycle, the column decoder circuit 618 may supply the selected bit line voltage VBL at the associated verify level to a fifth set of the bit lines BL, and supply the unselected bit line voltage $V_{BLU}$ at the associated verify level to a sixth set of the bit lines BL. The first, third, and fifth bit line sets receiving the selected bit line voltage $V_{BLS}$ during the program stage and the first and second verify stages may include bit lines that are the same or different from each other, or have some bit lines that are the same and some that are different. Similarly, the second, fourth, and sixth bit line sets receiving the unselected bit line voltage $V_{BLU}$ during the program stage and the first and second verify stages may include bit that are the same or different from each other, or have some bit lines that are the same and some that are different.

The column decoder circuit 618 may have any of various circuit configurations to selectively route or supply the bit line voltages to the bit lines BL. For at least some example configurations, the column decoder circuit 618 may include a plurality of switches (e.g., transistors) that turn on and off to selectively connect the input terminals to the output terminals. The on and off states of the switches may form conductive paths between the input and output terminals of the column decoder 618 that selectively supply or route the bit line voltages. The switches may have any of various configurations, such as single-tier or multi-tier (or tree) configurations. For a given program operation or a given program or verify stage of the program operation, a given overall state of the switches configured in on and off states may determine how the column decoder circuit 618 routes the bit line voltages to the various bit lines of the block 602.

For some example configurations, such as the one shown in FIG. 6, the output terminals of the column decoder circuit 618 are coupled to the bit lines BL by way of a plurality of sense circuits 620 configured to perform sense operations to sense program statuses of selected memory cells during verify stages of program operations. Details of the sense circuits 620 and sense operations are described in further detail below.

In the example configuration in FIG. 6, the plurality of sense circuits 620 includes an m-number of sense circuits 620(1) to 620(m), with each sense circuit 620 coupled to a respective one of the m-number of bit lines BL1 to BLm. Other sense circuit configurations may be possible. For example, the number of sense circuits 620 may be less than the number of bit lines BL of a block. In addition or alternatively, one sense circuit 620 may be coupled to different bit lines of different blocks. For example, the first sense circuit 620(1) may be coupled to the first bit line BL1 of the block 602, and may be coupled to a different first bit line BL1 of a different block of the memory cell structure 142. Other sense circuit configurations are possible, as described in further detail below.

For some example configurations, the bit line voltages output from the column decoder 618 may directly pass through the sense circuits 620 such that the levels of the bit line voltages as they are received by the bit lines BL are the same or substantially the same as their levels at the output terminals of the column decoder circuit 618. In other example configurations, the sense circuits 620 may each include any of various circuit components, such as resistors, capacitors, and/or semiconductor devices (e.g., transistors) as non-limiting examples, that alter the voltage levels of the bit line voltages they receive, such as by reducing the levels. In particular example configurations, the sense circuits 620 each include a respective semiconductor device, such as a transistor, that receives a bit line voltage from the column decoder 618. The semiconductor devices may include respective first terminals, such as gate terminals, that receive the bit line voltages from the column decoder circuit 618. The semiconductor devices may further include respective second terminals, such as source terminals, that output the bit line voltages onto the bit lines BL by lowering the bit line voltages by a threshold voltage level from the level at which the bit line voltages were received at their first (gate) terminals. Various ways of supplying bit line voltages to bit lines by way of sense circuits may be possible.

The program circuit 600 may further include a program controller 622. A program controller is a circuit that controls program operations. A program controller controls when program operations begin and when they end. In addition, a program controller controls when program stages and verify stages within a program operation begin and end. A program controller controls the transitions of stages from one stage to a next stage, and controls the transitions of program cycles from one program cycle to a next program cycle. In addition, a program controller sets the voltages on the control lines of a block. A program controller may do so by controlling the voltage levels of the voltages that a voltage supply circuit generates and supplies, and when the voltage supply circuit generates and supplies the voltages at their particular levels. For example, a program controller controls whether and/or when selected and unselected voltages are generated at associated program levels or associated verify levels. In addition, a program controller sets the voltages on the control lines by controlling how voltages are routed to control lines of a block, and can change which voltages are routed to which control lines.

In addition, a program controller may also determine where to store data. For example, a program controller may determine that data is to be stored, and identify a collection of memory cells into which to store or program the data, such as by identifying a plane, a block, a word line, and/or a word line cell group that includes the collection of memory cells. The program controller may identify that collection of memory cells as the selected memory cells of a program operation.

A program controller may determine where to store data in response to receipt of address information from the controller 102 (FIG. 2A) or otherwise identify a unique physical address (e.g., one that includes a particular plane, a particular block, a particular word line, and/or a particular word line cell group) that identifies a physical location of the selected memory cells into which to program the data.

In addition, a program controller may know or determine a storage scheme under which data is be stored in selected memory cells. By knowing the storage scheme, a program controller may know whether to program the selected memory cells as SLC cells or MLC cells, as defined by the storage scheme. In addition, where the selected memory cells are to be programmed as MLC cells, the program controller may know the number of bits-per-cell each of the MLC cells are configured to store, as defined by the storage scheme. A program controller may control the biasing on the control lines in order program the selected memory cells as SLC cells or MLC cells, in accordance with the storage scheme.

A program controller may also identify the data values of the data to be programed into the selected memory cells. A program controller may know which data values are to be stored in which memory cells of the selected memory cells. Based on this knowledge, the program controller may know the target memory states of each of the selected memory cells of a program operation. In turn, the program controller may determine, during the course of the program operation, which selected memory cells are sufficiently programmed and which selected memory cells are insufficiently programmed. Based on these determinations, a program controller can determine which selected memory cells to configure as program-inhibited memory cells and which selected memory cells to configure as program-enabled memory cells during the program stages. In addition, by knowing the target memory states of each of the selected memory cells, a program controller can determine which of the selected memory cells to configure as verify-enabled memory cells and which of the selected memory cells to configure as verify-inhibited memory cells for each of the verify stages associated with the different memory states. A program controller can control the biasing on the control lines in order to configure the various selected memory cells as program-enabled or program-inhibited memory cells during program stages, and as verify-enabled or verify-inhibited memory cells during the verify stages.

In further detail with respect to example configuration FIG. 6, the program controller 622 may be configured to set the voltages on the control lines at certain levels and during certain program and verify stages in order to perform program operations. To do so, the program controller 622 is configured to control the voltage supply circuit 604 to supply, apply, or output the program voltages to the control lines during program stages, and to supply, apply, or output the verify voltages to the control lines during verify stages.

With respect to the control gate line voltage supply circuit 606, the program controller 622 is configured to control the control gate line voltage supply circuit 606 to supply, apply, or output the control gate line voltages $V_{SGDS}$, $V_{SGDU}$, $V_{WLS}$, $V_{WLU}$, $V_{SGS}$ to the control gate lines at program levels during program stages, and at verify levels during the verify stages. The program controller 622 may control the control gate line voltage generation circuit 612 to generate the control gate line voltages $V_{SGDS}$, $V_{SGDU}$, $V_{WLS}$, $V_{WLU}$, $V_{SGS}$ at associated program levels during program stages. In addition, the program controller 622 may control the control gate line voltage generation circuit 612 to generate the control gate line voltages $V_{SGDS}$, $V_{SGDU}$, $V_{WLS}$, $V_{WLU}$, $V_{SGS}$ at associated verify levels during verify stages. In some example configurations, as shown in FIG. 6, the program controller 622 may output a control gate line voltage control signal CTRLCLV to control the control gate line voltage generation circuit 612 to generate the control gate line voltages $V_{SGDS}$, $V_{SGDU}$, $V_{WLS}$, $V_{WLU}$, $V_{SGS}$ at either the associated program levels or verify levels, or otherwise output the control gate line voltages $V_{SGDS}$, $V_{SGDU}$, $V_{WLS}$, $V_{WLU}$, $V_{SGS}$ as either program voltages or verify voltages to the row decoder circuit 614.

In addition, the program controller 622 is configured to control the row decoder circuit 614 by configuring the row decoder 614 in any of various states to route the control gate line voltages $V_{SGDS}$, $V_{SGDU}$, $V_{WLS}$, $V_{WLU}$, $V_{SGS}$ to the control gate lines in order to program and verify the selected memory cells during the program and verify stages. As shown in FIG. 6, the program controller 622 may control the row decoder circuit 614 by outputting a row decoder control signal CTRLRD to the row decoder circuit 614. The row decoder circuit 614 may respond to the row decoder control signal CTRLRD by being configured in a state corresponding to a level or value of the row decoder control signal CTRLRD, such as by turning on an off various switches. The program controller 622 may output the row decoder control signal CTRLRD based on physical address information identifying the selected memory cells.

With respect to the bit line voltage supply circuit 608, the program controller 622 is configured to control the bit line voltage supply circuit 606 to supply, apply, or output the bit line voltages $V_{BLS}$, $V_{BLU}$ to the bit lines at program levels during program stages, and at verify levels during the verify stages. The program controller 622 may control the bit line voltage generation circuit 616 to generate the bit line voltages $V_{BLS}$, $V_{BLU}$ at associated program levels during program stages. In addition, the program controller 622 may control the bit line voltage generation circuit 616 to generate the bit line voltages $V_{BLS}$, $V_{BLU}$ at associated verify levels during verify stages. In some example configurations, as shown in FIG. 6, the program controller 622 may output a bit line voltage control signal CTRLBLV to control the bit line voltage generation circuit 616 to generate the bit line voltages $V_{BLS}$, $V_{BLU}$ at either the associated program levels or verify levels, or otherwise output the bit line voltages $V_{BLS}$, $V_{BLU}$ as either program voltages or verify voltages to the column decoder circuit 618.

In addition, the program controller 622 is configured to control the column decoder circuit 618 by configuring the column decoder 618 in any of various states to route the bit line voltages $V_{BLS}$, $V_{BLU}$ to the bit lines in order to program and verify the selected memory cells during the program and verify stages. As shown in FIG. 6, the program controller 622 may control the column decoder circuit 618 by outputting a column decoder control signal CTRLCD to the column decoder circuit 618. The column decoder circuit 618 may respond to the column decoder control signal CTRLCD by being configured in a state corresponding to a level or value of the column decoder control signal CTRLCD, such as by turning on an off various switches.

The program controller 622 may output the column decoder control signal CTRLCD based on physical address information identifying the selected memory cells. In addition, the program controller 622 may output the column decoder control signal CTRLCD based on the program statuses of the selected memory cells obtained during verify stages. Based on the program statuses, the program controller 622 may output the column decoder control signal CTRLCD so that the column decoder 618 routes or supplies the selected bit line voltage $V_{BLS}$ to bit lines coupled to insufficiently programmed selected memory cells, and routes or supplies the unselected bit line voltage $V_{BLU}$ to bit lines coupled to sufficiently programmed selected memory cells during program stages. In addition, the program controller 622 may output the column decoder control signal CTRLCD based on the target memory states of the selected memory cells. Based on the target memory states, the program controller 622 may output the column decoder control signal CTRLCD so that the column decoder 618 routes or supplies the selected bit line voltage $V_{BLS}$ to bit lines coupled to matched memory cells and routes or supplies the unselected bit line voltage $V_{BLU}$ to bit lines coupled to unmatched memory cells during the verify stages.

With respect to the source line voltage supply circuit 610, the program controller 622 is configured to control the source line voltage supply circuit 610 to supply, apply, or output the source line voltage $V_{SL}$ to the source line SL at program levels during program stages, and at verify levels during the verify stages. In some example configurations, as shown in FIG. 6, the program controller 622 may output a source line voltage control signal CTRLSLV to control the source line voltage supply circuit 610 to generate the source line voltage $V_{SL}$ at either the associated program level or verify level.

During a program operation, the program controller 622 configures the word lines, the bit lines, and the SGD lines of the block 602 in selected states and unselected states in order to program selected memory cells into their target memory states while keeping the unselected memory cells in their initial memory states. A word line in a selected state is referred to as being selected and/or as a selected word line. A word line in an unselected state is referred to as being unselected and/or as an unselected word line. A bit line in a selected state is referred to as being selected and/or as a selected bit line. A bit line in an unselected state is referred to as being unselected and/or as an unselected bit line. An SGD line in a selected state is referred to as being selected and/or as a selected SGD line. An SGD line in an unselected state is referred to being unselected and/or as an unselected SGD line.

A selected word line (or selected word line layer) of a program operation is a word line (or word line layer) that is coupled to selected memory cells during a program operation. A selected word line may perform different roles or different functions during program stages and verify stages of a program operation. At least for NAND technology, during a program stage, a selected word line applies a selected word line voltage at an associated program level, referred to as a program gate voltage pulse (or just program pulse), to selected memory cells and/or biases selected memory cells with a program pulse, such as by applying a program pulse to control gates of selected memory cells, and/or by biasing the control gates of selected memory cells with a program pulse during the program stage. During a verify stage, a selected word line applies a selected word line voltage at a verify level, referred to as a verify gate voltage pulse (or just verify pulse), to selected memory cells and/or biases selected memory cells with a verify pulse, such as by applying a verify pulse to control gates of selected memory cells, and/or by biasing the control gates of selected memory cells with a verify pulse during the verify stage.

An unselected word line (or unselected word line layer) of a program operation is a word line (or word line layer) that is not coupled to any selected memory cells during a program operation. In addition or alternatively, an unselected word line of a program operation is a word line that does not apply at least one program pulse to at least one selected memory cell and/or that does not apply at least one verify pulse to at least one selected memory cell during the program operation. For program operations that are confined to a particular region of the memory cell structure 142, the unselected word lines are those word lines in the particular region that are not the selected word line. For example, for a program operation where the selected memory cells are coupled to the same word line (or disposed in the same word line layer), the unselected word lines are the word lines of the block that are not the selected word line.

A selected bit line of a program operation is a bit line that enables or allows a selected memory cell coupled to the selected bit line to be programmed or verified. During a program stage of a program operation, a selected bit line is a bit line that configures a selected memory cell in a program-enable state to allow or enable the selected memory cell to be programed during the program stage. During a verify stage of a program operation, a selected bit line is a bit line that configures a selected memory cell in a verify-enable state to allow or enable the selected memory cell to be verified during the verify stage.

An unselected bit line of a program operation is a bit line that inhibits, prevents, or locks out a selected memory cell coupled to the unselected bit line from being programmed or verified. During a program stage of a program operation, an unselected bit line is a bit line that configures a selected memory cell in a program-inhibit state to inhibit, prevent, or lock out the selected memory cell from being programmed during the program stage. During a verify stage of a program operation, an unselected bit line is a bit line that configures a selected memory cell in a verify-inhibit state to inhibit, prevent, or lock out the selected memory cell from being verified during the verify stage.

In addition, a selected SGD line of a program operation is a SGD line that enables or allows selected memory cells coupled to the SGD line to be programmed or verified. During a program stage of a program operation, a selected SGD line is a SGD line that configures a selected memory cell in a program-enable state to allow or enable the selected memory cell to be programmed during the program stage. During a verify stage of a program operation, a selected SGD line is a SGD line that configures a selected memory cell in a verify-enable state to allow or enable the selected memory cell to be verified during the verify stage.

An unselected SGD line of a program operation is an SGD line that inhibits, prevents, or locks out unselected memory cells coupled to the SGD line from being programmed or verified. The SGD line may inhibit, prevent, or lock out these unselected memory cells from being programmed or verified even though they may be coupled to selected bit lines and/or selected word lines. During a program stage of a program operation, an unselected memory cell disposed in the same word line layer as a selected memory cell may be coupled to a selected bit line during the program stage. The unselected SGD line coupled to that unselected memory cell is an SGD line that configures the unselected memory cell in the program-inhibit state so that the unselected memory cell is not programmed during the program stage despite being coupled to the selected bit line. During a verify stage of a program operation, an unselected memory cell disposed in the same word line layer as a selected memory cell may be coupled to a selected bit line during the verify stage. The unselected SGD line coupled to that unselected memory cell is an SGD line that configures the unselected memory cell in the verify-inhibit state so that the unselected memory cell is not verified during the verify stage despite being coupled to the selected bit line.

At any given point in time during a program operation, the word lines, the bit lines, and the SGD lines have respective selected statuses. A selected status of a line is a status identifier that identifies whether the line is a selected line or an unselected line. During the course or duration of a program operation, the selected status of a line may stay the same or may change. For a selected status of a line that changes, the change may be from the selected state to the unselected state, or from the unselected state to the selected state. In addition, for a selected status of a line that changes, the change may occur within a single program cycle (e.g., a single program-verify cycle). For example, within a single program cycle, a change in a selected status of a line may occur during a transition from a program stage to a verify stage, or from one verify stage to another verify stage. Within the single program cycle, a selected status of a line may change once or multiple times. In addition or alternatively, for a selected status of a line that changes, the change may occur across program cycles. For example, a line may be selected during a program stage of one program cycle and then unselected during a program stage of another or next program cycle. As another example, a line may be selected during a last verify stage of one program cycle and then may be unselected during a program stage of another or a next program cycle.

For each program stage and verify stage of a program operation, the program controller 622 may identify each of the word lines WLL, the bit lines BL, and the SGD lines as selected or unselected, and configure each of the word lines WLL, the bit lines BL, and the SGD lines in selected and unselected states according to the identifications. In particular, according to the identifications, the program controller 622 configures each of the word lines WLL as a selected word line or an unselected word line, configures each of the bit lines BL as a selected bit line or an unselected bit line, and configures each of the SGD lines as a selected SGD line or an unselected SGD line.

The program controller 622 configures each of the word lines WLL, the bit lines BL, and the SGD lines in selected and unselected states by supplying or biasing them with respective selected and unselected voltages. In particular, the program controller 622 configures a word line as a selected word line by supplying or applying the selected word line voltage $V_{WLS}$ to that word line and/or by biasing the word line with the selected word line voltage $V_{WLS}$. The word line receiving or biased with the selected word line voltage $V_{WLS}$ becomes or is configured as a selected word line and generates a selected word line voltage by generating its voltage at a selected word line level. Similarly, the program controller 622 configures a word line as an unselected word line by supplying or applying the unselected word line voltage $V_{WLU}$ to that word line and/or by biasing the word line with the unselected word line voltage $V_{WLU}$. The word line receiving or biased with the unselected word line voltage $V_{WLU}$ becomes or is configured as an unselected word line and generates an unselected word line voltage by generating its voltage at an unselected word line level.

In a similar manner, the program controller 622 configures a SGD line as a selected SGD line by supplying or applying the selected SGD line voltage $V_{SGDS}$ to that SGD line and/or by biasing the SGD line with the selected SGD line voltage $V_{SGDS}$. The SGD line receiving or biased with the selected SGD line voltage $V_{SGDS}$ becomes or is configured as a selected SGD line and generates a selected SGD line voltage by generating its voltage at a selected SGD level. Similarly, the program controller 622 configures a SGD line as an unselected SGD line by supplying or applying the unselected SGD line voltage $V_{SGDU}$ to that SGD line and/or by biasing the SGD line with the unselected SGD line voltage $V_{SGDU}$. The SGD line receiving or biased with the unselected SGD line voltage $V_{SGDU}$ becomes or is configured as an unselected SGD line and generates an unselected SGD line voltage by generating its voltage at an unselected SGD level.

The selected and unselected levels at which the word lines and SGD lines generate their respective voltages may be the same as or different than the voltage levels of the selected and unselected word line and SGD line voltages $V_{WLS}$, $V_{WLU}$, $V_{SGDS}$, $V_{SGDU}$. For example, the row decoder circuit 614 may provide a voltage drop such that the selected and unselected word lines and SGD lines are biased with or generate their respective selected and unselected voltages at levels that are lower than the levels at which the control gate line voltage generation circuit 612 generates the selected and unselected word line and SGD line voltages $V_{WLS}$, $V_{WLU}$, $V_{SGDS}$, $V_{SGDU}$. For such example configurations, the control gate line voltage generation circuit 612 is configured to generate the selected and unselected word line and SGD line voltages $V_{WLS}$, $V_{WLU}$, $V_{SGDS}$, $V_{SGDU}$, as well as the SGS line voltage $V_{SGS}$ at sufficiently high levels to achieve appropriate biasing of the control gate lines SGD, WLL, SGSL.

For some example configurations, the selected and unselected word line and SGD line voltages $V_{WLS}$, $V_{WLU}$, $V_{SGDS}$, $V_{SGDU}$ are be referred to as global selected and unselected voltages, and the selected and unselected voltages that the word lines and SGD lines generate and/or are biased with are referred to as local selected and unselected voltages. Similarly, the control gate line voltage generation circuit 612 generates a global SGS line voltage $V_{SGS}$, and the SGS line SGSL generates and/or is biased with a local SGS line voltage $V_{SGS}$. In this context, the control gate line voltage supply circuit 606 generates global control gate line voltages, including global selected and unselected control gate line voltages, and supplies or routes the global control gate line voltages to the control gate lines of the block 602. In response, the control gate lines of the block 602 generate respective local control gate line voltages. Selected control gate lines generate local selected control gate line voltages or voltages at local selected levels, and unselected control gate lines generate local unselected control gate line voltages or voltages at local selected levels. Herein, for simplicity, no express distinction is made between the levels, including the selected and unselected levels, of the control gate line voltages that the control gate line voltage generation circuit 612 generates, and the levels, including the selected and unselected levels, of the control gate line voltages that the control gate lines generate.

In addition, the program controller 622 configures a bit line as a selected bit line by supplying or applying the selected bit line voltage $V_{BLS}$ to that bit line and/or by biasing the bit line with the selected bit voltage $V_{BLS}$. The bit line receiving or biased with the selected bit line voltage $V_{BLS}$ becomes or is configured as a selected bit line and generates a selected bit line voltage by generating its voltage at a selected bit line level. Similarly, the program controller 622 configures a bit line as an unselected bit line by supplying or applying the unselected bit line voltage $V_{BLU}$ to that bit line and/or by biasing the bit line with the unselected bit line voltage $V_{BLU}$. The bit line receiving or biased with the unselected bit line voltage $V_{BLU}$ becomes or is configured as an unselected bit line and generates an unselected bit line voltage by generating its voltage at an unselected bit line level.

The selected and unselected levels at which the bit lines generate their respective voltages may be the same as or different than the voltage levels of the selected and unselected bit line voltages $V_{BLS}$, $V_{BLU}$. For example, the column decoder circuit 618 and/or the sense circuits 620 may provide one or more voltage drops such that the selected and unselected bit lines are biased with or generate their respective selected and unselected bit line voltages at levels that are lower than the levels at which the bit line voltage generation circuit 616 generates the selected and unselected bit line voltages $V_{BLS}$, $V_{BLU}$. For such example configurations, the bit line voltage generation circuit 616 is configured to generate the selected and unselected bit line voltages $V_{BLS}$, $V_{BLU}$ at sufficiently high levels to achieve appropriate biasing of the bit lines.

For some example configurations, the selected and unselected bit line voltages $V_{BLS}$, $V_{BLU}$ are be referred to as global selected and unselected bit line voltages, and the selected and unselected voltages that the bit lines generate and/or are biased with are referred to as local selected and unselected bit line voltages. In this context, the bit line voltage supply circuit 608 generates global bit line voltages, including global selected and unselected bit line voltages, and supplies or routes the global bit line voltages to the bit lines of the block 602. In response, the bit lines generate respective local bit line voltages. Selected bit lines generate local selected bit line voltages or voltages at local selected levels, and unselected bit lines generate local unselected bit line voltages or voltages at local selected levels. Herein, for simplicity, no express distinction is made between the levels, including the selected and unselected levels, of the bit line voltages that the bit line voltage generation circuit 616 generates, and the levels, including the selected and unselected levels, of the bit line voltages that the bit lines generate.

As previously described, the program controller 622 may identify or assign each of the word lines, bit lines, and SGD lines as selected or unselected for the program and verify stages of a program operation. The determinations or identifications that the program controller 622 makes to assign each of the word lines, SGD lines, and bit lines as selected or unselected depends on the physical location of the selected memory cells being programmed or verified (i.e., the word lines and bit lines to which they are coupled), the target memory states of the selected memory cells, the program statuses of the selected memory cells, and the particular program stage or verify stage being performed at a given point in time of the program operation.

In an example program operation, the program circuit 600 may perform a program operation to program data (such as one or more pages of data) into a selected word line cell group 624 of the block 602. In general, a selected word line cell group is a word line cell group that includes the selected memory cells that are programmed during the program operation. Those word line cell groups that do not include selected memory cells—i.e., that include unselected memory cells—are unselected word line cell groups of the program operation.

Figure 8A:
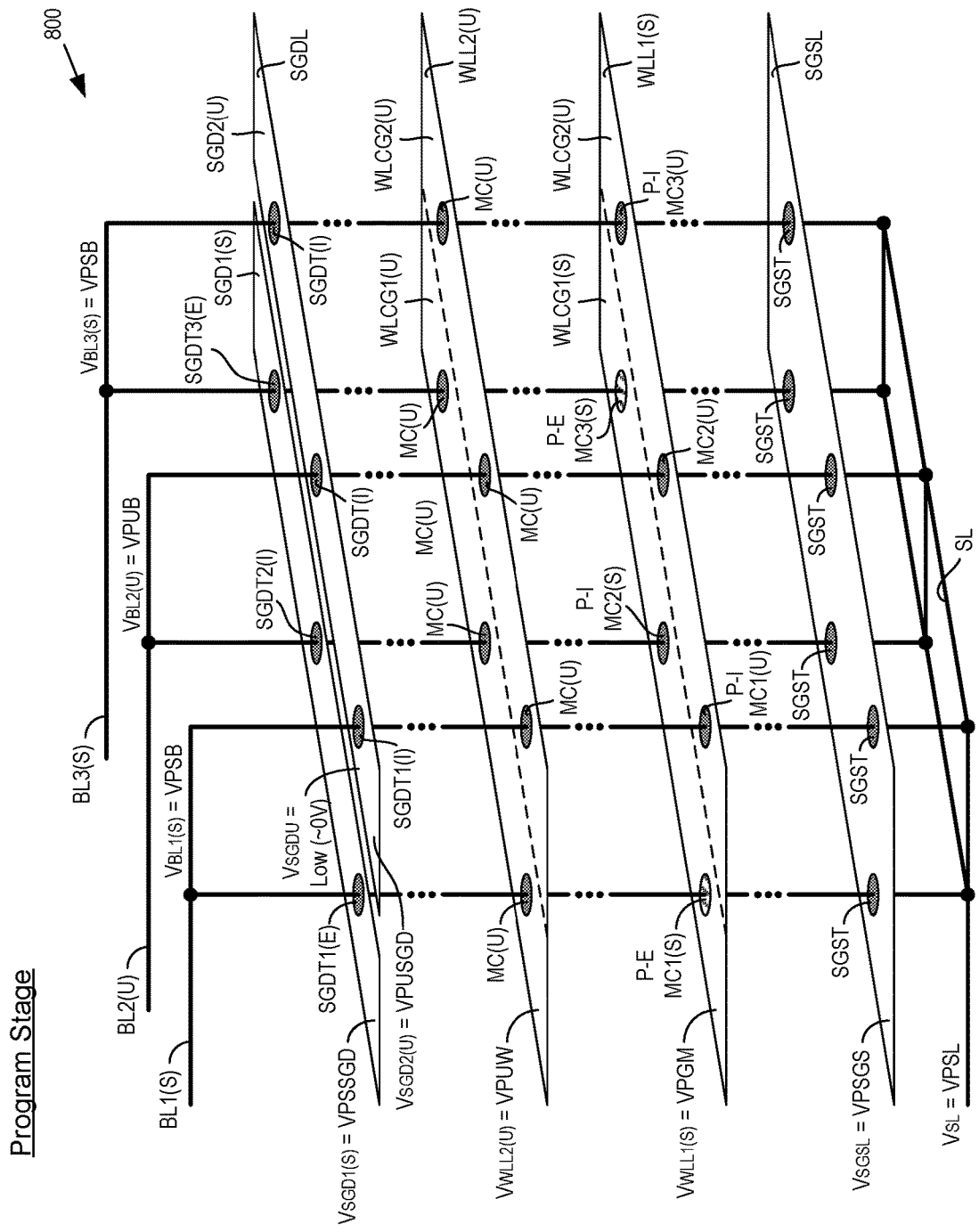
FIG. 8A is an exploded view of a portion of a block biased with program voltages during a program stage of a program-verify cycle.
Figure 8B:
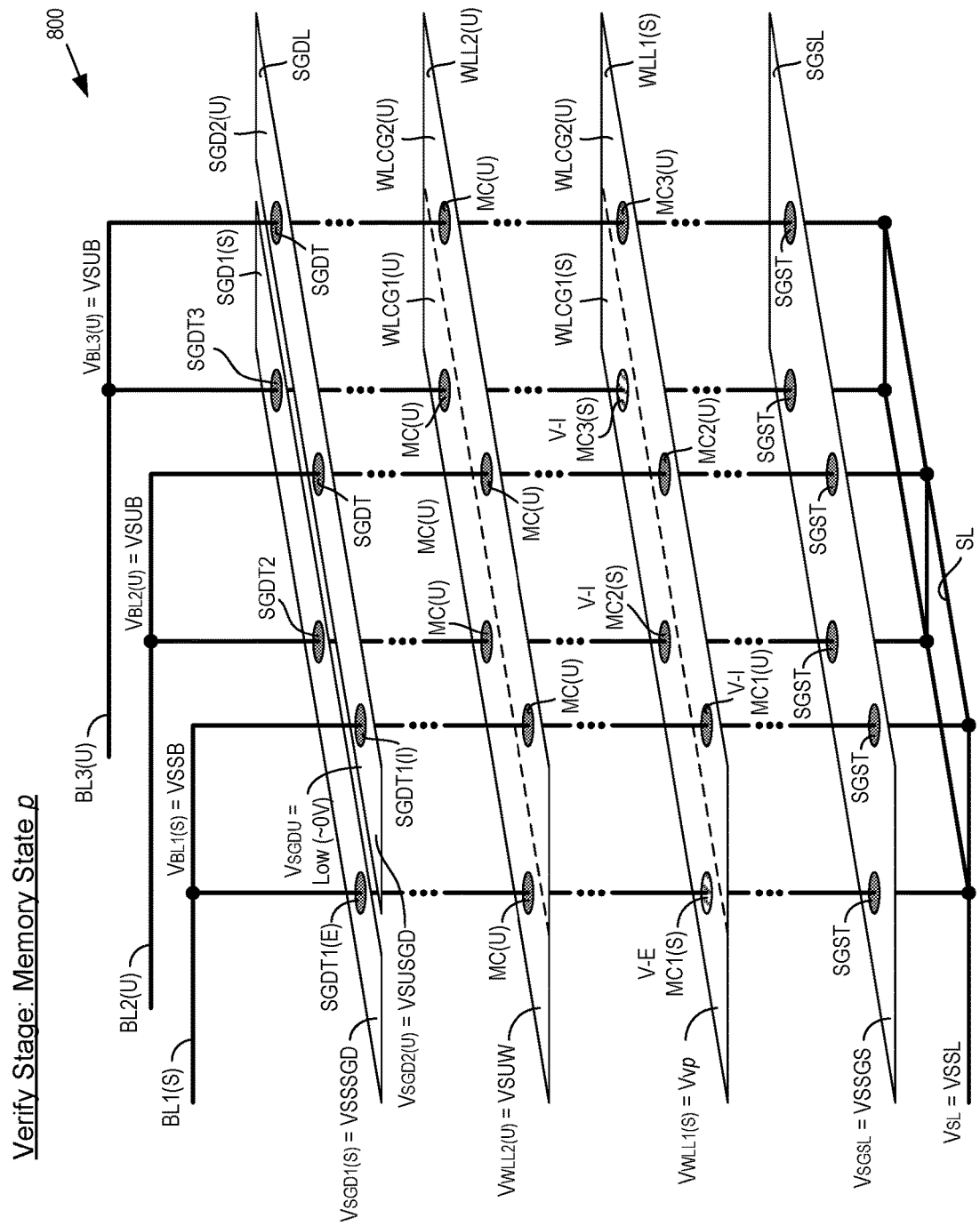
FIG. 8B is the exploded view of the block of FIG. 8A, but biased with verify voltages during a first verify stage of the program-verify cycle.
Figure 8C:
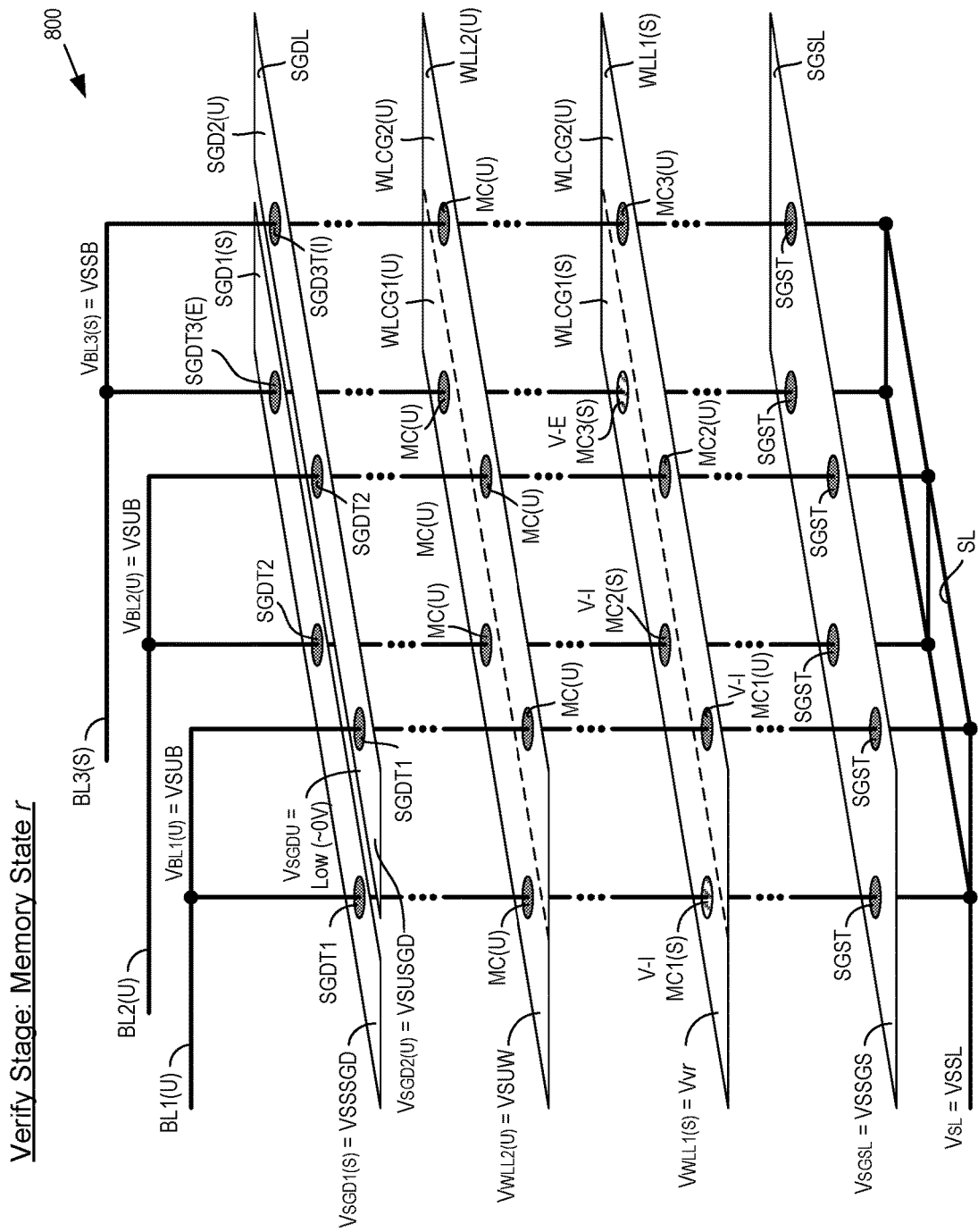
FIG. 8C is the exploded view of the block of FIGS. 8A and 8B, but biased with verify voltages during a second verify stage of the program-verify cycle.

An example program operation (or at least a portion of a program operation) to program data into a selected word line cell group is described with reference to FIGS. 8A-8C and 9, in conjunction with FIG. 6. FIGS. 8A-8C show an exploded perspective view of at least a portion of a 3-D block 800 that includes selected memory cells MC(S) being programmed during the program operation. For simplicity, the block 800 includes two word lines (or word line layers) WLL1, WLL2, two SGD lines SGD1, SGD2, disposed or extending in one or more SGD layers SGDL, an SGS line or layer SGSL, and three bit lines BL1, BL2, BL3. The two word lines WLL1, WLL2 may be adjacent or non-adjacent to each other. For example, the two word lines WLL1, WLL2 may represent any two of the 48 word lines WLL1 to WLL48 of the block 602 of FIG. 6. Similarly, the three bit lines BL1, BL2, BL3 may be adjacent or non-adjacent to each other. For example, the three bit lines BL1, BL2, BL3 may represent any three of the m-number of bit lines BL1 to BLm of the block 602 of FIG. 6.

Figure 9:
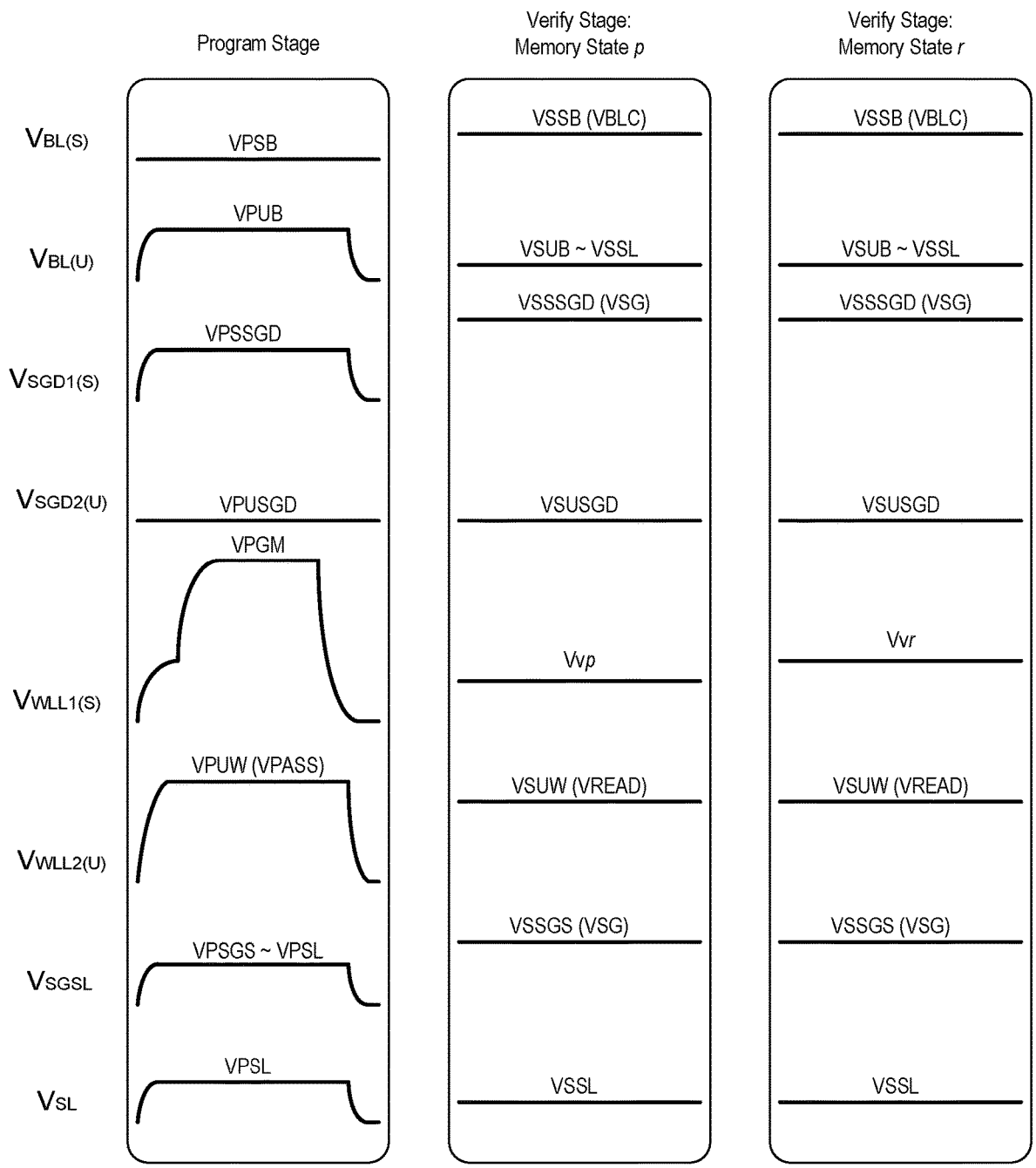
FIG. 9 is a timing diagram of voltage waveforms of the program and verify voltages generated on the control lines of the block of FIGS. 8A-8C during the program and verify stages.

The program operation described with reference to FIGS. 8A-8C and 9 includes a program stage and two verify stages of a program-verify cycle. Application of the program voltages to the control lines of the block 800 during the program stage is described with reference to FIG. 8A. Application of verify voltages to the control lines of the block 800 during a first verify stage is described with reference to FIG. 8B. Application of verify voltages to the control lines of the block 800 during a second verify stage is described with reference to FIG. 8C. FIG. 9 shows a timing diagram of voltage waveforms of the program and verify voltages generated on the control lines of the block 800 during the program and verify stages.

Referring to FIG. 8A, in the example program operation, the program controller 622 has determined to program data into a first word line cell group WLCG1 coupled to the first word line WLL1. Accordingly, the program controller 622 identifies the first word line WLL1 as a selected word line WLL1(S), and the second word line WLL2 as an unselected word line WLL2(U). In addition, the program controller 622 identifies the first word line cell group WLCG1 as a selected word line cell group WLCG1(S), and the other word line cell groups as unselected word line cell groups WLCG(U). The three memory cells MC1, MC2, MC3 of the selected word line cell group WLCG1(S) are selected memory cells MC1(S), MC2(S), MC3(C) of the program operation. The selected memory cells MC(S) of the selected word line cell group WLCG(S) may represent at least a portion of the selected word line cell group 624 of FIG. 6. The other memory cells of the unselected word line cell groups are unselected memory cells MC(U).

In addition, in the example program-verify cycle, the program controller 622 determines that second selected memory cell MC2(S) is sufficiently programmed, and configures it in the program-inhibited state or as a program-inhibited memory cell P-I MC2(S). However, the program controller 622 determines that the first and third selected memory cells MC1(S), MC3(S) are insufficiently programmed and wants to subject them to a program pulse during the program stage. Accordingly, the program controller 622 configures the first and third selected memory cells MC1(S), MC3(S) in the program-enabled state or as program-enabled memory cells P-E MC1(S), P-E MC3(S).

As shown in FIG. 8A, the first bit line BL1 is coupled to the first selected memory cell MC1(S), the second bit line BL2 is coupled to the second selected memory cell MC2(C), and the third bit line BL3 is coupled to the third selected memory cell MC3(C). Accordingly, the program controller 622 identifies the first and third bit lines as selected bit lines BL1(S), BL3(S), since they are coupled to the program-enabled memory cells P-E MC1(S), P-E MC3(S). In addition, the program controller 622 identifies the second bit line as an unselected bit line BL2(U) since it is coupled to the program-inhibited memory cell P-I MC2(S).

In addition, the selected memory cells MC(S) of the selected word line cell group WLCG(S) are coupled to the first SGD line SGD1. Accordingly, the program controller 622 identifies the first SGD line SGD1 as a selected SGD line SGD1(S) and the second SGD line SGD2 as an unselected SGD line SGD2(U) for the program stage.

To properly bias the control lines during the program stage, the program controller 622 may control the voltage supply circuit 604 to generate its voltages at program levels (rather than verify levels). In addition, the program controller 622 may control the row and column decoders 614, 618 to ensure that the selected and unselected voltages are properly routed or supplied to the selected and unselected lines it has identified. In particular, the program controller 622 may control the row decoder 614 so that the row decoder 614 supplies the selected word line voltage $V_{WLS}$ to the selected first word line WLL1(S), the unselected word line voltage $V_{WLU}$ to the unselected second word line WLL2(U), the selected SGD line voltage $V_{SGDU}$ to the selected first SGD line SGD1(S), and the unselected SGD line voltage $V_{SGDU}$ to the unselected second SGD line SGD2(U). In addition, the program controller 622 may control the column decoder 618 so that the column decoder 618 supplies the selected bit line voltage $V_{BLS}$ to the selected first and third bit lines BL1(S), BL3(S), and supplies the unselected bit line voltage $V_{BLU}$ to the unselected second bit line voltage BL2(U).

With reference to FIGS. 8A and 9, during the program stage, the selected first word line WLL1(S) may generate a selected word line voltage at a program level in the form of a program gate voltage pulse (or just program voltage pulse or program pulse). For example, the control gate line voltage supply circuit 606 may supply the selected word line voltage $V_{WLS}$ in the form of a program pulse, and in response, the selected first word line WLL1(S) may generate a program pulse in response to receipt of the selected word line voltage $V_{WLS}$. As used herein, a program gate voltage pulse (or just program voltage pulse or program pulse) is a voltage that is generated, supplied, output, or applied to change a level, value, magnitude, or state of a storage parameter of a memory cell in order to program the memory cell during a program operation. For NAND technology, the program pulse is a voltage applied to or used to bias a selected word line and/or that is applied to the control gates of memory cells coupled to the selected word line. At least for NAND technology, a program-enabled selected memory cell (or just program-enabled memory cell) is a memory cell that responds, or is at least configured to respond, to a program pulse by increasing a level of its threshold voltage.

FIG. 9 shows that during the program stage, the selected word line WLL1(S) generates the program pulse by increasing the selected word line voltage $V_{WLL1(S)}$ from an initial voltage level up to a program pulse level VPGM. The selected word line WLL1(S) maintains the program pulse at the program pulse level VPGM for a predetermined period of time, and then decreases the voltage back down after the predetermined period of time at or near the end of the program stage. For at least some embodiments, the program pulse level is in a range of about 16 volts (V) to 22 V. Additionally, program controller 622 may control the program pulse level, such as by increasing the level of the selected word line voltage $V_{WLS}$ during the program stage. For some example configurations, the program pulse level may increase according to an increasing number of program-verify cycles performed.

For at least some program operations, in order for the program-enabled memory cells to increase their threshold voltage levels in response to a program pulse, the program-enabled memory cells have their drain terminals (or just drains) biased to a voltage at a level lower than the program pulse level VPGM and have their source terminals (or just sources) cut off or electrically disconnected from the source line SL. In particular example configurations, the level lower than the program pulse level VPGM is the ground reference voltage level 0 V. To achieve this biasing, the selected bit lines are configured to bias the drain ends of channels coupled to the program-enabled memory cells with selected bit line voltages at a program selected bit line level VPSB that is lower than the program pulse level VPGM, such as 0 V for example. In this context, the selected bit lines FIG. 9 collectively labels the selected bit line voltages generated on the selected bit lines BL1(S) and BL3(S) as $V_{BL(S)}$, and shows the selected bit line voltages $V_{BL(S)}$ at a program selected bit line level VPSB during the program stage.

In addition, at least for some example configurations, the SGS line SGSL and the source SL generate their respective SGS line and source line voltages $V_{SGSL}$, $V_{SL}$ at levels that are the same or about the same as each other in order to turn off the SGS transistors SGST during the program stage, which in turn cuts off the source terminals of the memory cells from the source line SL. For some example configurations, the source line SL generates its source line voltage $V_{SL}$ at a program source line level VPSL that is positive (i.e., above the ground reference voltage 0 V), such as 2 V for example, to more effectively cut off the source line SL from the source terminals and/or to reduce the likelihood or impact of channel disturbs. The program source line level VPSL may alternatively be referred to as a program source level PROGSRC. The SGS line SGSL may generate its SGS line voltage $V_{SGSL}$ at a program SGS level that is the same as or about the same as the program source line level VPSL, as indicated in FIG. 9.

In addition, during the program stage, the unselected word line WLL2(U) may generate an unselected word line voltage $V_{WLL2(U)}$ at a program unselected word line level VPUW. In some example configurations, the unselected word line voltage generated by unselected word lines may be referred to as a pass voltage or a voltage generated at a pass voltage level VPASS. In addition or alternatively, for at least some example configurations, the program unselected word line level VPUW (or pass voltage level VPASS) may be in a range of about 8-11 V, such as 10 V for example, although other voltage levels may be possible.

Also, the unselected bit lines may bias the channels, such as the drain ends of channels, coupled to program-inhibited memory cells, and in turn the drains of the program-inhibited memory cells, with an unselected bit line voltage at a program unselected bit line level VPUB that will lock out or prevent selected memory cells from increasing their threshold voltage in response to the program pulse. For at least some example configurations, the program unselected bit line level VPUB is higher than the program selected bit line level VPSB, such as in a range of about 2-3 V for example. Also, for at least some example configurations, the program unselected bit line level VPUB may alternatively be referred to as a sense amp VDD level VDDSA. Accordingly, FIGS. 8A and 9 illustrate the unselected bit line BL2(U) biasing the program-inhibited memory cell P-I MC2(U) with an unselected bit line voltage $V_{BL2(U)}$ at the program unselected bit line level VPUB.

Also, for the example program operation in FIG. 8, the selected bit lines BL1(S), BL3(S) and the selected word line WLL1(S) are also coupled to unselected memory cells that are not to be programmed during the program operation, namely the first and third unselected memory cells MC1(U), MC3(U) of the unselected word line cell group WLCG2(U). For this situation (and other similar situations during program operations), the SGD lines SGD1, SGD2 are used to program-enable those memory cells that are part of the selected word line cell group WLCG1(S), and to program-inhibit those memory cells that are part of the unselected word line cell group WLCG2(U).

To do so, the first SGD line SGD1 is configured as a selected SGD line SGD1(S) that generates a selected SGD line voltage at a program selected SGD level VPSSGD, which in turn configures the SGD transistors coupled to the first SGD line SGD1 as enabled SGD transistors SGDT(E). As used herein, an enabled SGD transistor is an SGD transistor that enables or allows a selected bit line to bias the drain terminal of a memory cell coupled to the selected bit line. Otherwise stated, an enabled SGD transistor is a transistor that enables or allows a drain terminal of a memory cell to be biased by a selected bit line. Accordingly, with respect to FIG. 8A, by being coupled to both selected bit lines BL1(S), BL3(S) and the selected SGD line SGD1 (S), first and third SGD transistors coupled to the first SGD line SGD1(S) are configured as enabled SGD transistors SGDT1(E), SGDT3(E) and, in turn, program-enable the first and third selected memory cells MC1(S), MC(3) of the selected word line cell group WLCG1(S).

On the other hand, the second SGD line SGD2 is configured as an unselected SGD line SGD2(U) that generates an unselected SGD line voltage at a program unselected SGD level VPUSGD, which in turn configures the SGD transistors coupled to the unselected second SGD line SGD2 (U) as inhibited SGD transistors SGDT(I). An inhibited SGD transistor is an SGD transistor that prevents, inhibits, or locks out a selected bit line from biasing the drain terminal of a memory cell coupled to the selected bit line. Otherwise stated, an inhibited SGD transistor is a transistor that prevents, inhibits, or locks out a drain terminal of a memory cell from being biased by a selected bit line. Inhibiting an SGD transistor may alternatively be referred to as boosting the SGD transistor. With respect to FIG. 8A, by being coupled to both the selected bit lines BL1(S), BL3(S) and the unselected SGD line SGD2(U), the first and third SGD transistors coupled to the second SGD line SGD2(U) are configured as inhibited SGD transistors SGDT1(I), SGDT3(I) and, in turn, program-inhibit the first and third unselected memory cells MC1(U), MC3(U) of the unselected word line cell group WLCG2(U).

For some example configurations, the program selected SGD level is higher than the program unselected SGD level. In particular configurations, the program selected SGD level PSSGD is 3 V, and the program unselected SGD level PUSGD is 0 V, although other voltage levels may be possible.

In general, certain combinations of selected and unselected SGD and bit line voltages applied to the SGD transistors may either enable them or inhibit them. In particular implementations, the combination of a selected SGD line voltage and a selected bit line voltage applied may enable the SGD transistors, and the other combinations may inhibit the SGD transistors.

In further detail, an SGD transistor SGDT that has its control gate biased with a selected SGD line voltage and its drain biased with a selected bit line voltage may be enabled. Accordingly, the program circuit 600 may enable an SGD transistor by supplying a selected SGD line coupled to the SGD transistor with the selected SGD line voltage $V_{SGDS}$ and supplying a selected bit line coupled to the SGD transistor with the selected bit line voltage $V_{BLS}$.

An SGD transistor that has its control gate biased with a selected SGD line voltage and its drain biased with an unselected bit line voltage may be inhibited. This type of inhibiting may be referred to as x-mode boosting. The program circuit 600 may perform x-mode boosting to inhibit an SGD transistor by supplying a selected SGD line coupled to the SGD transistor with the selected SGD line voltage $V_{SGDS}$ and an unselected bit line coupled to the SGD transistor with the unselected bit line voltage $V_{BLU}$.

An SGD transistor that has its control gate biased with an unselected SGD line voltage and its drain biased with an unselected bit line voltage may be inhibited. This type of inhibiting may be referred to as xy-mode boosting. A program circuit 600 may perform xy-mode boosting to inhibit an SGD transistor by supplying an unselected SGD line coupled to the SGD transistor with the unselected SGD line voltage $V_{SGDU}$ and by supplying an unselected bit line coupled to the SGD transistor with the unselected bit line voltage $V_{BLU}$.

An SGD transistor that has its control gate biased with an unselected SGD line voltage and its drain biased with a selected bit line voltage may be inhibited. This type of inhibiting may be referred to as y-mode boosting. A program circuit 600 may perform y-mode boosting to inhibit an SGD transistor by supplying an unselected SGD line coupled to the SGD transistor with the unselected SGD line voltage $V_{SGDU}$ and by supplying a selected bit line coupled to the SGD transistor with the selected bit line voltage $V_{BLS}$.

Referring particularly to the program operation described with reference to FIGS. 8A-8C and 9, the program controller 622 may control the voltage supply circuit 604 to supply the program voltages to the control gate lines for a predetermined period of time associated with the program stage. Upon expiration of the predetermined time period, the program controller 622 may control the voltage supply circuit 604 to lower the program voltages to initial levels in order to end, terminate, or exit the program stage. Upon exiting the program stage, the program controller 622 may transition the program operation to an initial verify stage of the program-verify cycle.

In general, the program controller 622 can control the transitioning of stages performed in a program operation. A transition of a program operation is a movement or a progression of the program operation from one stage to another stage, such as from a first stage to a second stage, or from a current stage to a next stage. The two stages can be in the same program cycle. For example, the transition can be a transition from a program stage to a verify stage, or can be a transition from one verify stage to another verify stage, such as in accordance with a verify order of a program-verify cycle. Alternatively, the two stages can be in different program cycles. For example, for two program-verify cycles, the transition can be from a last verify stage of a current program-verify cycle to a program stage of a next program-verify cycle. As another example, for two program-only cycles, the transition can be from a program stage of a current program-only cycle to a program stage of a next program-only cycle.

The program controller 622 may control the transitioning of the stages by controlling the program and verify voltages that the voltage supply circuit 604 supplies to the control lines of the block 602. For example, as illustrated in FIG. 9, the program controller 622 ends or terminates the program stage at least by transitioning the program voltages from program levels down to initial levels. This includes stopping the supply of the program pulse to the selected word line WLL1(S), causing the selected word line WLL1(S) to decrease its selected word line voltage from the program pulse level VPGM down to an initial level, such as 0 V for example.

Another example, the program controller 622 may control the transitioning by changing the level of at least one of the control line voltages. To transition from a program stage to a verify stage, the program controller 622 may change all of the levels from program voltage levels to verify voltage levels. When transitioning from a first verify stage to a second verify stage, the program controller 622 may control the transition by changing at least one of the verify voltage levels. For example, the program controller 622 may change a verify voltage pulse applied to the selected word line from a first verify voltage pulse level to a second verify voltage pulse level. In addition, the program controller 622 may control the transition of one verify stage to a next verify stage by changing the voltage levels of the bit line voltages according to the bit lines changing their selected statuses between verify stages.

In further detail with respect to the example program operation of FIGS. 8A-8C and 9, suppose for example that the three selected memory cells MC1(S), MC2(S), MC3(S) have target memory state p, target memory state q, and target memory state r, respectively, where the memory states p, q, and r, are any of various memory states into which memory cells can be programmed under a given storage scheme. FIG. 8B shows example biasing conditions for the block 800 to verify the first selected memory cell MC1(S) for memory state p. FIG. 8C shows example biasing conditions for the block 800 to verify the third selected memory cell MC3(S) for memory state r.

The verify stage to verify the first selected memory cell MC1(S) for memory state p is referred to as the first verify stage, and the verify stage to verify the third selected memory cell MC2(S) for memory stage r is referred to as the second verify stage. The first verify stage may or not be the initial verify stage performed directly after the program stage, depending on the verify order. That is, the program controller 622 may or may not directly transition from the program stage to the first verify stage, depending on the verify order. Where the program controller 622 does not directly transition to the first verify stage, the program circuit 600 may perform one or more other verify stages before performing the first verify stage. Additionally, the second verify stage is generally referred to as being performed or occurring after the first verify stage. However, the program controller 622 may or may not directly transition from the first verify stage to the second verify stage, depending on the verify order. Where the program controller 622 does not directly transition to the second verify stage, the program circuit 600 may perform one or more other verify stages after the first verify stage before performing the second verify stage. FIG. 9 shows example voltage waveforms of the verify voltages generated on the control lines of the block 800 for verifying the first and third selected memory cells MC1(S), MC3(S) during the first and second verify stages.

With reference to FIGS. 8B and 9, during the first verify stage, the selected first word line WLL1(S) may generate a selected word line voltage at a verify level in the form of a verify gate voltage pulse, or just verify voltage pulse or verify pulse. For example, the control gate line supply circuit 614 may supply the selected word line voltage $V_{WLS}$ in the form of a verify pulse, and in response, the selected first word line WLL1(S) may generate a verify pulse. As used herein, a verify gate voltage pulse (or verify voltage pulse or verify pulse) is a voltage that is generated, supplied, output, or applied to verify selected memory cells. In general, during a given verify stage, the selected word line generates a verify pulse at a given verify pulse level Vv that corresponds to the memory stage associated with the given verify stage. The given verify pulse level may be a predetermined level aligned with a lower tail of a model or target threshold distribution curve. Example verify pulse levels Vv include those shown and previously described with reference to FIGS. 5A-5D. FIGS. 8B and 9 show the selected word line WLL1(S) generating the verify pulse at a pth verify pulse level Vvp associated with verifying selected memory cells having target memory state p.

For a given program-verify cycle that includes a plurality of verify stages, the selected word line may sequentially generate a plurality of verify pulses, each during one of the multiple verify stages, and each at a respective verify pulse level Vv corresponding to the verify stage in which the verify pulse is being generated. In particular example configurations, the selected word line may sequentially generate the plurality of verify pulses by transitioning the selected word line voltage from one verify pulse level to a next verify pulse level as the program circuit 600 transitions from one verify stage to the next. For at least some verify operations, the selected word line may transition from one verify pulse level to the next without decreasing the selected word line voltage down to an initial or low level (e.g., 0 V) in between verify pulses. Another way to characterize the generation of the verify pulses during a program-verify cycle is that during a program-verify cycle that includes a plurality of verify stages, the selected word line generates a verify pulse at a plurality of verify pulse levels, each corresponding to one of the plurality of verify stages. For some example configurations, a range of the various verify pulse levels may extend from a lowest verify pulse level of 0.8 V to a highest verify pulse level of 6 V, although other verify pulse levels or range of verify pulse levels may be possible.

As previously described, the program circuit 600 verifies selected memory cells during verify stages by determining the program statuses of the selected memory cells. In the verify stages, the program circuit 600, through use of the sense circuits 620, performs sense operations to verify the selected memory cells by sensing their program statuses—i.e., by sensing whether and when the selected memory cells are sufficiently programmed. Otherwise stated, the program circuit 600 executes or performs verify stages by performing sense operations to sense or otherwise determine program statuses of selected memory cells.

In general, as used herein, a sense operation is a memory operation performed to determine a response of a memory cell that is biased according to predetermined bias conditions. A bias with which the memory cell is biased during a sense operation may be any of various types of bias, including any number of biases or any type of bias, such as a voltage, a current, or any of various signals such as direct current (DC) signals or alternating current (AC) wired or wireless signals that can affect a behavior or trigger a response of the memory cell. A status of a memory cell is generally a condition or a state of the memory cell. The status may be one of a plurality of possible predetermined conditions or states in which the memory cell can be. A response of the memory cell when subjected to the bias conveys or communicates the status of the memory cell.

In further detail, a status of a memory cell may be any of various types of statuses. The status type may pertain or be specific to the memory operation for which a sense operation is performed. As previously described, one type of status is a program status, which can include sufficiently programmed, insufficiently programmed, or over-programmed. During a verify stage, a sense circuit performs a sense operation to determine the program status of a memory cell—i.e., to determine of the memory cell is sufficiently programmed or insufficiently programmed. Another status type is a read status, which is the memory state of a memory cell. As described in further detail below, a sense circuit may perform a sense operation during a read stage of a read operation to sense the memory state of a memory cell, and in turn the data value of the data that the memory cell is storing.

A response of the memory cell produced during a sense operation may be any of various measurable properties of an electrical signal, such as a DC or AC voltage or current, or an electromagnetic wave, that the memory cell can generate, conduct, induce, emit, radiate, or otherwise cause to be created in response to being biased during the sense operation. Example measurable properties may include a magnitude, an amount, a level, a frequency, a slope, a duty cycle, a pulse width, a waveform type (sinusoidal, square, sawtooth, e.g.), a rate of change (e.g., a rate of decay or a rate of increase), a modulation, or a signal-to-noise ratio, as non-limiting examples. The type of the response and the value of the response that is measured or sensed may depend on a storage parameter of the memory cell and the level, value, or state of the storage parameter, which in turn indicates the status of the memory cell.

At least for NAND technology, a response of a memory cell is a current that the memory cell draws or causes to be drawn through a bit line. During a sense operation, a memory cell is biased with a predetermined set of voltages to induce the memory cell to draw a current through a bit line. An amount of current that the memory cell draws or causes to draw depends on a threshold voltage level of the memory cell, and in turn, indicates a status, such as a program status or a read status of the memory cell.

A sense circuit is a circuit that senses a response of a memory cell while the memory cell is being biased during a sense operation. A sense circuit can sense the response by sensing or detecting a presence or absence of the response, and/or by measuring an amount, level, value, or magnitude of the response. The function of sensing a status of a memory cell performed by the sense circuits 620 in FIG. 6 have circuit structures that connect to the bit lines BL coupled to the memory cells by enabling or forming current paths that allow currents to flow through them to the bit lines. Other structural configurations for performing the function of current sensing may be possible. For example, other example sense circuits may be connected to the word lines instead of the bit lines, and determine the statuses of the memory cells based on current flow drawn through the word lines. Other example sense circuits may sense a voltage on a word line or a bit line without necessarily having that voltage be dependent on current drawn through the selected memory cells. For such configurations, the sense circuit performs voltage sensing rather than current sensing to determine statuses of the selected memory cells.

Turning back to the first verify stage in FIG. 8B, the sense circuits 620 perform sense operations to sense current drawn through selected bit lines coupled to verify-enabled memory cells having target memory state p while the selected word line WLL1(S) generates a verify pulse at the pth verify pulse level Vvp. For verify-enabled cells that are insufficiently programmed—e.g., have a threshold voltage that is below the range of threshold voltage levels associated with memory state p, the verify pulse at the pth verify pulse level Vvp will be higher than the threshold voltages of the insufficiently programmed memory cells, causing those verify-enabled memory cells to conduct or draw current through the selected bit lines to which they are coupled. Otherwise stated, during a verify stage, verify-enabled memory cells draw current through the selected bit lines to which they are coupled when they are insufficiently programmed. On the other hand, for verify-enabled cells that are sufficiently programmed—e.g., have a threshold voltage that is in the range of threshold voltage levels associated with memory state p, the verify pulse at the pth verify pulse level Vvp will be below or lower than the threshold voltages of the sufficiently programmed memory cells, preventing those verify-enabled memory cells from conducting or drawing current through the selected bit lines to which they are coupled. Otherwise stated, during a verify stage, verify-enabled memory cells draw no or an insignificant amount of current through the selected bit lines to which they are coupled when they are sufficiently programmed.

In practical implementations for at least some example configurations, verify-enabled memory cells may draw varying amounts of current, and in some embodiments, may be characterized as fully conducting or partially conducting depending on how close their threshold voltages are to the verify pulse level. Different program circuits 600 and their respective sense circuits may handle sense operations and identify program statuses in various ways according to different responses of verify-enabled memory cells.

In the focused example in FIG. 8B, of the three selected memory cells MC(S), only the first selected memory cell MC1(S) has the target memory state p, and so only the first selected memory cell of the three is a verify-enabled memory cell V-E MC1(S) in the first verify stage. The other two selected memory cells MC2(S), MC3(S) are verify-inhibited memory cells V-I MC2(S), V-I MC3(S). Accordingly, during the first verify stage, the first bit line BL1 is a selected bit line BL1(S), and the second and third bit lines BL2, BL3 are unselected bit lines BL2(U), BL3(U).

For the first verify stage, the control lines of the block 800 are biased so that a sense circuit 620 coupled to the selected bit line BL1(S) can sense whether the first selected memory cell MC1(S) draws current through the selected first bit line BL1(S) in response to its control gate being biased with the verify pulse at the pth verify pulse level Vvp. Herein, during verify stages, the verify levels at which the control lines are biased are also or alternatively referred to as sense levels, in the context that sense operations are performed to verify the memory cells.

In further detail, the selected first bit line BL1(S) is configured to generate a selected bit line voltage $V_{BL1(S)}$ at a verify or sense selected bit line level VSSB (or VBLC). The unselected second and third bit lines BL2(U), BL3(U) are configured to generate unselected bit line voltages $V_{BL2(U)}$, $V_{BL3(U)}$ (collectively labeled in FIG. 9 as unselected bit line voltage $V_{BL(U)}$ at a verify or sense unselected bit line level VSUB. During verify stages (or during sense operations), the sources of the memory cells are not cut off from the source line, and so for at least some embodiments, the sense bit line levels are measured, indicated, designed for, or referenced, with reference to the source line voltage $V_{SL}$. In particular configurations, the sense selected bit line level VSSB is a positive voltage above a sense source line level VSSL, such as in a range of about 0.2 V to 0.8 V above the sense source line level VSSL. The sense unselected bit line level VUSB is the same or about the same as the sense source line level VSSL, so that there is a zero voltage difference between the source and drain ends of channels including verify-inhibited memory cells, which in turn may prevent current flow through the unselected bit lines and verify-inhibited memory cells, thereby reducing power consumption during the first verify stage.

The sense source line level VSSL may alternatively be referred to as a cell source level VCELSRC. In some example configurations, the sense source line level VSSL is at the ground reference voltage level 0 V. In other example configurations, the sense source line level VSSL is a positive voltage above 0 V, such as 1 V for example. One benefit of the source line SL generating its source line voltage $V_{SL}$ at a positive voltage (e.g., 1 V) is to sense for a negative threshold voltage of memory cells by creating a negative voltage difference between the source line voltage and a selected word line voltage. Creating a bias setting that allows for sensing negative threshold voltages by setting the sense line voltage $V_{SL}$ to a higher level than a selected bit line voltage may be easier from a design implementation, rather than trying to configure the voltage supply circuit 604 to generate a negative voltage below the ground reference voltage.

In addition, during the first verify stage, the unselected word line WLL2(U) may generate an unselected word line voltage $V_{WLL2(U)}$ at a verify or sense unselected word line level VSUW. In some example configurations, the unselected word line voltage generated by unselected word lines may be referred to as a read voltage or a voltage generated at a read voltage level VREAD. In addition or alternatively, for at least some example configurations, the sense unselected word line level VSUW (or VREAD) may be in a range of about 7-9 V, such as 8 V for example, although other voltage levels may be possible.

Also, similar to the program stage in FIG. 8A, the selected bit line BL1(S) and the selected word line WLL1(S) are also coupled to the unselected first memory cell MC1(U) of the unselected word line cell group WLCG2(U) during the first verify stage, as indicated in FIG. 8B. If the unselected first memory cell MC1(U) is verify-enabled during first verify stage, it could draw current through the selected bit line BL1(S), which could lead to the sense circuit coupled to the selected bit line BL1(S) identifying an incorrect program status of the selected first memory cell MC1(S) when performing the sense operation during the first verify stage. Similar to the program stage, the first and second SGD lines SGD1, SGD2 are configured as selected and unselected SGD lines, respectively, in order to verify-enable the selected memory cells coupled to the selected word lines and selected bit lines, and verify-inhibit the unselected memory cells coupled to selected word lines and selected bit lines.

With respect to FIG. 8B, the first SGD line SGD1 generates a selected SGD line voltage $V_{SGD1(S)}$ at a verify or sense selected SGD level VSSSGD level (which may also or alternatively be referred to as a select gate level VSG), which at least for some example configurations may be in a range of about 5-8 V. An SGD transistor that has its control gate biased with a selected SGD line voltage at the sense selected SGD level VSSSGD and its drain terminal biased with a selected bit line voltage at the sense selected bit line level VSSB (or VBLC) may be enabled or turned on to allow a memory cell to which it is coupled draw current during a verify stage if the memory cell is insufficiently programmed. In addition, the second SGD line SGD2 generates an unselected SGD line voltage $V_{SGD2(U)}$ at a verify or sense unselected SGD level VSUSGD level, which at least for some example configurations may be at or close to 0 V. An SGD transistor that has its control gate biased with an unselected SGD line voltage at the sense unselected SGD level VSUSGD despite having its drain terminal biased with a selected bit line voltage at the sense selected bit line level VSSB (or VBLC) may be inhibited or turned off to prevent or inhibit an unselected memory cell to which it is coupled draw current during a verify stage.

In addition, at least for some example configurations, the SGS line SGSL may generate the SGS line voltage $V_{SGSL}$ at a sense SGS level VSSGS, which may also be the same level as the sense selected SGD level VSSSGD. Otherwise stated, the selected SGD line SGD1 and the SGS line SGSL may generate their voltages at the same select gate level VSG during the first verify stage.

The program controller 622 may control the voltage supply circuit 604 at the verify or sense levels as shown in FIG. 8B during the first sense stage. During this time period, a sense circuit 620 coupled to the selected first bit line BL1(S) may perform a sense operation to sense for current drawn through the selected first bit line BL1(S). Based on the sensing, the sense circuit 620 may generate a sense result signal that indicates the program status of the verify-enabled memory cell V-E MC1(S) or otherwise keeps track or a record of the program status of the verify-enabled memory cell V-E MC1(S). The sense circuit 620 may output the sense result signal to the program controller 622 or otherwise allow the program controller 622 to determine the program status of the verify-enabled memory cell V-E MC1(S) so that the program controller 620 can determine whether to end the program operation, or at least determine whether to program-enable or program-inhibit the selected first memory cell MC1(S) for a next program cycle.

The program controller 622 may control the voltage supply circuit 604 to bias the control lines of the block 800 at their respective voltage levels until the program controller 622 determines that a predetermined period of time for performing the first verify stage has expired or ended. During the predetermined time period, the program controller 622 may control the sense circuits 620 to sense the program statuses of the verify-enabled memory cells. For example, with reference to FIG. 8B, the program controller 622 may control a sense circuit coupled to the selected first bit line BL1(S) to sense a status of the verify-enabled memory cell V-E MC1(S). At the end of the first program stage, the program controller 622 may transition to a next verify stage. At some point during the program-verify cycle, the program controller 622 may transition to the second verify stage, either directly after or after performing one or more verify stages after the first verify stage. FIG. 8C shows example biasing conditions for the block 800 to verify the third selected memory cell MC3(S) for memory state r. FIG. 9 shows example voltage waveforms of the verify voltages generated on the control lines of the block 800 for verifying the selected third memory cells MC3(S) during the second verify stage.

For performance of the second verify stage, the block 800 may be biased similarly as in the first verify stage. One difference is that the selected word line WLL1(S) may generate a verify pulse at an rth verify pulse level associated with memory state r, instead of at the pth verify pulse level associated with memory state p. Also, since the selected third memory cell MC3(S) has the target memory state r, the selected third memory cell is a verify-enabled memory cell V-E MC3(S), while the selected first and second memory cells are verify-inhibited memory cells V-I MC1(S), V-I MC2(S). Accordingly, the first and second bit lines BL1, BL2 are configured as unselected bit lines BL1(U), BL2(U) for the second verify stage and generate unselected bit line voltages $V_{BL1(U)}$, $V_{BL2(U)}$ (collectively labeled in FIG. 9 as $V_{BL(U)}$) at the sense unselected bit line level VSUB, while the third bit line BL3 is configured as a selected bit line BL3(S) for the second verify stage and generates a selected bit line voltage $V_{BL3(S)}$ at the sense selected bit line level VSSB. The first and second SGD lines SGD1, SGD2 may continue to be selected and unselected SGD lines SGD1(S), SGD2(U), respectively so that the third SGD transistor SGDT3 coupled to the selected first SGD line SGD1(S) is an enabled SGD transistor SGDT3(E), and the third SGD transistor SGDT3 coupled to the unselected second SGD line SGD2(U) is an inhibited SGD transistor SGD3(I).

The program controller 622 may control the voltage supply circuit 604 to bias the control lines of the block 800 at their respective voltage levels until the program controller 622 determines that a predetermined period of time for performing the second verify stage has expired or ended. During the predetermined time period, the program controller 622 may control the sense circuits 620 to sense the program statuses of the verify-enabled memory cells. For example, with reference to FIG. 8C, the program controller 622 may control a sense circuit coupled to the selected third bit line BL3(S) to sense a status of the verify-enabled memory cell V-E MC3(S). At the end of the second program stage, the program controller 622 may transition to a next verify stage, or if the second verify stage is the last verify stage of the program-verify cycle, then program controller 622 may either end the program operation if all of the selected memory cells of the selected word line group WLCG1(S) are sufficiently programmed, or transition to a next program-verify cycle within the program operation.

Referring back to FIG. 6, the program circuit 600 may perform a program operation to program selected memory cells fastest or in as short of a time as possible if it can sufficiently program the selected memory cells by applying only a single program pulse for as short of a pulse duration as possible, and skip verifying the selected memory cells. In other words, the program circuit 600 may perform a program operation in as short amount of time if it programs selected memory cells by performing only one program-only cycle and/or only one program stage to sufficiently program the selected memory cells. A storage scheme where the program circuit 600 performs program operations by applying only a single program pulse and by skipping the verify operation is referred to as a single pulse program-only scheme or a single program-only cycle scheme.

Figure 10:
FIG. 10 is a schematic diagram of a program operation performed with single program-only cycles.
Figure 10:
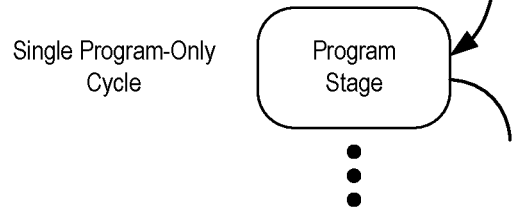
Figure 10:
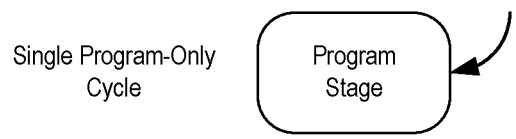

FIG. 10 is a schematic diagram of the program circuit 600 performing single program-only cycles to perform program operations. As shown in FIG. 10, the program circuit 600 may perform a first program operation by performing only one or a single program-only cycle. After performing the program stage of the single program-only cycle, the program circuit 600 may transition to another or next program operation to program a new set of selected memory cells. The new set of selected memory cells may be coupled to the same word line as the prior set of selected memory cells, or in a different word line. For example, after programming a word line cell group coupled to a first word line, the program circuit 600 may program another word line cell group (or string) coupled to the same, first word line, or may program another word line cell group (or string) coupled to a different, second word line. Regardless, the next program pulse that the program circuit 600 outputs will be to program a new word line cell group (or string) of memory cells.

Programming data into memory cells according to a single pulse program-only scheme may be particularly applicable for SLC program operations. An SLC program operation is a program operation where single bits of data are programmed into memory cells. In an SLC program operation, the program circuit 600 programs SLC data (i.e., single bits of data) into selected memory cells. As a result of an SLC program operation, the selected memory cells are configured or programmed as SLC cells—i.e., they each store one bit or a single bit of data. For an SLC program operation to program SLC data into a plurality of memory cells (e.g., a word line cell group or string), the program circuit 600 is to keep a first set of the memory cells in the erase state, and to program a second set of the memory cells into memory state A. Since SLC programming includes only one program state above the erase state, reference to programming a memory cell into memory state A (or a memory cell in or programmed in the erase state) and reference to programming a memory cell in the program state (or a memory cell in or programmed in the program state) may be used interchangeably. Also, for clarity, for an SLC program operation, the entire word line cell group or string being programmed is referred to as a selected word line cell group or selected string, and includes the selected memory cells of the SLC program operation. Those selected memory cells of the selected word line cell group (or selected string) that are programmed into memory state (or the program) state are referred to as program-enabled selected memory cells (or just program-enabled memory cells), and those selected memory cells of the selected word line cell group (or selected string) that remain in the erase state during the SLC program operation are referred to as program-inhibited selected memory cells (or just program-inhibited cells). During the SLC program operation, the memory cells of the block other than those that are part of the selected word line cell group (or selected string) are the unselected memory cells. Additionally, in particular example configurations, an SLC cell in the erase state stores a data "1" value, and an SLC cell programmed into memory state A (or the program state) stores a data "0" value, as shown in FIG. 5A. However, in other example configurations, SLC cells in the erase state store a data "0" value and SLC cells in memory state A (or the program state) store a data "1" value.

Programming data into a block according to a single pulse program-only scheme may not be possible if the program circuit 600 programs data into different regions of the block the same way. As used herein, a region of a block (referred to as a block region (BLKR)) is portion of a block that includes at least one memory cell. The program circuit 600 may program a block region by programming the memory cells that are part that block region. The program circuit 600 may program data into different block regions the same way by applying the control line voltages at the same levels when programming the different regions of the block during respective program stages.

Programming data into a block according to a single pulse program-only scheme may not be possible due to the limitations provided by the physical structure of the block. One limitation is a variation in resistor-capacitor (RC) delay due to memory cells having varying distances from the row decoder circuit 614. The limitation due to RC delay variation is illustrated in FIG. 11.

Figure 11:
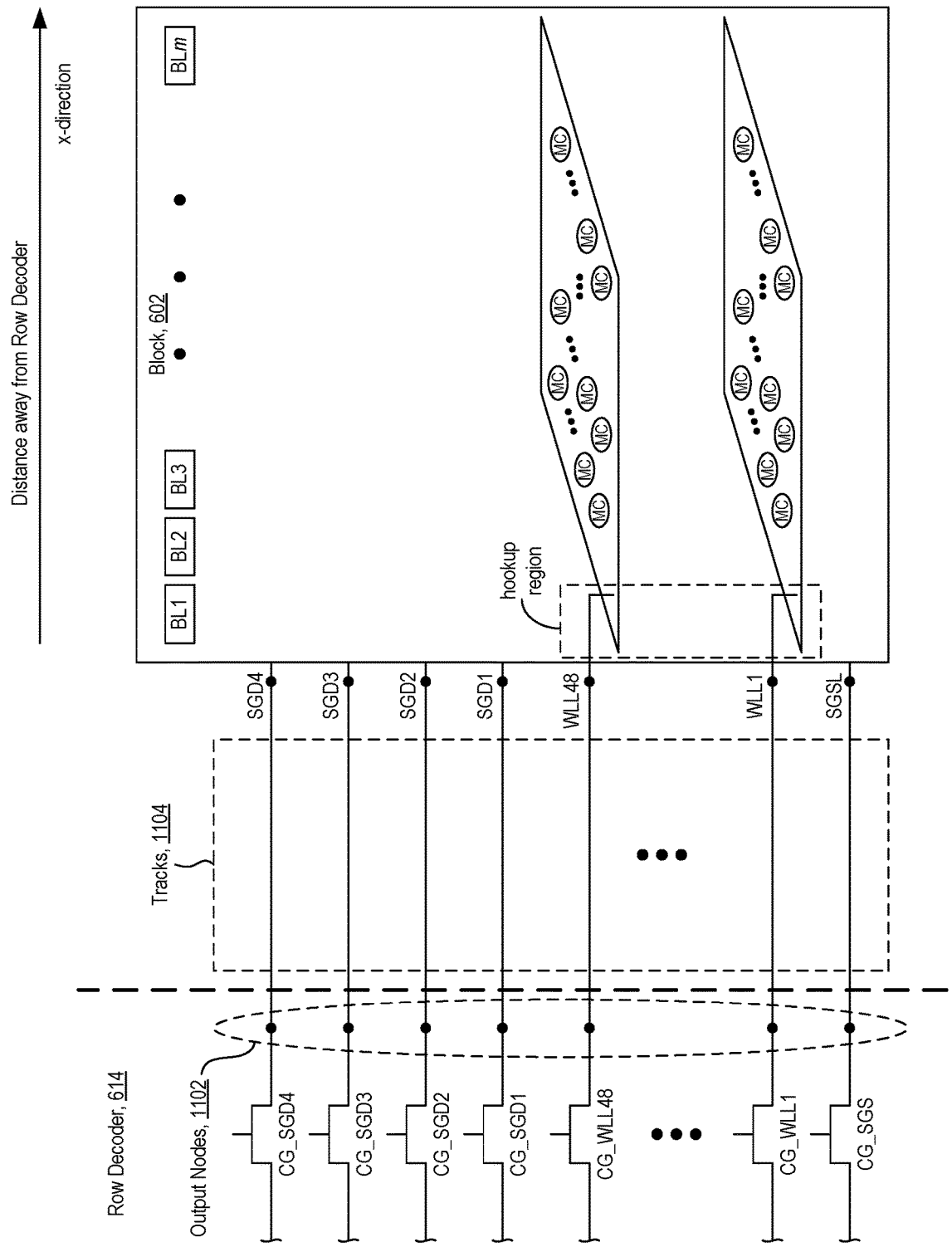
FIG. 11 is a schematic diagram illustrating variable memory cell distance away from a row decoder circuit.

FIG. 11 is a schematic diagram illustrating how memory cells can have varying distances away from the row decoder circuit 614. For at least some example configurations, the row decoder circuit 614 may include control gate switches (e.g., transistors) CG that output or supply the control gate voltages to a block. Terminals of the control gate switches CG may function or serve as output terminals 1102 of the row decoder circuit 614. The control gate switches CG (or the row decoder circuit 614 generally) may supply the control gate voltages to the control gate layers from the output terminals 1102 to the control gate lines by way of tracks 1104. As used herein, a track is an elongate conductive structure configured to communicate or supply a voltage. A track may include a single type of conductive structure or a combination of conductive structures, non-limiting examples of which include conductive traces and conductive vias. The tracks 1104 may be disposed and/or extend in any of the lower, intermediate, and/or upper regions 404, 406, 408 (FIG. 4A) to connect the output terminals 1102 to the control gate lines of a block. In addition, as shown in FIG. 11, the tracks may extend from the output terminals 1102 to the control gate lines, and connect to or contact the control gate lines in an area or region of the block referred to as a hookup region 1106.

As illustrated in FIG. 11, due to the two-dimensional or planar structure of the word line layers, the memory cells disposed or arranged in the word line layers WLL have varying distances or positions away from the hookup region 1106, and in turn varying distances or positions away from the row decoder circuit 614. Relative distances or positions of the memory cells of a block from the row decoder circuit 614 may be measured from the physical locations of the memory cells in the block from the output terminals 1102 of the row decoder circuit 614. A particular way of determining a distance or a position of a memory cell coupled to a word line layer is a distance or length of the memory cell from the hook up region of the word line layer and a length of the track coupling the word line layer to an output node of the row decoder circuit 614. Other ways of determining distances or positions of memory cells from the row decoder circuit 614 may be possible.

Memory cells coupled to the same word line layer may have varying distances from the row decoder circuit 614, with some memory cells being closer to or farther from the row decoder circuit 614 than others. In addition, for at least some example configurations, distances of the memory cells from the row decoder circuit 614 may be directly proportional to distances of the bit lines to which they are coupled from the row decoder circuit 614. The farther away a bit line is from the row decoder circuit 614, the farther away the memory cells coupled to the bit line are positioned in the block from the row decoder circuit 614. As an example with reference to FIG. 6, the m-number of bit lines BL1 to BLm may extend parallel to each other, and may be positioned relative to the row decoder circuit 614 such that the first bit line BL1 is the closest of the bit lines BL to the row decoder circuit 614, and the mth bit line BLm is the farthest bit line of the bit lines BL to the row decoder circuit 614. The closer a bit line is to the first bit line BL1, the closer that bit line is to the row decoder circuit 614, and the closer a bit line is to the mth bit line BLm, the farther that bit line is from the row decoder circuit 614.

In addition or alternatively, irrespective of the bit lines' physical positions from the row decoder circuit 614, the addresses or numbers assigned to bit lines of a block may indicate the relative distances or positions of the memory cells to which they are coupled from the row decoder circuit 614. The addressing or numbering may be directional proportional to the distances or positions of the memory cells—i.e., the higher a bit line address or number in the range that a bit line has or is assigned, the farther the memory cells coupled that bit line are from the row decoder circuit 614. For other example configurations, the addressing or numbering may be inversely proportional to the distances or positions of the bit lines from the row decoder circuit 614—i.e., the higher a bit line address or number in the range that a bit line has or is assigned, the closer the memory cells coupled to that bit line are from the row decoder circuit 614. For simplicity, as used hereafter, the higher that a bit line is addressed or numbered, the farther the bit line and the memory cells coupled to the bit line are positioned from the row decoder circuit 614.

Due to the two-dimensional or planar structure of the word line layers, the word line layers may provide RC delay variation across their planar structure as they generate their respective word line voltages. Because memory cells have different distances or positions from the row decoder circuit 614, they may respond differently as a result of the RC delay variations in proportion to their relative distances from the row decoder circuit 614. One way that they respond differently is that for a plurality of memory cells coupled to a word line, the farther a memory cell is away from the row decoder circuit 614, the smaller it changes or shifts its threshold voltage in response to a program pulse applied or generated on the word line.

As used herein, a threshold voltage shift is an amount that a threshold voltage level shifts or changes. A threshold voltage shift may be tied to or associated with a particular time period, such as a particular portion of a program operation, and/or a particular event, such as application of a program pulse to a word line. For example, a threshold voltage shift of a program stage or a program cycle is the amount that a threshold voltage of a memory cell changes or shifts in response to a program pulse during the program stage or program cycle.

In addition, as used herein, a threshold voltage shift collection is a collection of threshold voltage shifts. The threshold voltage shift collection may be derived from a collection of memory cells. The collection of memory cells may be a block of memory cells, or a portion of the block of memory cells, as non-limiting examples. The threshold voltage shift collection may include the threshold voltage shifts that each of the memory cells of the collection provide in response to a same event or a same type of event, such as the threshold voltage shift that each of the memory cells of the collection provide in response to a respective program pulse.

A threshold voltage shift collection may have mathematical statistics associated with it or that can be derived from it, including a threshold voltage shift range, a threshold voltage shift range difference, and a threshold voltage distribution. A threshold voltage shift range is a range defining an upper bound and a lower bound of the threshold voltage shift collection. The upper bound is the largest threshold voltage shift of the collection of threshold voltage shifts, and the lower bound is the smallest threshold voltage shift of the collection of threshold voltage shifts. A threshold voltage shift range difference is a difference between the upper bound and the lower bound of a threshold voltage shift range. A threshold voltage shift distribution of a collection of memory cells is a number of memory cells of the collection as a function of threshold voltage shift.

Due to RC delay variation across a word line, a plurality of program-enabled memory cells coupled to a word line may experience different threshold voltage shifts, with those program-enabled memory cells positioned closer to the row decoder circuit 614 experiencing larger threshold voltage shifts, and those program-enabled memory cells positioned farther from the row decoder circuit 614 experiencing smaller threshold voltage shifts. Accordingly, a plurality of program-enabled memory cells responding to a program pulse may yield a threshold voltage shift range, with those program-enabled memory cells positioned closer to the row decoder circuit 614 providing threshold voltage shifts that are generally closer to the upper bound of the range, and those program-enabled memory cells positioned farthest from the row decoder 614 providing threshold voltage shifts that are generally closer to the lower bound of the range.

Another limitation is resistance (R) variation among the word line layers of a stack. For some example configurations, due to fabrication techniques the channel or memory hole diameter decreases in the z-direction toward the substrate, resulting in word line layers that are positioned higher in the stack having higher resistance and word line layers positioned lower in the stack having lower resistance. A result is that memory cells in or coupled to the same bit line or otherwise considered to be the same distance or position away from the row decoder circuit 614, but coupled to different word line layers may respond differently to a program pulse of the same program pulse level VPGM, with memory cells coupled or positioned in word line layers higher in the stack experiencing generally higher threshold voltage shifts.

In view of the limitations of RC delay variation across a word line (in the x-direction) and the WL R variation across word lines (in the z-direction), programming a block of memory cells according to a single pulse program-only scheme may provide too wide a range of threshold voltage shifts if the program voltages applied to the block are the same for all of the block regions for practical implementation. Reducing the pulse width of the program pulse in order to shorten the program operation may only augment the RC delay and word line resistance (WL R) limitations, widening the threshold voltage shift range.

In the present application, the program circuit 600 is configured to overcome the limitations provided by the RC delay and WL R variations by applying program voltages to blocks two-dimensionally dependent on locations or positions of program-enabled memory cells from the row decoder circuit 614 and the height of the program-enabled memory cells in the blocks. To do so, the program circuit 600 separates or divides the blocks into bit line zones BLZ and word line zones WLZ. At the intersection of a bit line zone and a word line zone is a block region BLKR. The program circuit 600 programs memory cells in different block regions BLKR by biasing the control lines coupled to the memory cells differently, depending on the two-dimensional position of block regions BLKR in which the memory cells are located.

The program circuit 600 is configured to apply the program voltages two-dimensionally to a block by biasing selected bit lines, and in turn drain ends of selected channels, at different selected bit line levels (or selected channel levels or selected drain-side levels) dependent on the different block regions BLKR positioned in different bit lines zones BLZ and different word line zones WLZ. As used herein, a selected channel is a channel of a block that is coupled to a program-enabled memory cell during a program operation. Additionally, a selected channel is a channel that is biased, such as by having one of its ends (such as its drain end for at least some example configurations) with a selected bit line voltage (or a selected channel voltage (e.g., a selected drain-side voltage where the channel is biased by way of its drain end)) during a program operation. An unselected channel is a channel that is coupled to a program-inhibited memory cell during a program operation. Additionally, an unselected channel is a channel that is biased, such as by having one of its ends (such as its drain end for at least some example configurations) with an unselected bit line voltage (or an unselected channel voltage (e.g., an unselected drain-side voltage where the channel is biased by way of its drain end)) during a program operation.

The two-dimensional biasing of the selected bit lines or selected channels may offset the effects of the RC delay and resistance (R) variations over the block. In particular, the program circuit 600 may bias selected bit lines that are part of different bit line zones BLZ with selected bit line voltages (or selected channel (e.g., drain-side) voltages) at different selected bit line levels (or selected channel (e.g., drain-side) levels) in order to offset the effect of RC delay variation across a word line as a function of distance (in the x-direction) from the row decoder circuit 614. In addition, the program circuit 600 may bias selected bit lines or selected channels that are part of different word lines zones WLZ with selected bit line voltages (or selected channel (e.g., drain-side) voltages) at different selected bit line (or channel (e.g., drain-side)) levels in order to offset the effect of word line resistance (WL R) variation across word lines as a function of height (or distance in the z-direction) from the substrate.

The two-dimensional biasing of the selected bit lines or selected channels may allow for enhanced storage schemes that allow for data to be programmed faster or more efficiently. An example enhanced storage scheme is an SLC storage scheme that includes programming SLC cells according to a single-pulse program-only scheme, as previously described with reference to FIG. 10. That is, a program circuit implementing the two-dimensional selected bit line (or channel) biasing can program blocks of SLC cells by applying a single program pulse to selected memory cells of a block (e.g., a selected word line cell group of the block) without verifying the selected memory cells in order to sufficiently program the program-enabled memory cells. Because the program circuit biases the selected bit lines or selected channels according to the two-dimensional biasing, the threshold voltage shift ranges, the threshold voltage shift range differences, and/or the threshold voltage shift distributions that the programmed SLC cells provide in response to being biased by a single voltage pulse are sufficiently controlled or sufficiently small enough for subsequent read operations to be performed successfully—i.e., the SLC cells can be read without too high an amount of errors.

Figure 12:
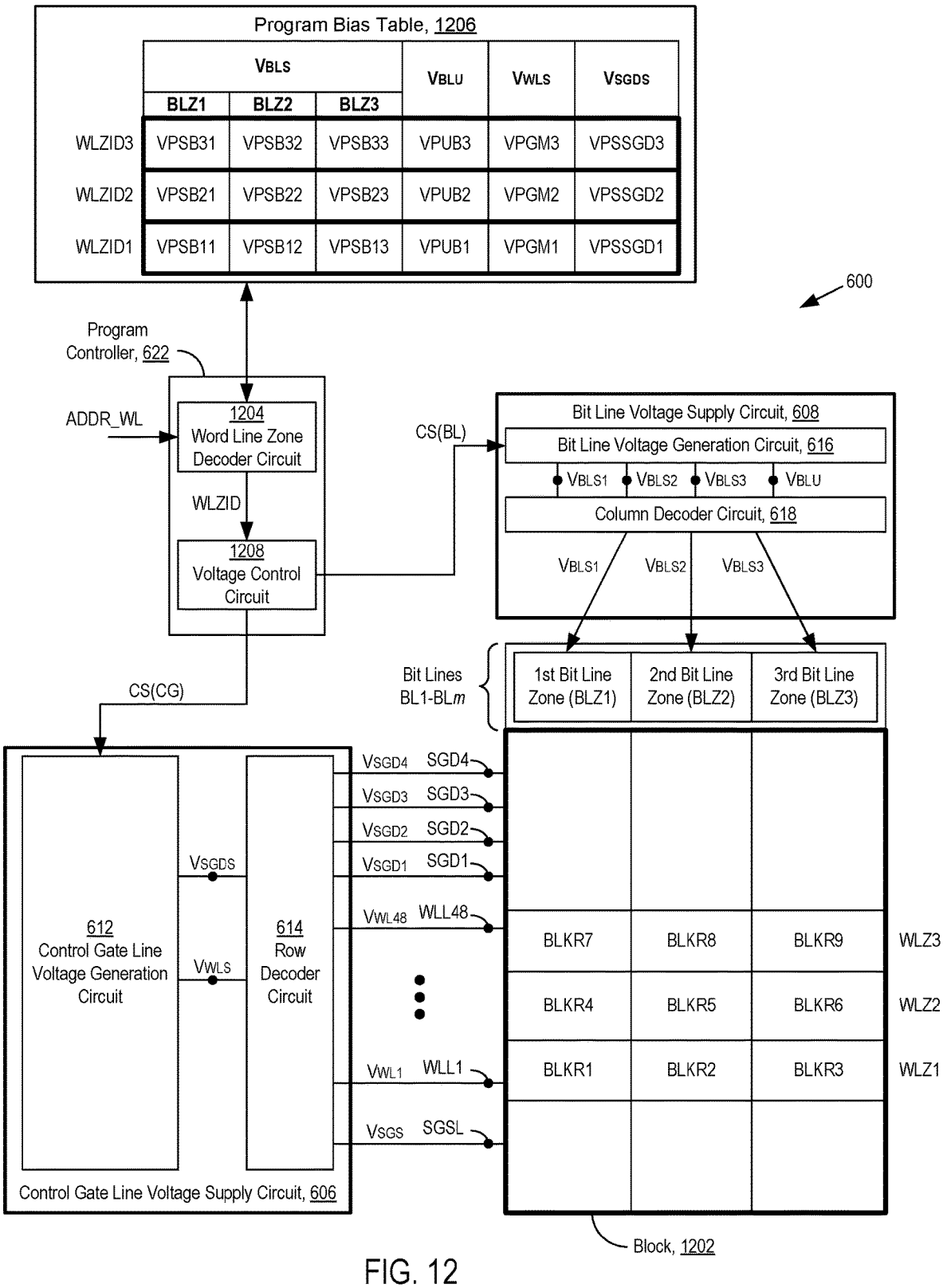
FIG. 12 is a block diagram of the program circuit of FIG. 6, further configured to two-dimensionally apply program voltages to a block and/or perform program operations according to a single pulse program-only scheme.

In further detail, FIG. 12 is an example configuration of the program circuit 600 configured to program data into a block 1202 based on two-dimensional block regions BLKR. The block 1202 may be a block of the memory cell structure 142 of FIG. 2B, one of the blocks BLK in FIG. 3A, 3B, or 4A, have the physical construction or structure of the block 410 in FIGS. 4B, 4C, have the circuit configuration of the block 480 in FIG. 4D, and/or representative of the block 602 of FIG. 6. Corresponding to the blocks 480 in FIG. 4D and the block 602 in FIG. 6, the block 1202 includes an m-number of bit lines BL1 to BLm, and a set of control gate lines, including four SGD lines SGD1, SGD2, SGD3, SGD4, forty-eight word lines WLL1 to WLL48, and an SGS line SGSL. As mentioned previously described with reference to the blocks 480, 602 of FIGS. 4D, 6, these configurations and/or numbers of control gate lines are merely exemplary, and other configurations or numbers of the control gate lines are possible.

For the example configuration of FIG. 12, the program circuit 600 is configured to separate or divide the block into three word line zones WLZ1, WLZ3, WLZ3, and three bit line zones BLZ1, BLZ2, BLZ3. The three word line zones and the three bit line zones are merely exemplary, and other numbers of word line zones or bit line zones are possible. As used herein, a word line zone is a single word line or a collection of word lines of a block, and a bit line zone is a single bit line or a collection of bit lines of a block. The program circuit 600 may divide a block into word line zones WLZ in order to divide a block into different volumes of varying height. In addition, the program circuit 600 may divide a block into bit line zones BLZ in order to divide the block into different volumes of varying distances from the row decoder circuit 614. The result, as shown in FIG. 12, is a collection or a plurality of two-dimensionally arranged block regions BLKR, each formed at the intersection of a word line zone WLZ and a bit line zone BLZ.

With respect to the word line zones (WLZ), the program controller 622 may organize, arrange, group, or zone a block based on height by arranging the word lines of a block into a plurality of word line zones (WLZ). The number of word line zones may vary for any of various example configurations. At a minimum, the number of word line zones is two. At a maximum, the number of word line zones is equal to the number of word lines of a block.

The program controller 622 may arrange or zone the word lines into the word line zones according to their height in a stack of the block. A higher word line zone is a word line zone that has word lines positioned higher in a stack than the word lines of another word line zone. In addition, a lower word line zone is a word line zone that has word lines positioned lower in the stack than the word lines of another word line zone. In general, the word lines zones do not have word lines that overlap in height, meaning that for a first word line zone that is higher than a second word line zone, all of the word lines of the first word line zone are higher in the stack than all of the word lines of the second word line zone.

In general, as used herein, word line height is referenced with respect to a position in the z-direction away from the substrate. The farther away a word line is from the substrate, the higher the word line is in the block, and the closer a word line is to the substrate, the lower the word line is in the block.

In addition, in the example configurations described herein, the program controller 622 uses a word line address or numbering scheme to uniquely identify the word lines of a block in a way that identifies their relative heights. The word line address or numbering scheme includes a range of word line address or numbers that the program controller 622 assigns or addresses to each of the word lines of a block. In the example configurations described herein, the program controller 622 assigns higher word line addresses or numbers in the range to higher word lines in the stack. Accordingly, the higher the word line address or number of a word line, the higher in the stack the word line is positioned. Other word line addressing schemes are possible, including those that use decreasing addressing or numbering for increasing word line height.

In addition, with respect to bit line zones (BLZ), the program controller 622 may organize, arrange, group, or zone the bit lines of a block into a plurality of bit line zones (BLZ). The number of bit line zones may vary for any of various example configurations. For a given example configuration, at a minimum, the number of bit line zones is two. At a maximum, the number of bit line zones is equal to the number of bit lines of a block.

The program controller 622 may arrange or zone the bit lines into the bit line zones according to their distance or position away from the row decoder circuit 614. Herein, a distance or a position of a bit line of a block is a relative distance or position of the bit line from the row decoder circuit 614 relative to distances or positions of the other bit lines of the block from the row decoder circuit 614. The relative distances of the bit lines may be actual distances or positions of the bit lines from the row decoder circuit 614, or may be effective distances or positions that correspond to distances or positions of the memory cells from the row decoder circuit 614 coupled to the bit lines. For example, a first bit line is farther from the row decoder circuit 614 than a second bit line where the first bit line is actually positioned a farther distance from the row decoder circuit 614 than the second bit line, or where the first bit line is coupled to memory cells that are positioned a farther distance from the row decoder circuit 614 than the memory cells coupled to the second bit line irrespective of whether the first bit line is actually farther than the second bit line. Additionally, in general, the bit line zones do not have bit lines that overlap in distance, meaning that for a first bit line zone that has a greater distance or position from the row decoder circuit 614 than a second word line zone, all of the word lines of the first word line zone are farther away from the row decoder circuit 614 than all of the word lines of the second word line zone.

In addition, the program controller 622 may use a bit line address or numbering scheme that uniquely identifies the bit lines of a block. In some example configurations, the program controller 622 may use the bit line address or numbering scheme to map the bit lines of a block each to one of the different bit line zones BLZ. In turn, the program controller 622 can control the column decoder circuit 618 to route different selected bit line (or selected channel (e.g., drain-side)) voltages to selected bit lines and/or channels positioned in the different bit line zones BLZ.

Figure 13:
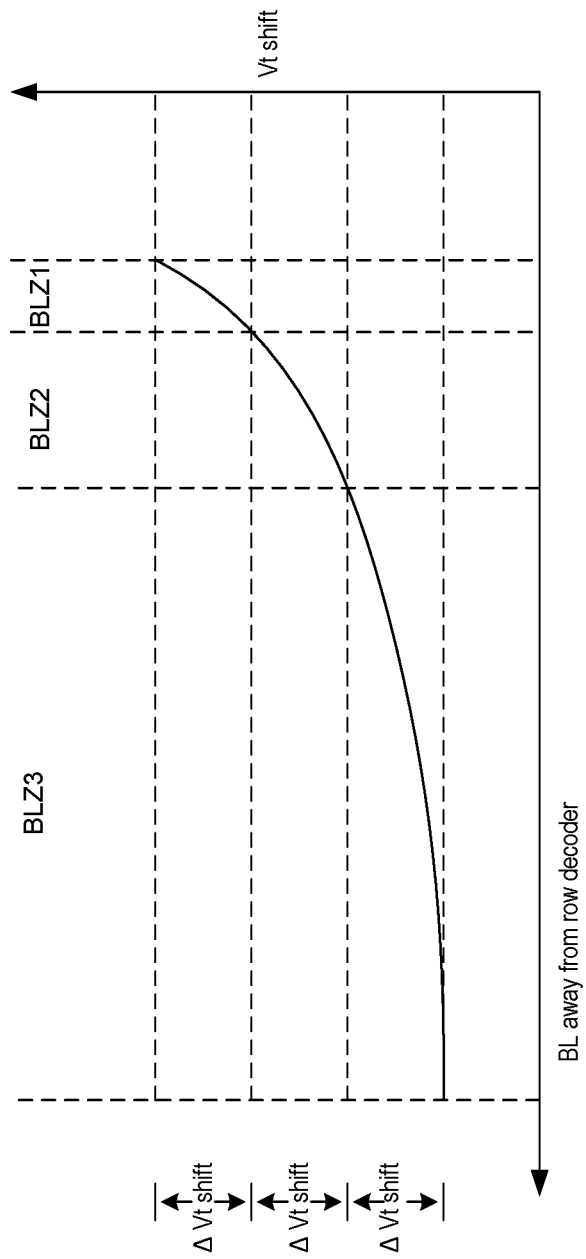
FIG. 13 is a plot of voltage threshold shift as a function of position away from a row decoder.
Figure 14:
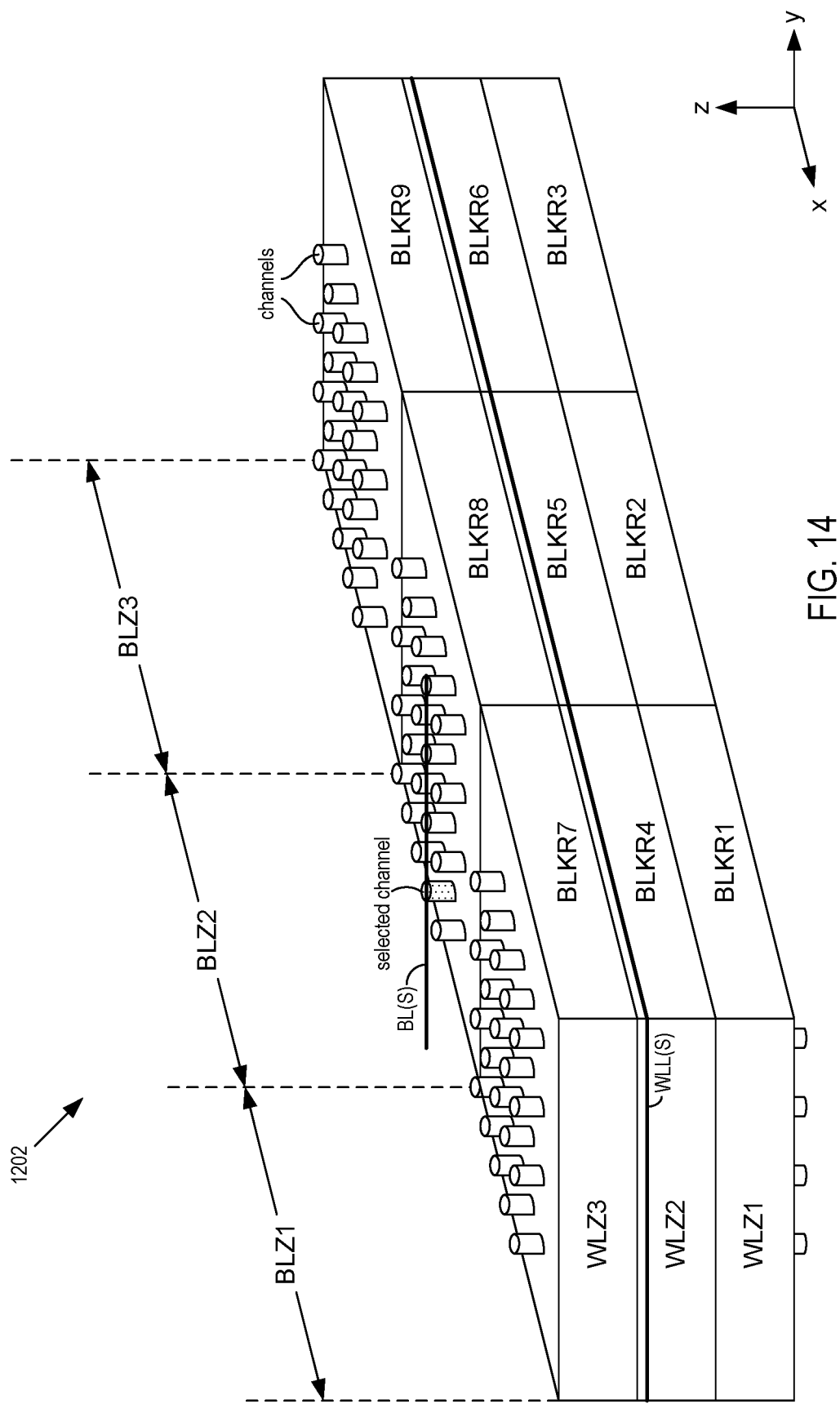
FIG. 14 is a perspective view of a block divided into word line zones and bit line zones.

For particular example configurations, the number of bit lines in the bit line zones BLZ is directly proportional to the threshold voltage shift range differences among the memory cells coupled the bit lines in the different bit line zones BLZ. To illustrate, FIG. 13 shows an example plot of threshold voltage shifts of memory cells coupled to a word line in response to a single program pulse. FIG. 14 shows that the memory cells exhibit decreasing threshold voltage (Vt) shifts as their positions away from the row decoder circuit 615 increases, due to RC delay across the word line. In addition, as shown in FIG. 13, the decrease in threshold voltage shift is non-linear. That is, the threshold voltage shifts are decrease at a slower rate for memory cells farther away from the row decoder circuit 614.

The number of bit lines in the bit line zones BLZ may be proportional to the decrease in threshold voltage shift in that the bit line numbers in the bit line zones becomes increasingly larger in direct proportion to the decreasing rate of threshold voltage shift decrease as the memory cells (or bit lines) are positioned farther from the row decoder circuit 614. Accordingly, in FIG. 13, the third bit line zone BLZ3 positioned farthest from the row decoder circuit 614 has the largest number of bit lines, the first bit line zone BLZ1 positioned closest to the row decoder circuit 614 has the smallest number of bit lines, and the second bit line zone BLZ2 positioned in between the first and third bit line zones BLZ1, BLZ3 has an intermediate number of bit lines in between the largest and smallest number of bit lines of the third and first bit line zones BLZ3, BLZ1. Additionally, the bit lines of a particular bit line zone BLZ may provide a threshold voltage shift range from a high threshold voltage shift level to a low threshold voltage shift level, and in turn an associated threshold voltage shift range difference between the high level and the low level (labeled $\Delta$ Vt shift in FIG. 13). As illustrated in FIG. 13, the numbers of bit lines in each of the bit line zones BLZ may be set so that the threshold voltage shift range differences ($\Delta$ Vt shift) are the same or as close to the same as possible.

With respect to the configuration in FIG. 12, a first word line zone WLZ1 is the lowest zone of the block 1202, a second word line zone WLZ2 is a middle word line zone of the block 1202, and a third word line zone WLZ3 is the highest word line zone of the block 1202. In addition, a first bit line zone BLZ1 is the closest zone of the block 1202 to the row decoder circuit 614, a second bit line zone BLZ2 is a middle bit line zone of the block 1202, and the third bit line zone is the farthest bit line zone of the block 1202 from the row decoder circuit 614.

In the example configuration of FIG. 12, the three word line zones WLZ1, WLZ3, WLZ3 and the three bit line zones BLZ1, BLZ2, BLZ3 divide or separate the block into nine different block regions, BLKR1-BLKR9. A first set of three blocks BLKR1, BLKR2, BLKR3 are part of or in the lowest word line zone WLZ1, a second set of three blocks BLKR4, BLKR5, BLKR6 are part of or in the middle word line zone WLZ2, and a third set of three blocks BLKR7, BLKR8, BLKR9 are part of the highest word line zone WLZ3. Additionally, the first, fourth, and seventh block regions BLKR1, BLKR4, BLKR7 are part of the first bit line zone BLZ1 closest to the row decoder circuit 614; the second, fifth, and eighth block regions BLKR2, BLKR5, BLKR8 are part of the middle bit line zone BLZ2; and the third, sixth, and ninth block regions BLKR3, BLKR6, BLKR9 are part of or in the farthest bit line zone BLZ3 from the row decoder circuit 614.

FIG. 14 shows a three-dimensional perspective view of the block 1202. As shown in both FIGS. 12 and 14, the bit line zones BLZ extend end-to-end in the x-direction across the word lines and their respective word line zones WLZ. Accordingly, when the program circuit 600 programs one or more pages of data into selected memory cells (e.g., of a selected word line cell group or a selected string) coupled to a selected word line (e.g., a selected word line WLL(S)

positioned in the second word line zone WLZ2 in FIG. 14), the bit line zones BLZ that include the selected memory cells extend from one end of the selected word line WLL(S) to the other end of the selected word line WLL(S).

Additionally, the channels extend in the z-direction through the word lines and their respective word line zones WLZ. In addition, when the program circuit 600 applies a selected bit line voltage or selected channel voltage to a selected channel, by way of a selected bit line BL(S) coupled to the selected channel to program a program-enabled memory cell, the program circuit 600 biases the selected channel, which extends in the z-direction such that it intersects the word line zone (e.g., WLZ2 in FIG. 14) that includes the selected word line WLL(S).

In addition, as illustrated in FIG. 14, each of the channels is part of or disposed, positioned, or located (in the z-direction) in one of the bit line zones BLZ. The bit line zone BLZ in which a channel is positioned is the bit line zone BLZ in which the bit line to which the channel is coupled is positioned or located. For example, FIG. 14 shows a selected channel coupled to a selected bit line BL(S) that is part of the second bit line zone BLZ2. Accordingly, the selected channel coupled to the selected bit line BL(S) is part of or located in the second bit line zone BLZ2.

In further detail referring to FIG. 12, for a program operation, the selected memory cells are disposed or located in multiple block regions BLKR that are part of different bit line zones BLZ but in the same word line zone WLZ. To program the selected memory cells, the program circuit 600 is configured to bias selected bit lines or selected channels in the different bit line zones BLZ with different selected bit line voltages (or selected channel voltages (e.g., drain-side voltages)) at different selected bit line levels (or selected channel levels).

The different selected bit line levels (or selected channel level (e.g., drain-side levels)) form a set or a range of decreasing voltage levels (or program levels) that extends from a high selected bit line level to a low selected bit line level (or from a high selected channel level (e.g., drain-side level) to a low selected channel level (e.g., drain-side level)). The high selected bit line level (or high selected channel level (e.g., drain-side level)) is the upper bound of the range, and is the highest selected bit line level (or highest selected channel (e.g., highest drain-side level)) of the range or set at which to bias selected bit lines (or selected channels (e.g., drain ends of selected channels)) coupled to program-enabled memory cells during a program operation. The low selected bit line level (or low selected channel level (e.g., low selected drain-side level)) is the lower bound of the range, and is the lowest selected bit line level (or lowest selected channel level (e.g., the lowest selected drain-side level)) of the range at which to bias selected bit lines (or selected channels (e.g., drain ends of selected channels)) coupled to program-enabled memory cells during a program operation.

For some example embodiments, the low selected bit line (or selected channel) level is the ground reference voltage of 0 V, and the high selected bit line (or selected channel level) is a positive voltage (with reference to the ground reference of 0 V). In addition or alternatively, for some example embodiments, the high selected bit line (or selected channel) level is in a range of about 0.05 V to 1.5 V. For other example embodiments, the high selected bit line (or selected channel) level is in a range of about 0.1 V to 1.2 V. For other example embodiments, the high selected bit line (or selected channel) level is in a range of about 0.2 V to 1 V. In addition for some example embodiments, the low selected bit line (or selected channel) level is in a range of about 0 V to 0.2 V. In other example embodiments, the low selected bit line (or selected channel) level is in a range of about 0 V to 0.1 V. In other example embodiments, the low selected bit line (or selected channel) level is in a range of about 0 V to 0.05 V.

In order to offset RC delay variations, the program circuit 600 biases selected bit lines (or selected channels (e.g., drain ends of selected channels)) of the bit line zone BLZ1 closest to the row decoder circuit 614 with the highest selected bit line voltage (i.e., a selected bit line voltage at the high selected bit line level, and biases selected bit lines (or selected channels (e.g., drain ends of selected channels)) of the bit line zone BLZ3 farthest from the row decoder circuit 614 with the lowest selected bit line voltage (i.e., a selected bit line voltage at the low selected bit line level).

For example configurations that include only two bit line zones, the high selected bit line voltage (or selected channel voltage) and the low selected bit line voltage (or selected channel voltage) form the range or set of decreasing selected bit line voltage levels. For example configurations that include more than three bit line zones, the set of decreasing selected bit line voltage levels (or decreasing selected channel levels) includes at least one middle or intermediate selected bit line (or selected channel) voltage level in between the high selected bit line (or high selected channel) level and the low selected bit line (or low selected channel) level. For such configurations, the set of selected bit line (or selected channel) levels may continuously decrease from the high selected bit line (or selected channel) level to the low selected bit line (or seleted channel) level. The program circuit 600 biases the selected bit lines (or selected channels) in the different bit line zones with the set of decreasing selected bit line (or selected channel) voltages in direct proportion or correspondence with the increasing distance or position of the bit line zones BLZ from the row decoder circuit 614.

In addition, for example configurations that include more than two bit line zones BLZ, the set of decreasing voltage levels may decrease in various ways depending on the number of bit line zones BLZ and the effect that the RC delay variation across a word line has on the memory cells. The set of decreasing voltages may decrease linearly, non-linearly, or a combination of the two. For example, a set of decreasing voltages may decrease linearly over a first sub-set and may decrease non-linearly over a second sub-set.

In addition, in order to offset word line resistance (WL R) variation across word lines in the z-direction, the program circuit 600 may be configured to bias selected bit lines (or selected channels) differently to program different sets of selected memory cells located in different word line zones (BLZ). In particular, the program circuit 600 may be configured to bias selected bit lines (or selected channels) with higher selected bit line or selected channel (e.g., selected drain-end) voltages (i.e., selected bit line or selected channel voltages at higher selected bit line or selected channel levels) to program selected memory cells located in higher word line zones. The increase in selected bit line or selected channel voltages may pertain to the respective bit line zones. That is, when programming data located in a higher word line zone, the program circuit 600 may be configured to increase the levels of all of the selected bit line voltages (or selected channel voltages), or keep at least one voltage at the same level. In addition, for some example configurations, the program circuit 600 may keep the selected bit line voltage (or selected channel voltage) applied to the bit line zone located farthest from the row decoder circuit 614 at the same lowest selected bit line voltage level for each of the word line zones. In particular example embodiments, the program circuit 600 biases selected bit lines (or selected channels) in the bit line zone farthest from the row decoder circuit 614 with the ground reference voltage 0 V when programming memory cells disposed in or coupled to each of the word line zones WLZ.

Accordingly, when programming a block across the different word line zones WLZ, the program circuit 600 may bias selected word lines (or selected channels) located or positioned in the same bit line zone with a set or range of selected bit line (or selected channel (e.g., selected drain-side)) voltages that extends from a low selected bit line (or selected channel) level to a high selected bit line (or selected channel level). The low selected bit line (or selected channel (e.g., drain-side)) level is the level at which the program circuit 600 biases selected word lines (or selected channels) of a given bit line zone BLZ when programming data into selected memory cells located in the lowest word line zone WLZ, and the high bit line (or selected channel (e.g., drain-side)) level is the level at which the program circuit 600 biases selected word lines (or selected channels) of the given bit line zone BLZ when programming data into selected memory cells located in the highest word line zone.

For some example embodiments, when programming data into block regions BLKR that are part of the closest bit line zone, the low selected bit line (or selected channel) level is in a range from about 0.05 V to about 0.5 V. For other example embodiments, when programming data into block regions BLKR that are part of the closest bit line zone, the low selected bit line (or selected channel) level is in a range from about 0.1 V to about 0.3 V. For other example embodiments, when programming data into block regions BLKR that are part of the closest bit line zone, the low selected bit line (or selected channel) level is about 0.2 V. In addition, for some example embodiments, when programming data into block regions BLKR that are part of the closest bit line zone, the high selected bit line (or selected channel) level is in a range from about 0.5 V to about 1.5 V. For other example embodiments, when programming data into block regions BLKR that are part of the closest bit line zone, the high selected bit line (or selected channel) level is in a range from about 0.8 V to about 1.2 V. For other example embodiments, when programming data into block regions that are part of the closest bit line zone, the high selected bit line (or selected channel) level is about 1 V.

In addition, when the program controller 622 determines to perform a program operation to program data into selected memory cells, the program controller 622 is configured to identify a selected word line coupled to the selected memory cells. For example, the program controller 622 may receive or otherwise identify a word line address ADDR_WL identifying the selected word line.

The program controller 622 may include a word line zone decoder circuit 1204 that is configured to identify a word line zone in which the selected word line is positioned or located. As used herein, a word line decoder circuit is a circuit that identifies a word line zone of a block. A word line decoder circuit may be used for program operations. Specifically, a word line decoder circuit may identify a word line zone in which a selected word line of a program operation is disposed or located. A word line decoder circuit may be configured in any of various ways in order to determine or identify a word line zone. For example, a word line decoder circuit may include a conversion circuit or a translation circuit, or be configured to execute a conversion or translation algorithm or otherwise perform a conversion or translation process that converts or translates a word line address of a block to a word line zone of the block. When a word line decoder circuit is provided with a word line address, the word line zone decoder circuit can identify a word line zone in which a word line that is addressed or uniquely identified by the word line address is positioned.

For at least some example configurations, a word line zone decoder circuit may use word line zone identifiers WLZID to uniquely identify the word line zones. Accordingly, through a conversion or translation process operation, a word line decoder circuit may identify a word line zone identifier from among a plurality of word line zone identifiers that uniquely identifies the word line zone in which the word line is positioned or located in the block.

With respect to FIG. 12, when the program controller 622 determines to program selected memory cells coupled to a selected word line, the program controller 622 uses its word line zone decoder circuit 1204 to identify the word line zone in which the selected word line is located. In response to the identified word line zone, the program controller 622 controls the supply of the selected bit line voltages to the selected bit line zones.

For some example configurations, during a program operation, the bit line voltage generation circuit 616 is configured to simultaneously generate a plurality of selected bit line (or selected channel (e.g., drain-side)) voltages $V_{BLS}$ at respective program levels, and the column decoder circuit 618 is configured to supply or route each of the selected bit line (or selected channel (e.g., drain-side)) voltages $V_{BLS}$ to a respective one of the bit line zones BLZ. For example, in the example configuration of FIG. 12, the block 1202 includes three bit line zones BLZ1, BLZ2, BLZ3, and so the bit line voltage generation circuit 616 is configured to simultaneously generate three selected bit line (or selected channel (e.g., drain-side)) voltages $V_{BLS1}$, $V_{BLS2}$, $V_{BLS3}$ at respective program levels. During a program operation, the column decoder circuit 618 is configured to supply or route the three selected bit line (or selected channel (e.g., drain-side)) voltages $V_{BLS1}$, $V_{BLS2}$, $V_{BLS3}$ to the selected bit lines (or selected channels) of the respective three bit lines zones BLZ1, BLZ2, BLZ3 while the row decoder circuit 614 applies the program pulse to the selected word line.

As previously described with reference to FIG. 6, the program controller 622 is configured to control the column decoder 618 through output of a column decoder control signal CTRLCD that controls how the column decoder circuit 618 routes or supplies the selected and unselected bit line voltages to the bit lines BL. In addition, with reference to FIG. 12, the program controller 622 is also configured to know which bit lines BL are part of which bit line zones BLZ. In some example configurations, the program controller 622 may employ a mapping scheme that maps each of the bit lines, such as via their bit line addresses, to one of the bit line zones BLZ. During a given program operation, or a given program stage or a program cycle of the program operation, the program controller 622 may identify which of the bit lines are selected bit lines and which are unselected bit lines, and may further identify the bit line zone BLZ in which each of the selected bit lines is positioned. In response to identifying the bit line zones BLZ in which the selected bit lines are positioned, the program controller 622 may output the column decoder control signal CTRLCD so that the bit line voltage supply circuit 608 applies the different selected bit line (or selected channel (e.g., drain-side)) voltages $V_{BLS1}$, $V_{BLS2}$, $V_{BLS3}$ to the selected bit lines and/or channels according to the bit line zones BLZ in which the selected bit lines are positioned.

Additionally, the program controller 622 is configured to control the program levels at which the bit line voltage supply circuit 608 generates and/or supplies the selected bit line (or selected channel) voltages $V_{BLS}$. The program controller 622 may control the program levels according to a program bias table 1206 that organizes program levels, including the selected bit line levels (or selected channel levels), in a two-dimensional or matrix format. A first dimension of the table 1206 is a set of program selected bit line (or selected channel) levels VPSB of selected bit line (or selected channel) voltages $V_{BLS}$ that the bit line voltage supply circuit 608 simultaneously supplies to selected bit lines (or selected channels) of the different bit line zones BLZ during a program operation. A second dimension of the table 1206 is a list of the different word line zones WLZ of the block. The program controller 622 may control the program levels of the selected bit line (or selected channel) voltages $V_{BLS}$ by controlling the bit line voltage supply circuit 608 to apply the selected bit line voltages to selected bit lines (or selected channel voltages to selected channels) of the different bit line zones BLZ at the program levels VPSB of the set corresponding to the word line zone in which the selected word line is positioned or located.

As shown in FIG. 12, the table 1206 identifies three sets of selected bit line (or selected channel) levels, with each set corresponding to one of the three word line zones WLZ1, WLZ2, WLZ3, and with each set including three selected bit line (or selected channel) levels VPSB corresponding to a respective one of the three bit line zones BLZ1, BLZ2, BLZ3. To program selected memory cells in a block region BLKR formed or defined by an ith word line zone WLZi and a jth bit line zone BLZj, the bit line voltage supply circuit 608 is configured to apply selected bit line voltages (or selected channel (e.g., drain-side) voltages) at an i-jth selected bit line (or selected channel (e.g., drain-side)) level VPSBij as identified in the table 1206 to selected bit lines (or selected channels) of the jth bit line zone BLZj during the program operation.

The sets of selected bit line (or sets of selected channel) levels identified in the table 1206 may each be a set of decreasing selected bit line levels (or a set of decreasing selected channel levels). That is, for a given ith word line zone WLZi, the set of selected bit line (or selected channel) levels VPSBi associated with the given ith word line zone WLZi may be listed in the table 1206 or otherwise arranged in a descending order so that the bit line supply circuit 608 applies the selected bit line (or selected channel) voltages $V_{BLS}$ to the selected bit lines in the different bit line zones BLZ at the ith selected bit line levels VPSBi in a descending order in direct proportion to an increasing position or distance of the bit line zones BLZ away from the row decoder circuit 614. As an example, the table 1206 identifies a third set of three selected bit line (or selected channel) levels VPSB31, VPSB32, VPSB33 at which the bit line voltage supply circuit 608 applies the selected bit line voltages (or selected channel voltages) to the selected bit lines (or selected channels) of the three bit line zones BLZ1, BLZ2, BLZ3 during a program operation to program data into selected memory cells coupled to a target word line in the third word line zone WLZ3. Those three selected bit line levels VPSB31, VPSB32, VPSB33 may define a range where a first level VPSB31 is the highest of the three levels, a third level VPSB33 is the lowest of the three levels, and a second level VPSB32 is in the middle of the first and third levels. The program controller 622 may control the bit line voltage supply circuit 608 so that it applies the first selected bit line voltage (or first selected channel (e.g., drain-side) voltage) $V_{BLS1}$ at the highest level VPSB31 to selected bit lines (or selected channels) of the closest bit line zone BLZ1, the second selected bit line voltage (or second selected channel (e.g., drain-side) voltage) $V_{BLS2}$ at the middle level VPSB32 to selected bit lines (or selected channels) of the bit line zone BLZ2, and the third selected bit line voltage (or third selected channel (e.g., drain-side) voltage) $V_{BLS3}$ at the lowest level VPSB33 to selected bit lines (or selected channels) of the farthest bit line zone BLZ3.

For some example configurations, the program controller 622 is configured to expressly identify the selected bit line (or selected channel) levels VPSB listed in the table 1206 when performing programming operations. For example, the table 1206 may be stored in memory, such as the volatile memory 158 or the non-volatile memory 159, that is accessible to the program controller 622. Upon identifying a word line zone WLZ of a selected word line, the program controller 622 may access the table 1206 in memory, and identify the set of selected bit line levels VPSB corresponding to the identified word line zone WLZ. For example, as shown in FIG. 11, each set of selected bit line levels VPSB is associated with a word line zone identifier WLZID. Upon identifying a word line zone identifier WLZID that identifies the word line zone of a selected word line, the program controller 622 may perform a lookup with the word line zone identifier WLZID in the table 1206 to identify the set of selected bit line levels VPSB to use to perform the program operation. For other example configurations, the program controller 622 is configured to implicitly identify the selected bit line levels VPSB in that upon identifying the word line zone WLZ in which the selected word line is positioned, the program controller 622 is configured to automatically control the bit line voltage supply circuit 606 to apply the selected bit line voltages $V_{BLS}$ at the set of decreasing program selected bit line levels VPSB corresponding to the identified word line zone WLZ without expressly performing a lookup in a table.

The program control circuit 622 may further include a voltage control circuit 1208 that is configured to control the voltage levels of the program voltages that the voltage supply circuit 604 applies to the control lines of a block. As used herein, a voltage control circuit is a circuit that outputs one or more control signals to control a level of a target voltage. A voltage control circuit can control the level of the voltage by outputting a control signal at a level or value that indicates a level of the target voltage. A voltage generation circuit that is responsible for generating the target voltage may respond to the control signal by setting a level of a voltage that it generates so that the target voltage is at the level indicated by the control signal. A voltage control circuit can generate its control signal as either an analog signal or a digital signal. For example, a voltage control circuit may output an analog signal as a gate voltage, where varying levels of the gate voltage control an amount of current that a variable current source supplies to a node, which in turn determines a level of the target voltage. Alternatively, a voltage control circuit may output a digital signal having a digital value indicating a level of the target voltage. A voltage generation circuit may include a circuit capable of changing or setting a voltage level based on a digital signal. For example, a voltage generation circuit may include a current digital-to-analog converter (DAC) that generates a current at an amount corresponding to the digital value of the control signal. As another example, a voltage generation may generate a plurality of voltages simultaneously, and a multiplexer or other type of selection circuit may respond go the digital signal by selectively outputting one of the plurality of voltages. Various ways of configuring a voltage control signal to output a control signal to set or change a level of a target voltage may be possible.

With respect to FIG. 12, the voltage control circuit 1208 may be configured to control the levels at which the bit line voltage supply circuit 608 generates or supplies the selected bit line (or selected channel) voltages $V_{BLS}$ to the selected bit lines (or selected channels) of the different word line zones WLZ. For example, the voltage control circuit 1208 may output a bit line control signal CS(BL) that causes the bit line voltage supply circuit 608 to apply selected bit line (or selected channel (e.g., drain-side)) voltages at the set of decreasing selected bit line (or selected channel) levels according to an identified word line zone. In particular example configurations, the voltage control circuit 1208 outputs the bit line control signal CS(BL) to the bit line voltage generation circuit 616 in order to set the program levels of the selected bit lines (or selected channels) of the different bit line zones BLZ.

To program data in two different word line zones of a block, the program controller 622 may be configured to perform two program operations at two different times—i.e., perform a first program operation first, and a second program operation after performing the first program operation. To perform the first program operation, the program controller 622 may determine to program a first data set into a first group of selected memory cells coupled to a first selected word line located in a first word line zone that it identifies through use of its word line zone decoder circuit 1204. During the first program operation, the program controller 622, through use of its voltage control circuit 1208, controls the bit line voltage supply circuit 608 to supply or apply selected bit line voltages (or selected channel (e.g., drain-side) voltages) at a first set of decreasing selected bit line voltage levels (or decreasing selected channel (e.g., drain-side) voltage levels) corresponding to the identified first word line zone. Then, to perform the second program operation, the program controller 622 may determine to program a second data set into a second group of selected memory cells coupled to a second selected word line located in a second word line zone that it identifies through use of its word line decoder circuit 1204.

Suppose for example that the second word line zone is a higher word line zone. During the second program operation, the program controller 622, through use of its voltage control circuit 1208, controls the bit line voltage supply circuit 608 to supply or apply the selected bit line voltages (or selected channel voltages) at a second set of decreasing selected bit line (or selected channel) voltage levels corresponding to the identified second word line zone. At least one of the levels of the second set is different than a corresponding level of the first set, such that the bit line voltage supply circuit 608 is configured to supply or apply the selected bit line voltages (or selected channel voltages) to the selected bit lines (or selected channels) at one or more different voltage levels when performing the second program operation compared to when performing the first program operation. In particular example configurations, to perform the second program operation, the voltage control circuit 1208 outputs the bit line control signal CS(BL) to cause the bit line voltage generation circuit 616 to change, such as by increasing, a level of at least one of the selected bit line voltages (or selected channel voltages) $V_{BLS}$ it is generating in order to perform the second program operation.

In addition, for at least some example configurations, the program circuit 600 may be configured to set or adjust a level of the unselected bit line voltage (or unselected channel voltages) $V_{BLU}$, the program pulse level PGM of the program pulse (e.g., the voltage level on the selected word line $V_{WLS}$), and/or the selected SGD line voltage $V_{SGDS}$ based on the word line zones WLZ. That is, the program circuit 600 may be configured to apply one or more of these voltages at different levels according to the different word line zones WLZ.

For at least some example embodiments, the program circuit 600 may be configured to increase the levels of one or more of the unselected bit line voltage level $V_{BLU}$, the program pulse level VPGM (i.e., the voltage level on the selected word line $V_{WLS}$), and the selected SGD line voltage $V_{SGDS}$ with each increase in word line zone WLZ. The increase may be equal to or proportional to the increase in the selected bit line level when programming data in a higher word line zone WLZ.

For example, when programming data in the lowest word line zone WLZ1, the program circuit 600 may output the unselected bit line voltage (or unselected channel (e.g., drain-side) voltage) $V_{BLU}$, the program pulse $V_{WLS}$, and the selected SGD voltage $V_{SGDS}$ at default or baseline levels VPUB1, VPGM1, VPSSGD1, as indicated in the table 1206. Then, when programming in the next higher word line zone WLZ2, the program circuit 600 may output the unselected bit line voltage (or unselected channel (e.g., drain-side) voltage) $V_{BLU}$, the program pulse $V_{WLS}$, and the selected SGD voltage $V_{SGDS}$ at increased levels VPUB2, VPGM2, VPSSGD2, as indicated in the table 1206. The amounts of the increases may be equal or directly proportional to the increase of the selected bit line (or selected channel) levels, such as the highest selected bit line level VPSB1 applied to the selected bit lines (or selected channels) of the closest bit line zone BLZ1. For example, each of the increases may be equal or directly proportional to the increase from the highest selected bit line (or channel) voltage VPSB11 of the first set to the highest selected bit line (or channel) level VPSB21 of the second set. Then, when programming in the highest word line zone WLZ3, the program circuit 600 may output the unselected bit line voltage $V_{BLU}$, the program pulse $V_{WLS}$, and the selected SGD voltage $V_{SGDS}$ at further increased levels VPUB3, VPGM3, VPSSGD3. Similarly, the amounts of the increases may be equal or proportional to the increase of the selected bit line (or selected channel) levels, such as the highest selected bit line level VPSB1 applied to the selected bit lines (or selected channels) of the closest bit line zone BLZ1. For example, each of the increases may be equal or directly proportional to the increase from the highest selected bit line (or selected channel) level VPSB21 of the second set to the highest selected bit line (or selected channel) level VPSB31 of the third set, or from the highest selected bit line (or selected channel) level VPSB11 of the first set to the highest selected bit line (or selected channel) level VPSB31 of the third set to the highest selected bit line (or selected channel) level VPSB11 of the first set. Various ways of setting the increased levels of the unselected bit line voltage $V_{BLU}$, the selected word line voltage $V_{WLS}$, and the selected SGD line voltage $V_{SGDS}$ when increasing up into different word line zones while programming a block may be possible.

In addition, as previously described, configuring the program circuit 600 to two-dimensionally set the selected bit line (or selected channel) voltages may be particularly applicable for programming blocks of SLC cells according to a single pulse program-only scheme. To program a block under such a scheme, the program circuit 600 may perform a plurality of program operations on the block. For each program operation, the program controller 622 identifies a selected word line, and a set of selected memory cells, such as a selected word line cell group or selected string to program as SLC cells. For SLC programming, the program controller 622 may program a single page of data into a single word line cell group or string. For particular example configurations, the single word line cell group or string extends across the plurality of bit line zones BLZ of the block.

For a single SLC program operation in accordance with the two-dimensional biasing, the program controller 622 identifies a selected word line and a word line zone WLZ in which the selected word line is positioned or located. The bit line voltage supply circuit 608 may supply or apply a set of selected bit line voltages (or a set of selected channel (e.g., drain-side) voltages to selected bit lines (or selected channels) coupled to program-enabled cells according to the plurality of bit line zones BLZ and the word line zone WLZ in which the selected word line is located. As previously described the set of selected bit line (or selected channel) voltages may be a set of decreasing selected bit line voltages (or a set of decreasing selected channel (e.g., drain-side) voltages) such that the bit line voltage supply circuit 608 supplies or applies the set of selected bit line (or selected channel) voltages to the selected bit lines (or selected channels) in direct proportion to positions of the bit lines or channels in their respective bit line zones BLZ away from the row decoder circuit 614.

In addition, for some example SLC program operations, the program controller 622 may control the bit line voltage supply circuit 608, such as with or through output of the bit line control signal CS(BL) to set the unselected bit line voltage $V_{BLU}$ to a program unselected bit line level specific to the identified bit line zone WLZ in which the selected word line is positioned. The program controller 622 may further control the control gate line voltage supply circuit 606, such as with or through output of the control gate line control signal CS(CG) to set the selected SGS line voltage $V_{SGS}$ and the selected word line voltage (program pulse) $V_{WLS}$ to respective program levels specific or corresponding to the identified word line zone WLZ in which the selected word line is positioned. In addition, during the SLC program operation, the control gate line voltage supply circuit 606 may apply a SGS line voltage $V_{SGS}$ at a program SGS level VPSGS, and the source line voltage supply circuit 610 (FIG. 6) may apply the a source line voltage $V_{SL}$ at a program source line level VPSL to bias source ends of channels and also to cut off the source terminals of the memory cells from the source line SL, as previously described with reference to FIG. 8A. While the selected and unselected bit lines (and/or selected and unselected channels), the control gate lines, and the source line SL are biased with their respective program voltages, the control gate line voltage supply circuit 606 may supply or apply, such as through the row decoder circuit 614, a single program pulse to the selected word line. The voltage waveforms may be similar to or correspond to those shown in the program stage of FIG. 9.

While applying the program voltages to the control lines, the program controller 622 may identify that a predetermined time period has expired, and control the voltage supply circuit 600 to decrease the program voltages down to initial levels. The program controller 622 may then skip the verify operation and identify the program operation as complete. The program controller 622 may then transition to a next SLC program operation by identifying a next selected word line cell group (or selected string) coupled to a next selected word line in which to program single bits of data, and perform the next SLC program operation by applying a single program pulse and skipping the verify operation or verify stage.

The program controller 622 may proceed in this manner to program the block and change, such as by increasing, the program levels, including the program selected bit line (or channel (e.g., drain-side)) levels VPSB, the unselected bit line (or channel (e.g., drain-side)) levels VPUB, the program pulse level VPGM, and the selected SGS line level VPSSGD as the transitioning into new SLC program operations transitions the programming into new or different word line zones WLZ.

A means for supplying a single program pulse to a selected word line to program a single page of data into a plurality of memory cells of a block, in various embodiments, may include a power control circuit 160, a row decoder 148, a control gate line voltage supply circuit 606, a row decoder circuit 614, or the like. Other embodiments may include similar or equivalent means for supply a program pulse.

A means for identifying a set of channel voltages that correspond to a word line zone of a block and to channels that intersect the word line zone, in various embodiments, may include a control logic circuit 152, an on-chip address decoder 156, a program controller 622, a word line zone decoder circuit 1204, or the like. Other embodiments may include similar or equivalent means for identifying a set of channel voltages.

A means for biasing channels with the channel voltages according to a plurality of bit line zones may include a read/write circuit 144, a sense block 146, a column decoder 150, a bit line voltage supply circuit 608, or a column decoder circuit 618. Other embodiments may include similar or equivalent means for biasing channels with drain-side voltages.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A circuit comprising:
   a memory array comprising a plurality of word lines and bit lines, each bit line coupled to a channel;
   a word line voltage supply circuit configured to supply a single program pulse to a selected word line to program a single page of data into a plurality of memory cells of a block;
   a word line zone decoder circuit configured to:
      identify a word line zone of the block in which the selected word line is disposed; and
      identify a set of channel voltages that correspond to the identified word line zone and to channels that intersect the identified word line zone; and
   a bit line voltage supply circuit configured to bias the channels with the channel voltages according to a plurality of bit line zones, the bit line zones extending from one end of the selected word line to the other end of the selected word line.

2. The circuit of claim 1, wherein the set of channel voltages comprises a set of decreasing channel voltages, the bit line voltage supply circuit configured to bias the selected channels with the decreasing channel voltages according to positions of the bit line zones away from a row decoder circuit.

3. The circuit of claim 1, wherein the bit line voltage supply circuit is further configured to generate an unselected bit line voltage at different levels for different word line zones.

4. The circuit of claim 1, wherein the word line voltage supply circuit is configured to supply program pulses at different program pulse levels to selected word lines of different word line zones.

5. The circuit of claim 4, wherein the word line voltage supply circuit is configured to set a program pulse level in direct proportion to a highest channel level of the set.

6. The circuit of claim 4, wherein the identified word line zone comprises a first word line zone, wherein the single program pulse comprises a first program pulse, the word line voltage supply circuit configured to supply the first program pulse at a first program pulse level, wherein the word line voltage supply circuit is configured to supply a second program pulse at a higher program pulse level than the first program pulse level to a second selected word line to program a second single page of data into a second plurality of memory cells of a block, the second selected word line positioned in a higher word line zone than the first word line zone.

7. The circuit of claim 1, wherein the word line voltage supply circuit is configured to set a level of a selected drain select gate (SGD) voltage in direct proportion to a highest channel level applied to the channels of a closest one of the plurality of bit line zones.

8. The circuit of claim 1, wherein numbers of bit lines in the plurality of bit line zones are increasingly larger in proportion to positions of the bit line zones away from a row decoder circuit.

9. The circuit of claim 1, wherein the word line zone decoder circuit is configured to identify a plurality of sets of channel voltages corresponding to a plurality of word line zones according to a two-dimensional table or matrix.

10. The circuit of claim 1, wherein the set of channel voltages comprises a high channel voltage at a positive voltage level and a low channel voltage at a ground reference voltage level.

11. The circuit of claim 1, wherein the bit line voltage supply circuit is configured to bias channels closest to a row decoder circuit with the high channel voltage, and to bias channels farthest from the row decoder circuit with the low channel voltage.

12. A circuit comprising:
a row decoder configured to supply program pulses to word lines during program operations; and
a program controller configured to:
identify a word line address of a selected word line for programing a plurality of single-level memory cells with a single program voltage pulse;
determine a word line zone identifier from among a plurality of word line zone identifiers associated with the word line address; and
output a control signal to set drain-side voltages each to one of a plurality of selected drain-side levels based on the word line zone identifier and a position of the bit lines relative to the row decoder.

13. The circuit of claim 12, wherein the selected drain-side levels comprises a set of decreasing drain-side voltages, the program controller configured to set the drain-side voltages to the decreasing drain-side levels according to positions of the bit lines away from a row decoder circuit.

14. The circuit of claim 12, wherein the row decoder is configured to supply the program pulses at different program pulse levels to selected word lines of different word line zones.

15. The circuit of claim 14, wherein the program controller is configured to set a program pulse level in direct proportion to a highest drain-side level of the set.

16. The circuit of claim 14, wherein the row decoder is configured to supply the program pulses at increasing levels in direct proportion to increasing height of a plurality of word line zones identified by the word line zone identifiers.

17. The circuit of claim 12, wherein the bit lines are divided into bit line zones, and wherein numbers of the bit lines in the plurality of bit line zones are increasingly larger in proportion to positions of the bit line zones away from a row decoder circuit.

18. The circuit of claim 12, wherein the set of drain-side voltages comprises a high drain-side voltage at a positive voltage level and a low drain side voltage at a ground reference voltage level.

19. A system comprising:
a block comprising a plurality of word lines;
a plurality of memory cells three-dimensionally arranged in the block;
a row decoder configured to:
supply a first program pulse to a first word line to program a first group of single-level memory cells during a first program operation; and
supply a second program pulse to a second word line to program a second group of single-level memory cells during a second program operation, the second word line positioned in a higher word line zone than the first word line; and
a column decoder configured to:
during supply of the first program voltage pulse, supply a first set of voltages at a first set of decreasing voltage levels based upon the word line zone of the first word line to a first set of selected channels of the block; and
during supply of the second program voltage pulse, supply a second set of voltages at a second set of decreasing voltage levels based upon the word line zone of the second word line to a second set of selected channels of the block.

20. The system of claim 19, further comprising a program controller configured to skip verifying the first group of single-level cells after supply of the first program pulse.

21. A method comprising:
identifying, with a program controller, a selected word line coupled to a group of single-level memory cells for a program operation;
identifying, with the program controller, a word line zone in which the selected word line is positioned; and
supplying, with a bit line voltage supply circuit, a plurality of channel voltages at a set of decreasing levels to selected channels based on the word line zone and a plurality of bit line zones during the program operation.

22. A circuit comprising:
a means for supplying a single program pulse to a selected word line to program a single page of data into a plurality of memory cells of a block;
a means for identifying a set of channel voltages that correspond to a word line zone of the block and to channels that intersect the word line zone; and
a means for biasing channels with the set of channel voltages according to a plurality of bit line zones, the bit line zones extending from one end of the selected word line to the other end of the selected word line.

* * * * *